(12) United States Patent
Kamimura et al.

(10) Patent No.: US 7,695,892 B2
(45) Date of Patent: Apr. 13, 2010

(54) RESIST COMPOSITION AND PATTERN-FORMING METHOD USING SAME

(75) Inventors: Sou Kamimura, Shizuoka (JP); Yushi Kaneko, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/053,927

(22) Filed: Mar. 24, 2008

(65) Prior Publication Data
US 2008/0241737 A1    Oct. 2, 2008

(30) Foreign Application Priority Data
Mar. 23, 2007    (JP) .............................. 2007-077374

(51) Int. Cl.
*G03F 7/004* (2006.01)
*G03F 7/30* (2006.01)

(52) U.S. Cl. .................... 430/270.1; 430/326; 430/905; 430/910

(58) Field of Classification Search ............. 430/270.1, 430/326, 905, 910
See application file for complete search history.

(56) References Cited

U.S. PATENT DOCUMENTS

| | | | | |
|---|---|---|---|---|
| 6,303,265 B1 * | 10/2001 | Sato | | 430/270.1 |
| 7,510,817 B2 * | 3/2009 | Benoit et al. | | 430/270.1 |
| 7,517,634 B2 * | 4/2009 | Benoit et al. | | 430/270.1 |
| 2004/0137360 A1 | 7/2004 | Berger et al. | | |
| 2004/0248039 A1 | 12/2004 | Sounik et al. | | |
| 2005/0032997 A1 | 2/2005 | Lee et al. | | |
| 2007/0134588 A1 * | 6/2007 | Kanda et al. | | 430/270.1 |
| 2007/0148594 A1 * | 6/2007 | Funatsu et al. | | 430/270.1 |

FOREIGN PATENT DOCUMENTS

| | | |
|---|---|---|
| EP | 1 384 729 A1 | 1/2004 |
| EP | 1 684 119 A2 | 7/2006 |
| EP | 1 903 394 A1 | 3/2008 |
| JP | 2000-515181 A | 11/2000 |
| JP | 2002-372784 A | 12/2002 |
| JP | 2003-5374 A | 1/2003 |
| JP | 2004-12545 A | 1/2004 |
| JP | 2005-156726 A | 6/2005 |
| WO | 99/05099 A1 | 2/1999 |

OTHER PUBLICATIONS

Extended European Search Report for EPA No. 08005504.9 Dated Dec. 1, 2009.

* cited by examiner

*Primary Examiner*—John S Chu
(74) *Attorney, Agent, or Firm*—Sughrue Mion, PLLC

(57) ABSTRACT

A resist composition comprises (A) at least two kinds of resins each of which decomposes by the action of an acid to undergo an increase in its solubility for an alkali developer, wherein at least one kind of the resins (A) is a resin synthesized by living radical polymerization using a chain transfer agent represented by formula (I):

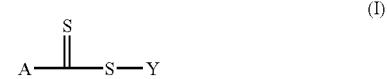

(I)

wherein:
A represents an organic group not containing hetero atoms; and
Y represents an organic group capable of releasing a radical.

18 Claims, 1 Drawing Sheet

FIGURE
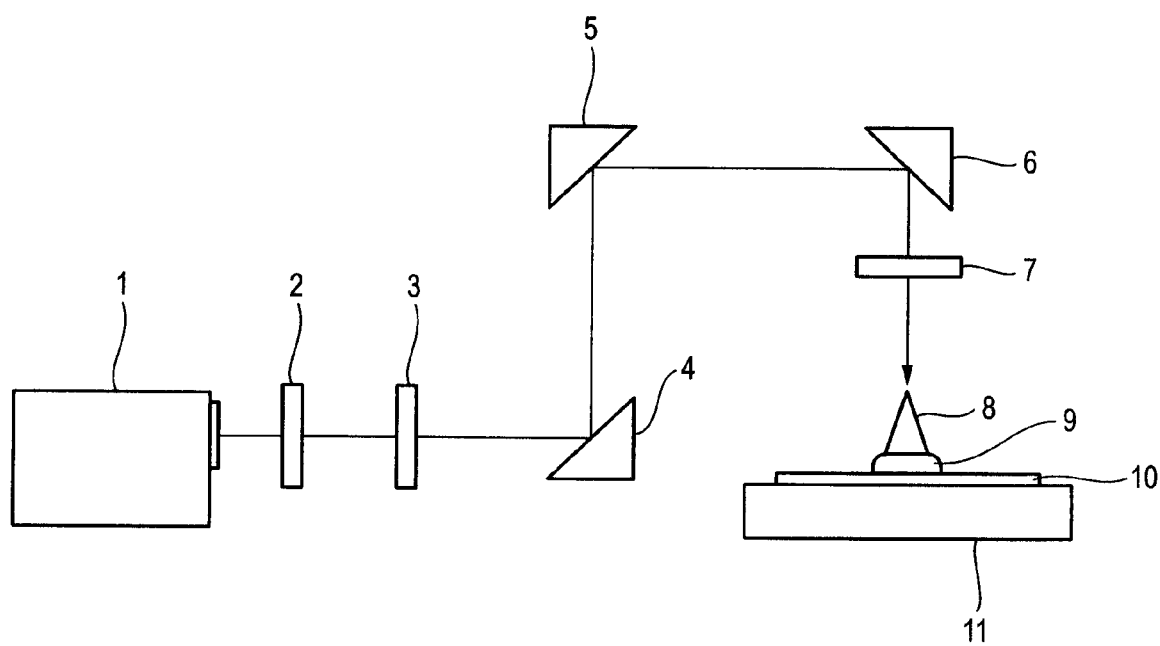

RESIST COMPOSITION AND PATTERN-FORMING METHOD USING SAME

BACKGROUND OF THE INVENTION

1. Field of the Invention

The present invention relates to a resist composition which causes reaction upon irradiation with an actinic ray or radiation to undergo change in the properties thereof, and to a pattern-forming method using the resist composition. More particularly, it relates to a resist composition which can be used in the step of producing semiconductors such as ICs, producing circuit substrates for liquid crystal or thermal head, or in other photo fabrication steps, and to a pattern-forming method using the resist composition.

2. Description of the Related Art

A chemically amplified resist composition is a pattern-forming material which generates an acid in exposed areas upon irradiation with an actinic ray such as UV rays or radiation, causes change in solubility for a developer between irradiated areas and non-irradiated areas, and forms a pattern on a substrate.

In the case of using a KrF excimer laser as a light source for exposure, compositions mainly comprising a resin having a fundamental skeleton of poly(hydroxystyrene) which is small in absorption in wavelength region of 248 nm are used. Such system provides high sensitivity and high resolution and forms a good pattern, thus being a better system as compared with those wherein conventional naphthoquinonediazide/novolak series resins are used.

On the other hand, in the case of using light sources having further shorter wavelength, e.g., an ArF excimer laser (193 nm), there have been developed resists for the ArF excimer laser which contain a highly transparent resin having an alicyclic hydrocarbon structure, because compounds having an aromatic group essentially have large absorption in wavelength region of 193 nm.

JP-A-2002-372784, JP-A-2004-12545 and JP-A-2003-5374 disclose resist compositions using a plurality of resins in order to improve such performances as sensitivity, iso/dense bias, etching resistance, and defocus latitude.

In view of total performance as a resist, it is extremely difficult, as things stand, to find out an appropriate combination of resins, photo acid generators, additives, solvents, etc. to be used. Further, upon formation of a fine pattern of 100 nm or less in line width, it has been demanded to solve the problem of pattern collapse which leads to defects upon production of devices, to improve line edge roughness of a line pattern, and to improve four performance factors of pattern collapse, line edge roughness, exposure latitude (EL) showing degree of fluctuation of a pattern dimension due to change in exposure amount and defocus latitude (DOF) with good balance.

The term "line edge roughness" as used herein means that the edge of the interface between a line pattern of a resist and a substrate has a form irregularly fluctuating in the direction vertical to the line direction. When this pattern is viewed from just above, the edge seems uneven (with an unevenness of from about ±several nm to about ±several ten nm). Since this unevenness is transferred to a substrate in the etching step, a large unevenness would cause electrical characteristics failure, which results in reduction in yield.

In the invention, particular attention is paid on living radical polymerization which can narrow or reduce a molecular weight distribution (degree of dispersion) noting uniformity of the resulting polymer. The term "molecular weight distribution" as used herein means the ratio of weight-average molecular weight to number-average molecular weight. A ratio nearer to 1 means a narrower molecular weight distribution. So far, JP-T-2000-515181 discloses a process for synthesizing a polymer by living radical polymerization. In addition, JP-A-2005-156726 discloses a resist composition using a polymer obtained by living radical polymerization which, however, cannot be said to provide sufficient resist performance.

SUMMARY OF THE INVENTION

With the above-described background in mind, an object of the invention is to provide a resist composition showing improved line edge roughness, pattern collapse, exposure latitude, and defocus latitude with good balance upon formation of a fine pattern of 100 nm or less in line width, and to provide a pattern-forming method using the composition.

The invention is as follows.

(1) A resist composition comprising (A) at least two kinds of resins each of which decomposes by action of an acid to undergo an increase in its solubility for an alkali developer, wherein at least one kind of the resins (A) is a resin synthesized by living radical polymerization using a chain transfer agent represented by formula (I):

In the general formula (I),

A represents an organic group not containing hetero atoms; and

Y represents an organic group capable of releasing a radical.

(2) The resist composition as described in (1), further comprising (B) a compound capable of generating an acid upon irradiation with an actinic ray or radiation.

(3) The resist composition as described in (1) or (2), further comprising (C) a basic compound.

(4) A pattern-forming method comprising: forming a film by using the resist composition described in any one of (1) to (3); and exposing and developing the film.

BRIEF DESCRIPTIONS OF THE DRAWINGS

FIG. 1 is a schematic view showing a two-beam interference exposure apparatus.

1 denotes a laser; 2 denotes a diaphragm; 3 denotes a shutter; 4, 5 and 6 denote reflecting mirrors; 7 denote a condenser lens; 8 denote a prism; 9 denotes an immersion liquid; 10 denote a wafer having an anti-reflective film and a resist film; and 11 denotes a wafer stage.

DETAILED DESCRIPTION OF THE INVENTION

The invention will be described in detail below.

Additionally, in describing a group (atoms) in this specification, descriptions not particularly referring to substitution and unsubstitution include both unsubstituted groups and substituted groups. For example, "an alkyl group" includes not only an alkyl group (unsubstituted alkyl group) not having a substituent but also an alkyl group (substituted alkyl group) having a substituent.

Chain transfer agent represented by the general formula (I)

In the resist composition of the invention, at least two kinds of resins are used as resins of component (A), and at least one of the resins of the component (A) is synthesized by living radical polymerization using a chain transfer agent represented by the following general formula (I).

In the general formula (I),

A represents an organic group not containing hetero atoms; and

Y represents an organic group capable of releasing a radical.

Living radical polymerization is radical polymerization wherein the growing end is in a state of releasing and recombining radicals during polymerization and, apparently, termination reaction does not proceed. Under such conditions, degree of dispersion (ratio of weight-average molecular weight to number-average molecular weight) is extremely small in comparison with common radical polymerization. As examples of the living radical polymerization, there are illustrated a process of using a chain transfer agent and a process of polymerizing in the presence of a metal complex catalyst (a catalyst wherein the central metal is a transition metal such as Fe, Ru, Cu or Ni) and a halogen atom-containing compound.

In the invention, the degree of dispersion of the resin can effectively be reduced by using the chain transfer agent represented by the general formula (I), and the resulting resin has an improved transmittance at 193 nm.

As the organic group A not containing a hetero atom, an alkyl group, a cycloalkyl group, and an aryl group are preferred. As the alkyl group, alkyl groups containing from 1 to 20 carbon atoms (e.g., a methyl group, an ethyl group, a n-propyl group, an isopropyl group, a n-butyl group, a tert-butyl group, a sec-butyl group, and a n-octyl group) are preferred, and alkyl groups containing from 1 to 10 carbon atoms are more preferred. As the cycloalkyl group in A, monocyclic or polycyclic cycloalkyl groups containing from 3 to 20 carbon atoms (e.g., cyclopentyl, cyclohexyl, cycloheptyl, norbornyl, and adamantyl) are preferred, and monocyclic or polycyclic cycloalkyl groups containing from 3 to 15 carbon atoms are more preferred. As the aryl group in A, aryl groups containing from 6 to 30 carbon atoms (e.g., phenyl, naphthyl, and anthranyl) are preferred, and aryl groups containing from 6 to 18 carbon atoms are more preferred.

The organic group A not containing a hetero atom may have a substituent. Examples of the substituent which the organic group A not containing a hetero atom may have include an alkyl group, a cycloalkyl group, and an aryl group.

As the organic group Y capable of releasing a radical, there can be illustrated, for example, a tertiary alkyl group (containing preferably from 1 to 10 carbon atoms) wherein the atom connecting to the sulfur atom in the general formula (I) is a tertiary carbon atom, an alkyl group (containing preferably from 1 to 10 carbon atoms) wherein the atom connecting to the sulfur atom in the general formula (I) is a carbon atom substituted by a cyano group, an alkylcarbonyl group or an alkoxycarbonyl group, a cycloalkyl group (containing preferably from 3 to 15 carbon atoms) wherein the atom connecting to the sulfur atom in the general formula (I) is a carbon atom substituted by a cyano group, an alkylcarbonyl group or an alkoxycarbonyl group, and —S—C(=S)-$A_3$. In the formula, $A_3$ represents an alkyl group (containing preferably from 1 to 10 carbon atoms), a cycloalkyl group (containing preferably from 3 to 15 carbona toms), an aryl group (containing preferably from 6 to 18 carbon atoms or an alkylthio group (containing preferably from 1 to 10 carbona atoms).

The organic group Y capable of releasing a radical may further have a substituent. As the substituent which the organic group Y capable of releasing a radical may have, there can be illustrated a carboxyl group, etc.

As the chain transfer agent represented by the general formula (I), a chain transfer agent of the bis(thiocarbonyl) sulfide structure represented by the following general formula (I') is more preferred.

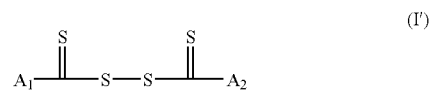

In the general formula (I'), $A_1$ and $A_2$ each independently represents an organic group not containing a hetero atom, and is the same as A.

Specific examples of the chain transfer agent represented by the general formula (I) are shown below which, however, do not limit the invention in any way.

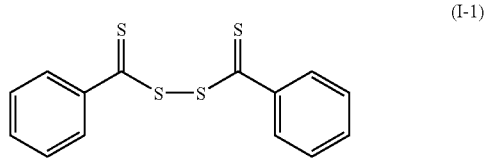

(I-1)

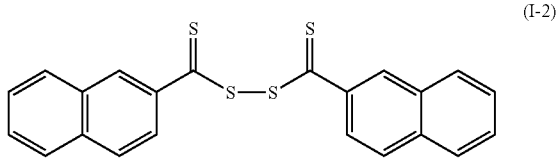

(I-2)

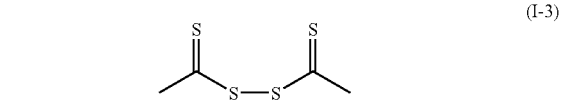

(I-3)

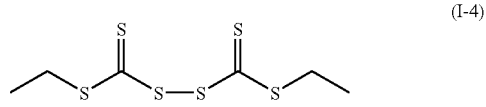

(I-4)

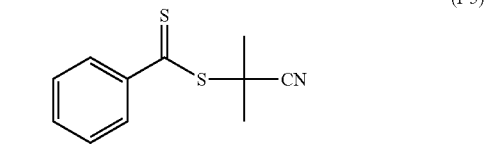

(I-5)

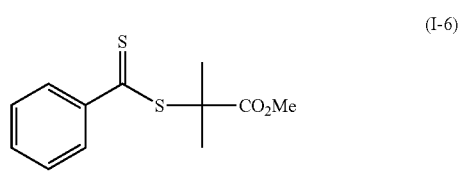

(I-6)

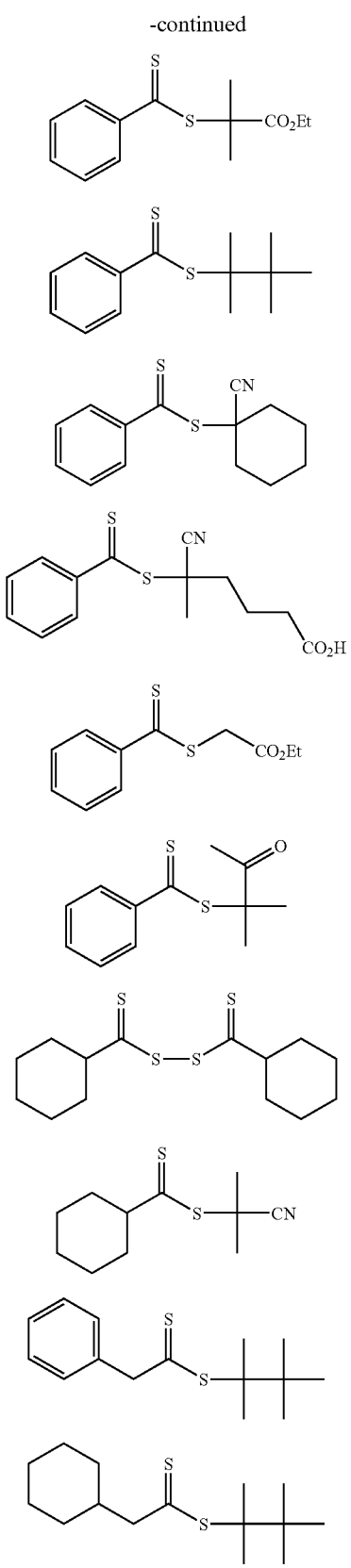

As a process for synthesizing the chain transfer agent represented by the general formula (I), known processes may be employed. That is, there are illustrated a process of synthesizing dithioester by first reacting a nucleating agent with carbon disulfide to synthesize a dithiocarboxylic acid, and then reacting with an alkylating agent (process 1) and a process of synthesizing dithioester by first reacting a dithiocarboxylic acid with an oxidizing agent to synthesize a bis(thiocarbonyl)disulfide, and then reacting the product with a polymerization initiator (process 2).

The chain transfer agent to be used in the invention can be used in combination with a common radical polymerization initiator.

As the common radical polymerization initiator which can be used in the invention, commercially available radical initiators (azo series initiators, peroxides, etc.) can be used. As the radical initiators, azo series initiators are preferred, with azo series initiators having an ester group, a cyano group or a carboxyl group being more preferred. As preferred polymerization initiators, there are illustrated azobisisobutyronitrile, azobisdimethylvaleronitrile, and dimethyl 2,2'-azobis(2-methylpropionate). The polymerization initiators may be used alone or as a mixture thereof.

Living Radical Polymerization

Living radical polymerization using the chain transfer agent represented by the general formula (I) is described below.

As a polymerization process, there are a process of heating a solution containing a monomer, a polymerization initiator, and a chain transfer agent represented by the general formula (I) to conduct polymerization (one-shot addition polymerization) and a process of polymerizing by dropwise adding a monomer-containing solution to a heated solution to polymerize (dropwise polymerization), with the dropwise polymerization process being preferred in view of production stability. A monomer, a polymerization initiator, and a chain transfer agent may be added to a reaction system separately or as a mixture. In the case of adding them separately to a reaction system, the addition periods for individual components may be the same or different. Further, it is possible to stagger addition of them. In the invention, the reaction system may be a reaction solvent itself or may be a system of a reaction solvent containing part of a member selected from among monomers, polymerization initiators, and chain transfer agents previously added thereto. That is, in the invention, it is possible to use a reaction solvent itself as a reaction system wherein a monomer is polymerized while adding thereto a monomer, a polymerization initiator, and a chain transfer agent, or to previously add part of a member selected from among monomers, polymerization initiators, and chain transfer agents to prepare a reaction system, and polymerize the monomer while adding thereto the rest of the monomer, polymerization initiator, and the chain transfer agent. In particular, it is preferred to add remaining monomer and polymerization initiator to the reaction system containing the entire amount of the chain transfer agent and, in some cases, part of the monomer and the polymerization initiator. Upon addition of the monomer, the polymerization initiator and the chain transfer agent, it is preferred to dissolve them in the reaction solvent and add as solutions. Examples of the reaction solvent include solvents capable of dissolving the composition of the invention, such as ethers (e.g., tetrahydrofuran, 1,4-dioxane, and diisopropyl ether), ketones (e.g., methyl ethyl ketone, methyl isobutyl ketone, and cyclohexanone), ester solvents (e.g., butyl acetate), amide solvents (e.g., dimethylformamide, dimethylacetamide, and N-methylpyrrolidinone) and, further, propylene glycol monomethyl ether acetate and propylene glycol monomethyl ether. These solvents may be used alone or as a mixture thereof. It is more preferred to polymerize by using the same solvent as that to be used in the resist composition of the invention. The polymerization reaction is preferably conducted in an atmosphere of an inert gas such as nitrogen or argon.

As the monomer, monomers corresponding to the repeating unit of the resin of the component (A) are used.

After completion of the reaction, a desired polymer is recovered by a method of, for example, introducing the reaction mixture into a solvent to recover the polymer as powder or solid. The concentration of the reaction is from 5 to 50% by weight, preferably from 10 to 30% by weight. It is difficult to definitely determine the reaction temperature since it depends upon decomposition efficiency of a radical initiator to be used. However, a too low reaction temperature results in a low monomer conversion and a prolonged reaction time, leading to low efficiency, whereas a too high reaction temperature can result in uncontrollable polymerization. Hence, the reaction temperature is preferably from equal to or higher than the 10-hour half-value period temperature of a initiator to be used to equal to or lower than the 10-minute half-value period temperature thereof or lower than that, more preferably from equal to or higher than the 9-hour half-value period temperature to equal to or lower than the 20-minute half-value period temperature. For example, in the case of using azobisisobutyronitrile as the initiator, the reaction temperature is preferably from equal to or higher than 50° C. to equal to or lower than 100° C., more preferably higher than 60° C. to equal to or lower than 90° C. When the amount of the polymerization initiator to be used is too small based on the amount of the chain transfer agent, there results an extremely slow reaction rate whereas, when the amount of the polymerization initiator is too large, it becomes difficult to control the polymerization reaction. Therefore, the amount of the polymerization initiator to be used is preferably from 0.01 mol equivalent to 10.0 mol equivalents (both inclusive), more preferably from 0.20 mol equivalent to 5.0 mol equivalents (both inclusive), based on the chain transfer agent. As the chain transfer agent, chain transfer agents represented by the general formula (I) are used. The chain transfer agents may be used alone or as a mixture thereof. The amount of the chain transfer agent to be used cannot be definitely determined since it varies depending upon the intended number-average molecular weight of the polymer. Roughly speaking, however, the amount of the chain transfer agent is preferably from 0.01 mol equivalent to 50.0 mol equivalents (both inclusive), more preferably from 0.1 mol equivalent to 20.0 mol equivalents (both inclusive), based on the mol number of all the monomers.

The weight-average molecular weight of the resin of component (A) in accordance with the invention is preferably from 1,000 to 200,000, more preferably from 3,000 to 20,000, particularly preferably from 5,000 to 15,000, in terms of polystyrene according to the GPC method. When the weight-average molecular weight is controlled to be in the range of from 1,000 to 200,000, deterioration of heat resistance and dry-etching resistance can be prevented and, in addition, deterioration of developability and deterioration of film-forming properties due to an increase in viscosity can be prevented.

With the resin of component (A) to be obtained by the polymerization process of the invention, a substituent (dithioester group) represented by the following general formula (II) and derived from the chain transfer agent remain, in some cases, at the end of the molecule.

(II)

In the general formula (II), A represents an organic group not containing a hetero atom, and is the same as A in the general formula (I).

When this polymer itself is used as a resist material, there might result a poor transmittance and a deteriorated pattern form. Hence, it is preferred to remove the dithioester group derived from the chain transfer agent. As a method for removing the dithioester group, there is a method of adding to the reaction system, after completion of polymerization, a radical generator and, as needed, a chain transfer agent (e.g., thiol or disulfide) to conduct substitution. In this case, there are illustrated a method of adding a radical generator to the reaction solution upon completion of polymerization to conduct substitution, and a method of once isolating the polymer upon completion of polymerization and, after again dissolving the polymer in the solvent, adding thereto a radical generator. The method of adding a radical generator to the reaction solution upon completion of polymerization to conduct substitution is preferred in view of efficiency. As such radical generator, those which have been illustrated as radical initiators can be used. The radical generator may be the same as, or different from, the radical initiator used upon polymerization. The amount of the radical generator to be used is preferably from 1.0 mol equivalent to 20.0 mol equivalents (both inclusive), more preferably from 2.0 mol equivalents to 10.0 mol equivalents (both inclusive), based on the chain transfer agent of the general formula (I). The reaction temperature is preferably in the range described with respect to the temperature for the former polymerization. As to methods for adding the radical generator, there are illustrated a method of adding the entire amount of the radical generator, a method of adding the radical generator by portions, and a method of preparing a solution of the radical generator and dropwise adding the solution, with the method of adding by portions and the dropwise-adding method being preferred in view of safety.

The resist composition of the invention contains at least two kinds of the resins of component (A), and at least one kind of the resins of component (A) is a resin synthesized by living radical polymerization using the chain transfer agent represented by the general formula (I).

The resist composition of the invention contains may contain, in addition to the resin synthesized by living radical polymerization using the chain transfer agent represented by the general formula (I), a resin obtained by common radical polymerization not using the chain transfer agent represented by the general formula (I), as a resin of component (A). Here, common radical polymerization means polymerization including the same steps as in the aforesaid living radical polymerization except for not using the chain transfer agent.

The resist composition of the invention may contain, in addition to the resin synthesized by living radical polymerization using the chain transfer agent represented by the general formula (I), a resin synthesized by living radical polymerization using a chain transfer agent different from the chain transfer agent represented by the general formula (I), as a resin of component (A).

The resist composition of the invention preferably contains only resins synthesized by living radical polymerization using the chain transfer agent represented by the general formula (I), as resins of component (A) and, more preferably, contains only resins synthesized by living radical polymerization using the same chain transfer agent represented by the general formula, as resins of component (A).

The resist composition of the invention contains at least two kinds of resins of component (A), preferably from 2 to 5 kinds of resins of component (A), more preferably 2 kinds of resins of component (A).

The at least two kinds of resins of component (A) may be different from each other in repeating unit constituting the resins of component (A), or in weight-average molecular weight with the repeating units constituting the resins of component (A) being the same.

In the case where the resins are different from each other in weight-average molecular weight, difference in the weight-average molecular weight is preferably from 1,000 to 100,000, more preferably from 5,000 to 50,000, still more preferably from 5,000 to 20,000.

In the case of compounding two kinds of resins of component (A), the compounding ratio (by weight) of one resin (A1) to another resin (A2) of the two kinds of component (A) is usually from 1/99 to 99/1, preferably from 10/90 to 90/10, still more preferably from 20/80 to 60/40.

(A) Resin Decomposing Action of an Acid to Undergo an Increase in its Solubility for an Alkali Developer Resins of component (A) have in the main chain and/or the side chain thereof a group (hereinafter also referred to as "acid-decomposable group") which decomposes by action of an acid to undergo an increase in its solubility for an alkali developer.

Examples of the acid-decomposable group include those wherein a hydrogen atom of an alkali-soluble group such as a carboxyl group, a phenolic hydroxyl group, a sulfonic acid group or a thiol group is protected by a group capable of being eliminated by the action of an acid.

Examples of the group to be eliminated by the action of an acid include $-C(R_{36})(R_{37})(R_{38})$, $-C(R_{36})(R_{37})(OR_{39})$, $-C(=O)-O-C(R_{36})(R_{37})(R_{38})$, $-C(R_{01})(R_{02})(OR_{39})$, and $-C(R_{01})(R_{02})-C(=O)-O-C(R_{36})(R_{37})(R_{38})$.

In the formulae, $R_{36}$ to $R_{39}$ each independently represents an alkyl group, a cycloalkyl group, an aryl group, an aralkyl group or an alkenyl group. $R_{36}$ and $R_{37}$ may be connected to each other to form a ring.

$R_{01}$ to $R_{02}$ each independently represents a hydrogen atom, an alkyl group, a cycloalkyl group, an aryl group, an aralkyl group or an alkenyl group.

The resins of component (A) are preferably those resins which have a monocyclic or polycyclic alicyclic hydrocarbon structure and decompose by action of an acid to undergo an increase in their solubility for an alkali developer.

As the resins which have a monocyclic or polycyclic alicyclic hydrocarbon structure and decompose by action of an acid to undergo an increase in their solubility for an alkali developer (hereinafter also referred to as "alicyclic hydrocarbon series acid-decomposable resins"), those resins are preferred which have at least one repeating unit selected from the group consisting of repeating units having a partial structure containing an alicyclic hydrocarbon represented by the following general formulae (pI) to (pV) and repeating units represented by the following general formula (II-AB).

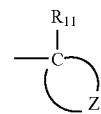

(pI)

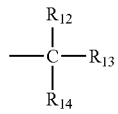

(pII)

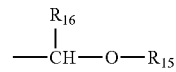

(pIII)

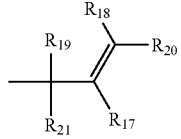

(pIV)

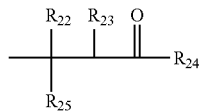

(pV)

In the general formulae (pI) to (pV), $R_{11}$ represents a methyl group, an ethyl group, a n-propyl group, an isopropyl group, a n-butyl group, an isobutyl group or a sec-butyl group.

Z represents atoms necessary for forming a cycloalkyl group together with the carbon atom.

$R_{12}$ to $R_{16}$ each independently represents a straight or branched alkyl group containing from 1 to 4 carbon atoms or a cycloalkyl group, provided that at least one of $R_{12}$ to $R_{14}$, or either of $R_{15}$ and $R_{16}$, represents a cycloalkyl group.

$R_{17}$ to $R_{21}$ each independently represents a hydrogen atom, a straight or branched alkyl group containing from 1 to 4 carbon atoms or a cycloalkyl group, provided that at least one of $R_{17}$ to $R_{21}$ represents a cycloalkyl group. Also, either of $R_{19}$ and $R_{21}$ represents a straight or branched alkyl group containing from 1 to 4 carbon atoms or a cycloalkyl group.

$R_{22}$ to $R_{25}$ each independently represents a hydrogen atom, a straight or branched alkyl group containing from 1 to 4 carbon atoms or a cycloalkyl group, provided that at least one of $R_{22}$ to $R_{25}$ represents a cycloalkyl group. Also, $R_{23}$ and $R_{24}$ may be connected to each other to form a ring.

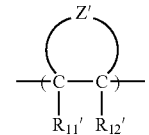

(II-AB)

In the general formula (II-AB), $R_{11}'$ and $R_{12}'$ each independently represents a hydrogen atom, a cyano group, a halogen atom or an alkyl group.

Z' represents atoms forming an alicyclic structure together with the connected two carbon atoms (C—C).

The general formula (II-AB) is more preferably the following general formula (II-AB1) or (II-AB2).

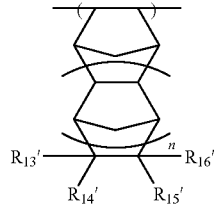

(II-AB1)

-continued

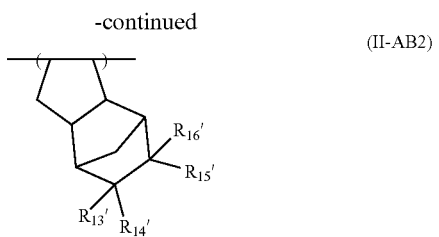

(II-AB2)

In the general formulae (II-AB1) and (II-AB2), $R_{13}'$ to $R_{16}'$ each independently represents a hydrogen atom, a halogen atom, a cyano group, a hydroxyl group, —COOH, —COOR$_5$, a group decomposable by the action of an acid, —C(=O)—X-A'-R$_{17}'$, an alkyl group or a cycloalkyl group. At least two of $R_{13}'$ to $R_{16}'$ may be connected to each other to form a ring. Here, $R_5$ represents an alkyl group, a cycloalkyl group or a group having a lactone structure.

X represents an oxygen atom, a sulfur atom, —NH—, —NHSO$_2$— or —NHSO$_2$NH—.

A' represents a single bond or a divalent linking group.

$R_{17}'$ represents —COOH, —COOR$_5$, —CN, a hydroxyl group, an alkoxy group, —CO—NH—R$_6$, —CO—NH—SO$_2$—R$_6$ or a group having a lactone structure.

$R_6$ represents an alkyl group or a cycloalkyl group.

n represents 0 or 1.

In the foregoing general formulae (pI) to (pV), the alkyl group for $R_{12}$ to $R_{25}$ is a straight or branched alkyl group containing from 1 to 4 carbon atoms and is exemplified by a methyl group, an ethyl group, a propyl group, a n-butyl group, a sec-butyl group, and a t-butyl group.

The cycloalkyl group for $R_{12}$ to $R_{25}$ or the cycloalkyl group formed by Z and carbon atoms may be monocyclic or polycyclic. Specific examples thereof include those groups which have a monocyclo- bicyclo-, tricycle- or tetracyclo-structure containing 5 or more carbon atoms. The carbon number is preferably from 6 to 30, particularly preferably from 7 to 25. These cycloalkyl groups may have a substituent.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group. More preferred are an adamantyl group, a norbornyl group, a cyclohexyl group, a cyclopentyl group, a tetracyclododecanyl group, and a tricyclodecanyl group.

These alkyl groups and cycloalkyl groups may further have a substituent. As the further substituents for the alkyl group and the cycloalkyl group, there are illustrated an alkyl group (containing from 1 to 4 carbon atoms), a halogen atom, a hydroxyl group, an alkoxy group (containing from 1 to 4 carbon atoms), a carboxyl group, and an alkoxycarbonyl group (containing from 2 to 6 carbon atoms). The above-described alkyl group, alkoxy group, alkoxycarbonyl group, and the like may further have a substituent. As the substituent which the alkyl group, alkoxy group, alkoxycarbonyl group, and the like may have, there can be illustrated a hydroxyl group, a halogen atom, and an alkoxy group.

The structure represented by the general formulae (pI) to (pV) in the above-described resins can be used for protecting the alkali-soluble group. As the alkali-soluble group, there are illustrated various groups known in this technical field.

Specifically, there are illustrated those structures wherein the hydrogen atom of carboxylic acid, sulfonic acid group, phenol group or thiol group is replaced by a structure represented by the general formulae (pI) to (pV), with those structures being preferred wherein the hydrogen atom of carboxylic acid or sulfonic acid group is replaced by a structure represented by the general formulae (pI) to (pV).

As a repeating unit having an alkali-soluble group protected by the structure shown by the general formulae (pI) to (pV), repeating units shown by the following general formula (pA) are preferred.

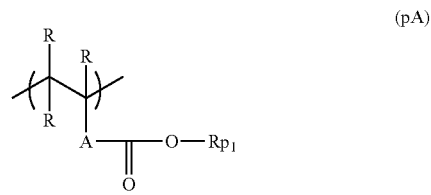

(pA)

In the general formula (pA), R represents a hydrogen atom, a halogen atom or a straight or branched alkyl group containing from 1 to 4 carbon atoms. Plural Rs may be the same or different.

A represents one member or a combination of two or more members selected from the group consisting of a single bond, an alkylene group, an ether group, a thioether group, a carbonyl group, an ester group, an amido group, a sulfonamido group, a urethane group or a urea group, preferably a single bond.

$Rp_1$ represents one of the groups represented by the general formulae (pI) to (pV).

The repeating unit represented by the general formula (pA) is particularly preferably repeating units derived from 2-alkyl-2-adamantyl(meth)acrylate or dialkyl(1-adamantyl)methyl(meth)acrylate.

Specific examples of the repeating unit represented by the general formula (pA) are shown below which, however, are not to be construed to limit the invention in any way.

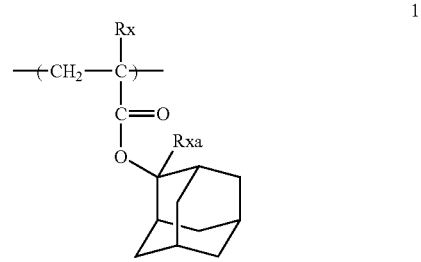

1

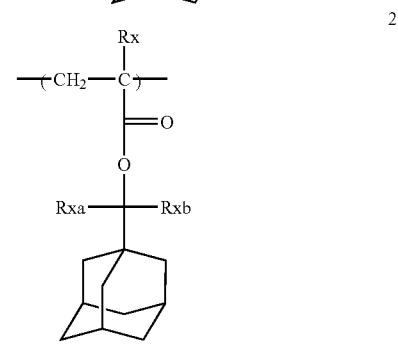

2

-continued
3
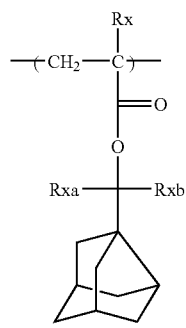
4
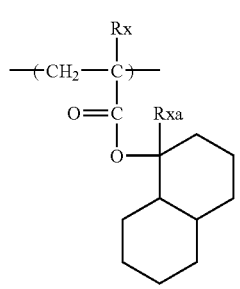
5
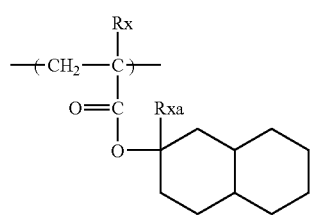
6
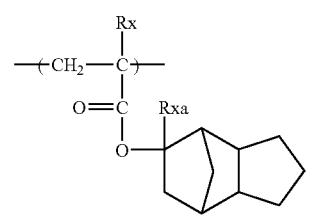
7
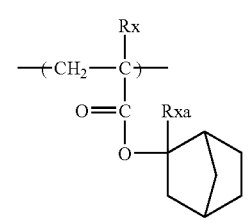
8
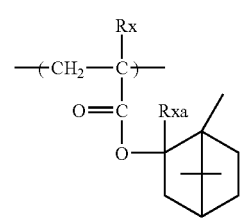
-continued
9
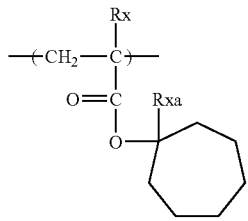
10
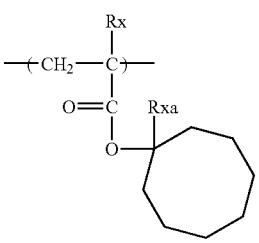
11
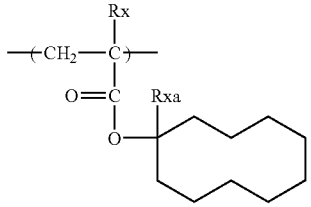
12
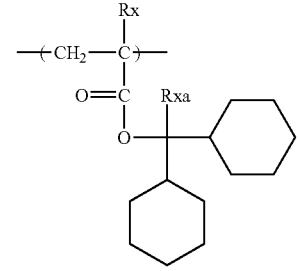
13
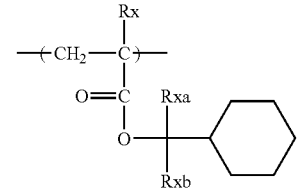
14
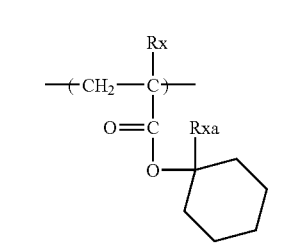
15
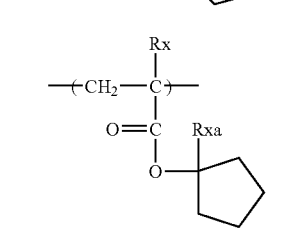

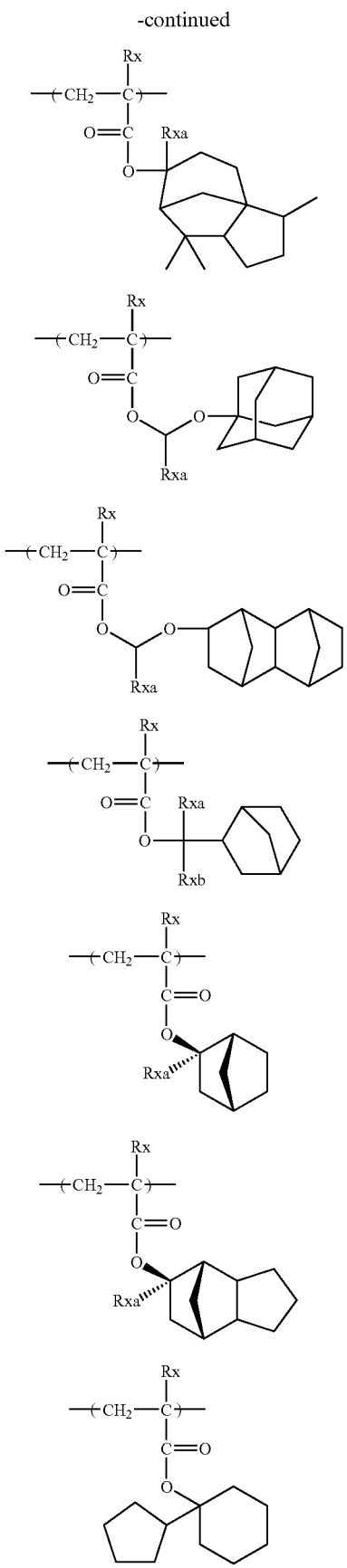

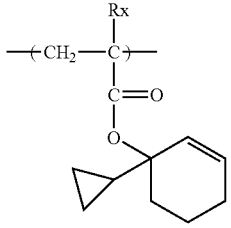

(23)

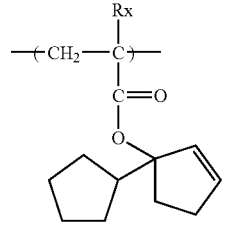

(24)

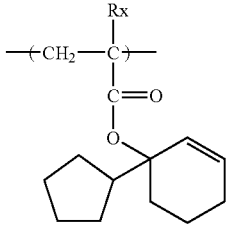

(25)

In each structural formula described above, $R_x$ represents H, $CH_3$, $CF_3$ or $CH_2OH$, and $R_{xa}$ and $R_{xb}$ each independently represents an alkyl group containing from 1 to 4 carbon atoms.

As the halogen atom of $R_{11}'$ and $R_{12}'$ in the general formula (II-AB), there can be illustrated a chlorine atom, a bromine atom, a fluorine atom, and an iodine atom.

As the alkyl group for $R_{11}'$ and $R_{12}'$, a straight or branched alkyl group containing from 1 to 10 carbon atoms are preferred, and examples thereof include a methyl group, an ethyl group, a n-propyl group, an isopropyl group, a straight or branched butyl group, a straight or branched pentyl group, a straight or branched hexyl group, and a straight or branched heptyl group.

The atoms of Z' for forming the alicyclic structure are atoms for forming, in the resin, a repeating unit of an alicyclic hydrocarbon optionally having a substituent, and are preferably atoms for forming a bridged alicyclic structure which forms a repeating unit of a bridged alicyclic hydrocarbon.

As a skeleton of the alicyclic hydrocarbon to be formed, there are illustrated the same cycloalkyl groups as those for $R_{12}$ to $R_{25}$ in the general formulae (pI) to (pV).

The skeleton of the alicyclic hydrocarbon may have a substituent. As such substituent, there can be illustrated $R_{13}'$ to $R_{16}'$ in the foregoing general formula (II-AB1) or (II-AB2).

In the alicyclic hydrocarbon series acid-decomposable resins in accordance with the invention, the group decomposable by the action of an acid may exist in at least one repeating unit among the repeating unit having a partial structure containing the alicyclic hydrocarbon represented by the foregoing general formulae (pI) to (pV), the repeating unit represented by the general formula (II-AB), and the repeating unit of the copolymerizable component to be described hereinafter.

Various substituents of $R_{13}'$ to $R_{16}'$ in the general formula (II-AB1) or (II-AB2) also can be substituents for atoms for forming an alicyclic structure in the general formula (II-AB) or atoms Z for forming a bridged alicyclic structure.

As the repeating units represented by the general formula (II-AB1) or (II-AB2), there are illustrated the following specific examples which, however, are not to be construed to limit the invention in any way.

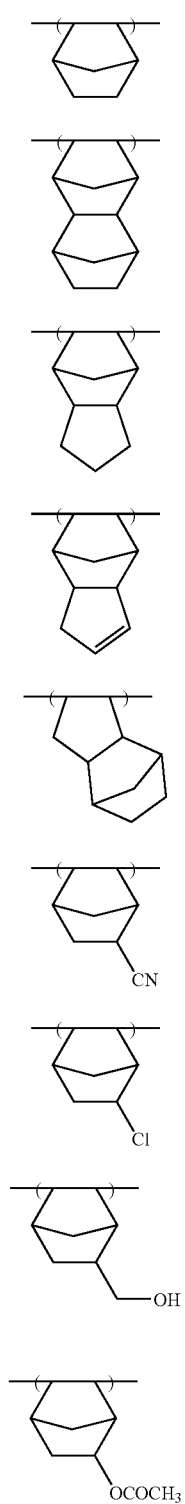

[II-1]
[II-2]
[II-3]
[II-4]
[II-5]
[II-6]
[II-7]
[II-8]
[II-9]

-continued

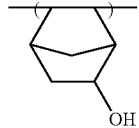
[II-10]

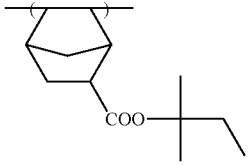
[II-11]

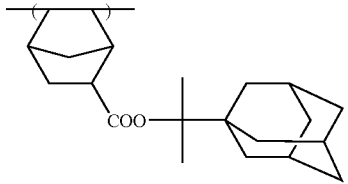
[II-12]

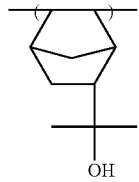
[II-13]

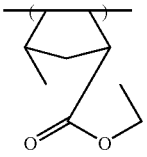
[II-14]

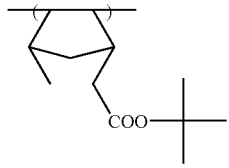
[II-15]

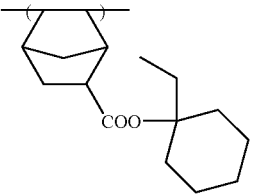
[II-16]

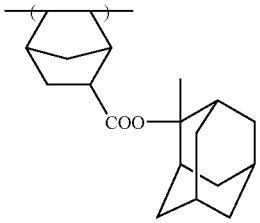
[II-17]

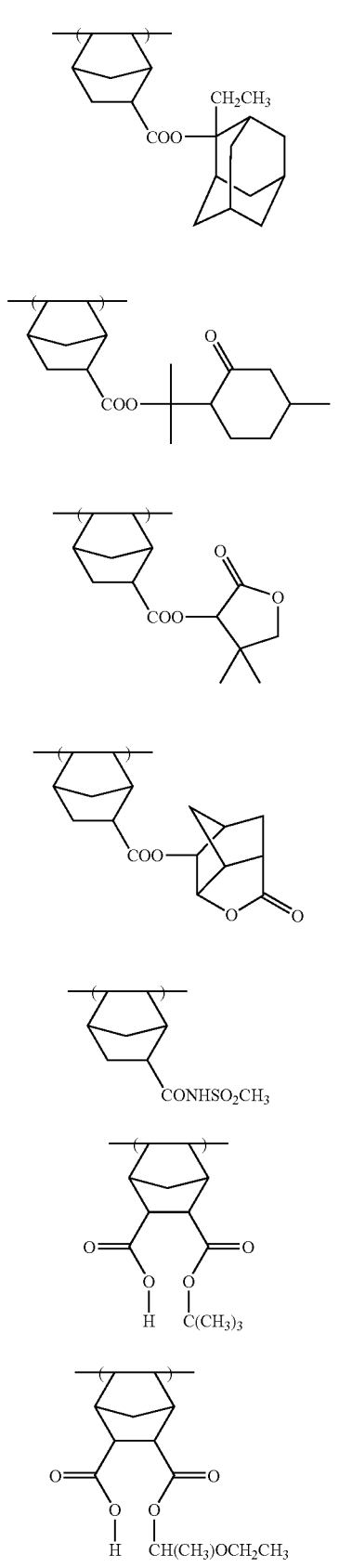
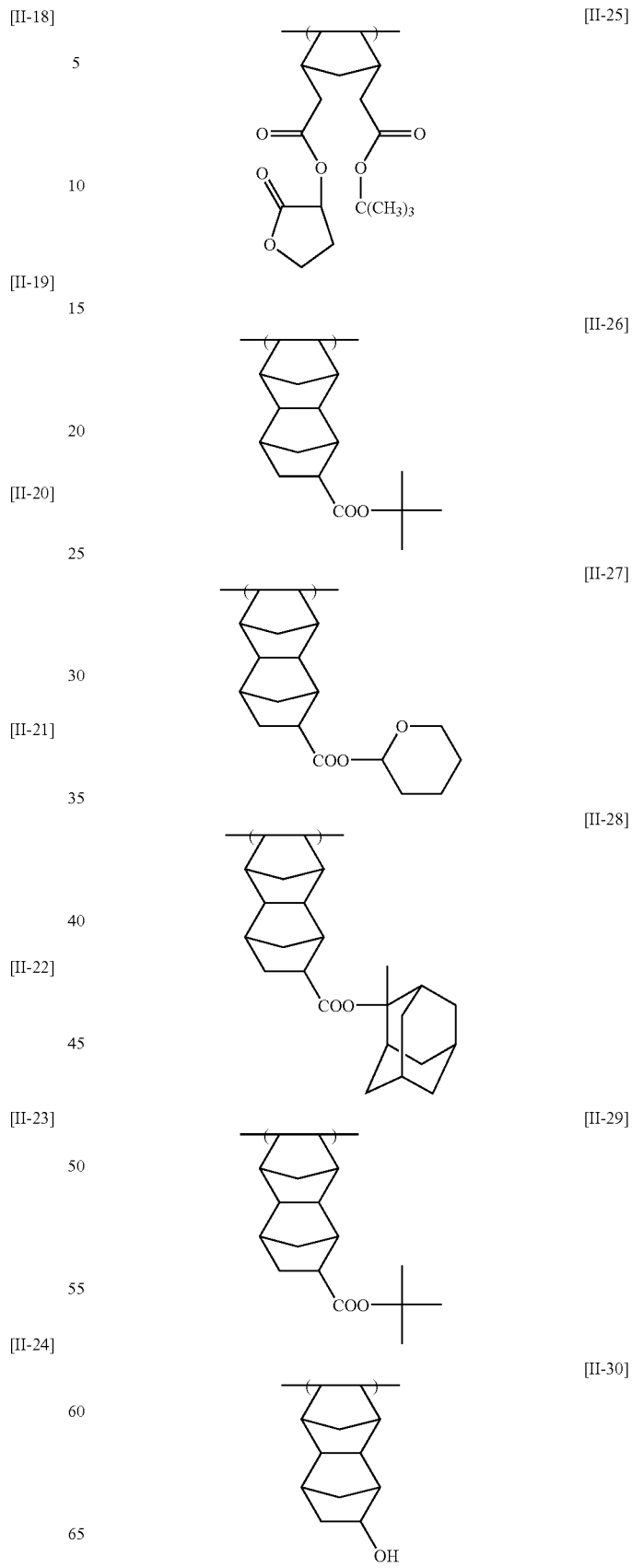

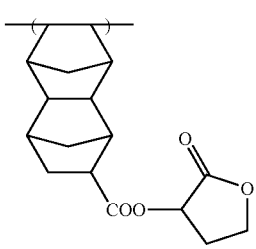

[II-31]

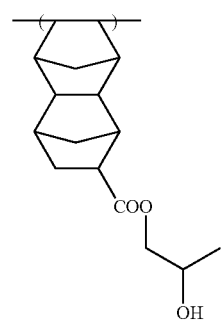

[II-32]

The alicyclic hydrocarbon series acid-decomposable resins of the invention preferably have a repeating unit having a lactone group. As the lactone group, any group that has a lactone structure may be used, but groups having a 5- to 7-membered lactone structure are preferred. In particular, lactone groups wherein other ring structure is condensed with the 5- to 7-membered lactone structure to form a bicyclo-structure or a spiro-structure are preferred. The alicyclic hydrocarbon series acid-decomposable resins of the invention more preferably have a repeating unit having the lactone structure represented by any one of the following general formulae (LC1-1) to (LC1-16). Also, the lactone structure-having group may directly be connected to the main chain. Preferred lactone structures are (LC1-1), (LC1-4), (LC1-5), (LC1-6), (LC1-13), and (LC1-14), and use of a particular lactone structure serves to improve line edge roughness and remove development defects.

LC1-1

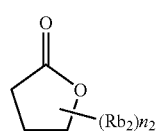

LC1-2

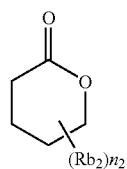

LC1-3

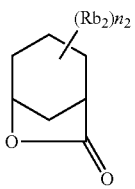

LC1-4

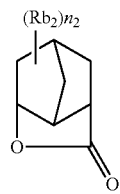

LC1-5

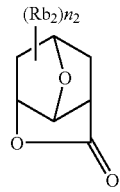

LC1-6

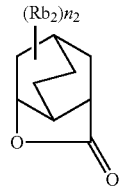

LC1-7

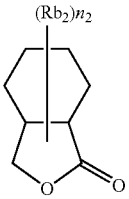

LC1-8

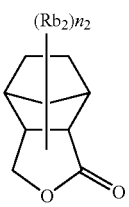

LC1-9

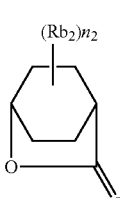

LC1-10

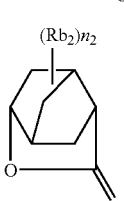

LC1-11

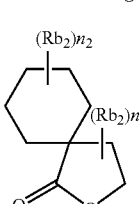

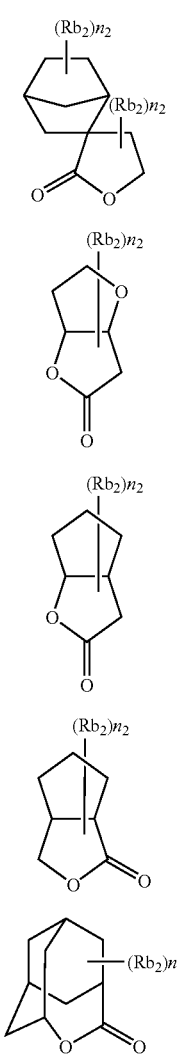

The lactone structure moiety may or may not have a substituent ($Rb_2$). Preferred examples of the substutient ($Rb_2$) include an alkyl group containing from 1 to 8 carbon atoms, a cycloalkyl group containing from 4 to 7 carbon atoms, an alkoxy group containing from 1 to 8 carbon atoms, an alkoxycarbonyl group containing from 1 to 8 carbon atoms, a carboxyl group, a halogen atom, a hydroxyl group, a cyano group, and an acid-decomposable group. $n_2$ represents an integer of from 0 to 4. When $n_2$ is an integer of 2 or more, plural substutients ($Rb_2$) may be the same or different, or plural substituents ($Rb_2$) may be connected to each other to form a ring.

As repeating units having a group containing a lactone structure represented by any one of the general formulae (LC1-1) to (LC1-16), there can be illustrated repeating units of the general formula (II-AB1) or (II-AB2) wherein at least one of $R_{13}'$ to $R_{16}'$ has a group represented by one of the general formulae (LC1-1) to (LC1-16) (for example, a group represented by —$COOR_5$ wherein $R_5$ represents a group represented by one of the general formulae (LC1-1) to (LC-1-16) or repeating units represented by the following general formula (AI).

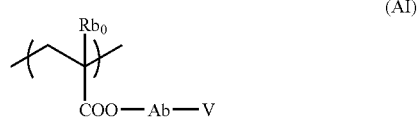

In the general formula (AI), $Rb_o$ represents a hydrogen atom, a halogen atom or an alkyl group containing from 1 to 4 carbon atoms.

Examples of the alkyl group of $Rb_o$ include a methyl group, an ethyl group, a propyl group, a n-butyl group, a sec-butyl group, and a t-butyl group. The alkyl group of $Rb_o$ may have a substituent. Preferred examples of the substituent which the alkyl group of $Rb_o$ may have include a hydroxyl group and a halogen atom.

Examples of the halogen atom of $Rb_o$ include a fluorine atom, a chlorine atom, a bromine atom, and an iodine atom.

$Rb_o$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent group of a combination thereof, preferably represents a single bond or a linking group represented by -$Ab_1$-$CO_2$— wherein $Ab_1$ represents a straight or branched alkylene group or a monocyclic or polycyclic cycloalkylene group, preferably a methylene group, an ethylene group, a cyclohexyl residue, an adamantyl residue or a norbornyl residue.

V represents a group represented by any one of the general formulae (LC1-1) to (LC-1-16).

Usually, optical isomers exist for the repeating units having a lactone structure, and any of the optical isomers may be used. Also, the optical isomers may be used alone or as a mixture of plural optical isomers. In the case of mainly using one optical isomer, optical isomers having an optical purity (ee) of 90 or more is preferred, with an optical purity of 95 or more being more preferred.

Specific examples of the repeating units having a lactone structure are illustrated below which, however, are not construed to limit the invention.

(In the following formulae, $R_x$ represents $CH_3$, $CH_2OH$ or $CF_3$.)

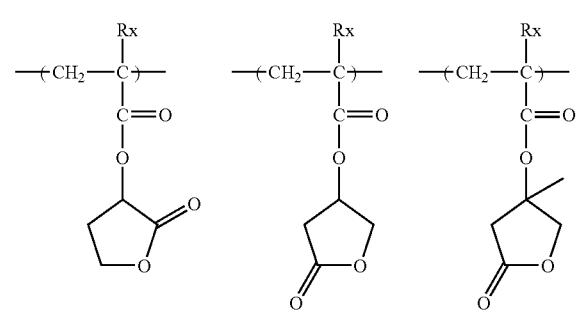

-continued
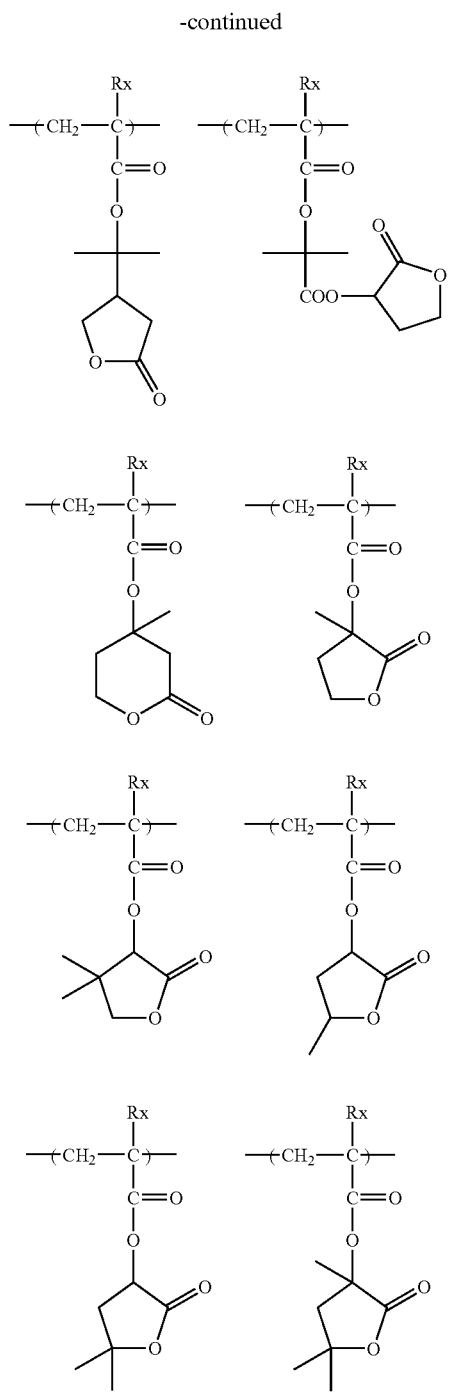
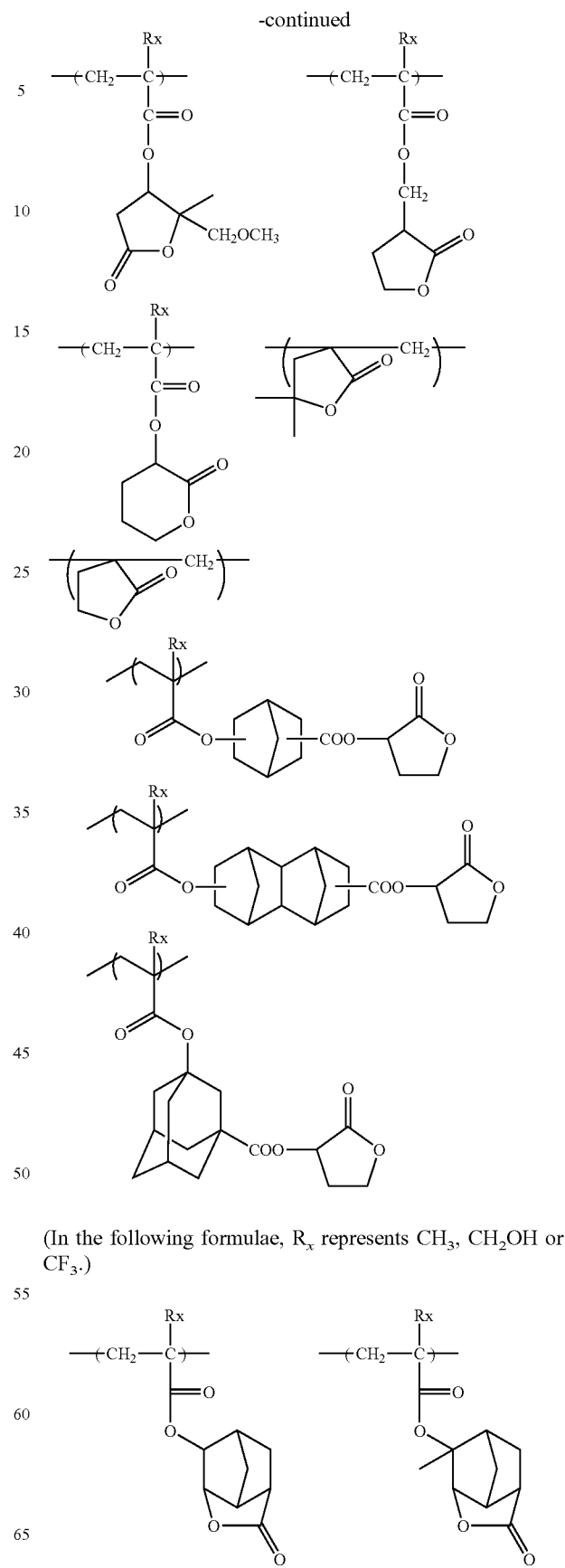
(In the following formulae, $R_x$ represents $CH_3$, $CH_2OH$ or $CF_3$.)

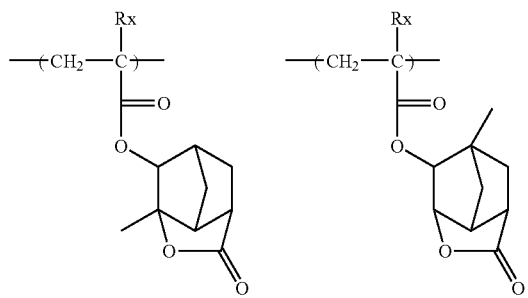
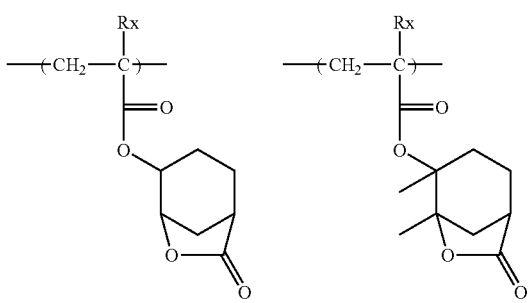
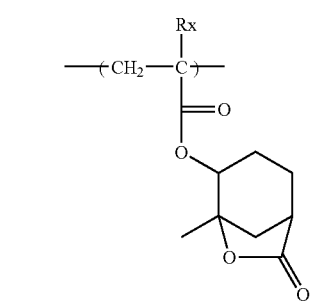
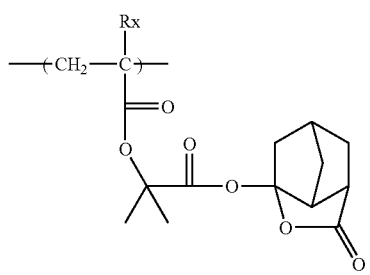
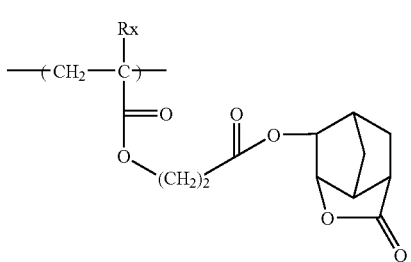
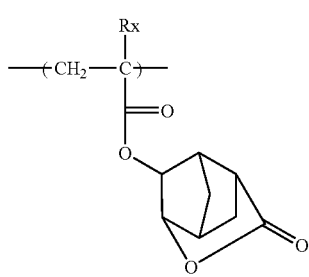
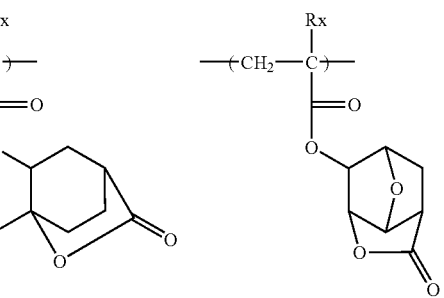
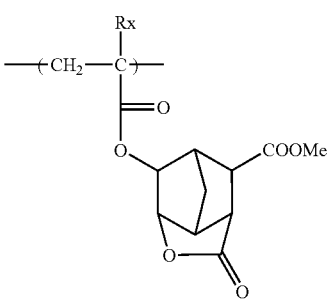
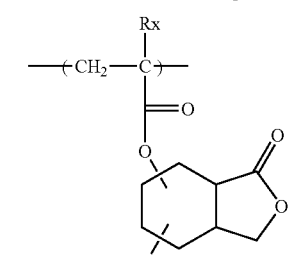
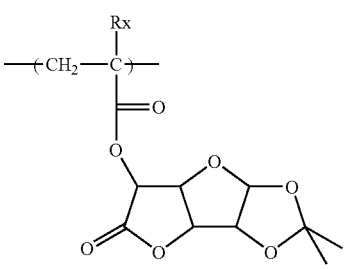
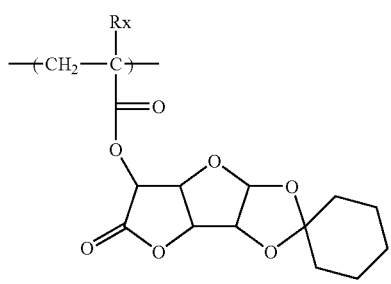

-continued

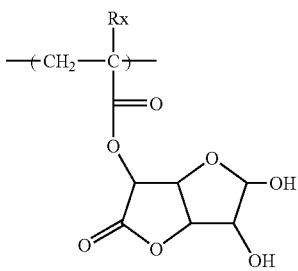

(In the following formulae, $R_x$ represents $CH_3$, $CH_2OH$ or $CF_3$.)

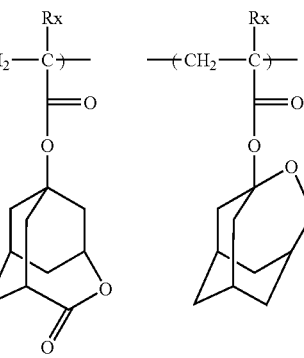

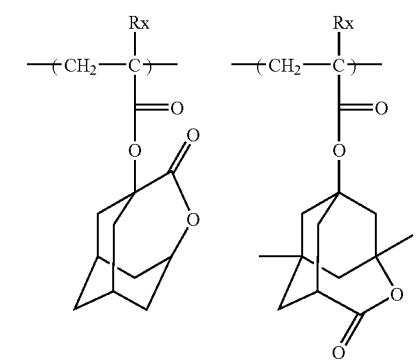

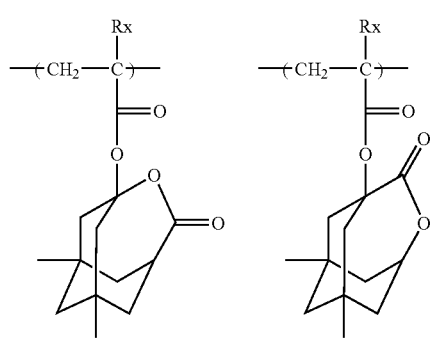

-continued

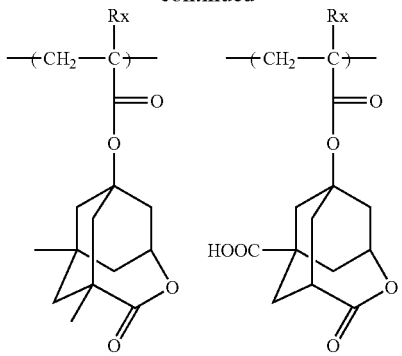

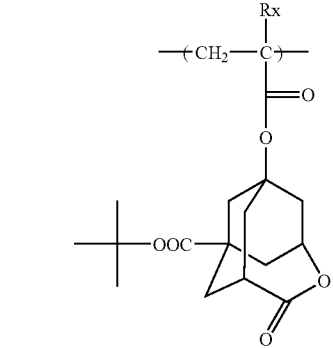

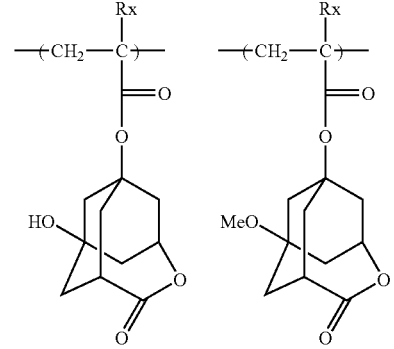

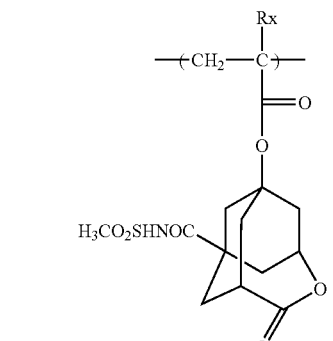

The alicyclic hydrocarbon series acid-decomposable resin of the invention preferably has a repeating unit having an alicyclic hydrocarbon structure substituted by a polar group. Such polar group serves to improve adhesion properties to a substrate and affinity for a developer. As the polar group, a hydroxyl group and a cyano group are preferred.

Examples of the alicyclic hydrocarbon structure substituted by the polar group include structures represented by the following general formula (VIIa) or (VIIb).

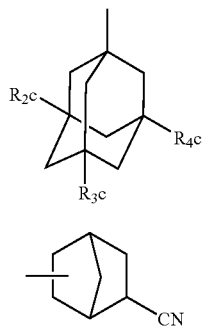
(VIIa)

(VIIb)

In the general formula (VIIa), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. Preferably, one or two of $R_{2c}$ to $R_{4c}$ represent a hydroxyl group and, more preferably, two of $R_{2c}$ to $R_{4c}$ represent a hydroxyl group, and the rest represents a hydrogen atom.

The group represented by the general formula (VIIa) is preferably a dihydroxy derivative or a monohydroxy derivative, more preferably a dihydroxy derivative.

As repeating units having a group represented by the general formula (VIIa) or (VIIb), there can be illustrated repeating units of the general formula (II-AB1) or (II-AB2) wherein at least one of $R_{13}'$ to $R_{16}'$ has a group represented by the general formula (VIIa) or (VIIb) (for example, a group represented by —COOR$_5$ wherein $R_5$ represents a group represented by the general formula (VIIa) or (VIIb) or repeating units represented by the following general formula (AIIa) or (AIIb).

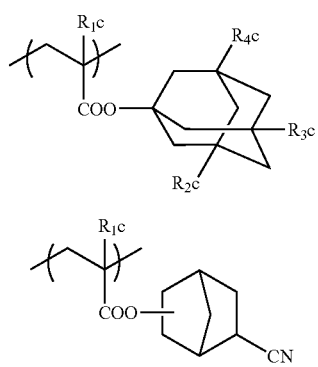
(AIIa)

(AIIb)

In the general formulae (AIIa) and (AIIb), $R_{1c}$ represents a hydrogen atom, a methyl group, a trifluoromethyl group or a hydroxymethyl group.

$R_{2c}$ to $R_{4c}$ are the same as defined with respect to $R_{2c}$ to $R_{4c}$ in the general formula (VIIa).

Specific examples of the repeating units represented by the general formula (AIIa) or (AIIb) and having an alicyclic hydrocarbon structure substituted by a polar group are illustrated below which, however, are not to be construed to limit the invention in any way.

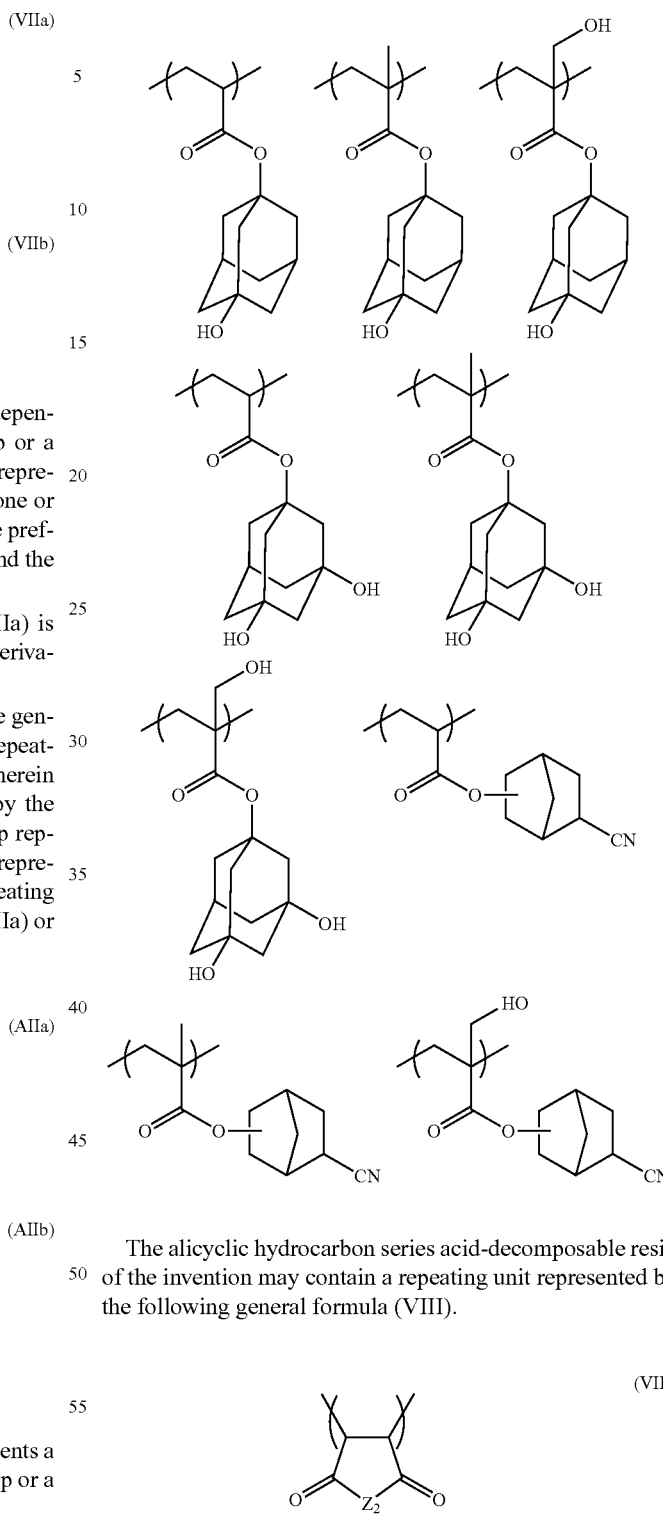

The alicyclic hydrocarbon series acid-decomposable resin of the invention may contain a repeating unit represented by the following general formula (VIII).

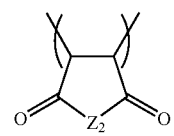
(VIII)

In the general formula (VIII), $Z_2$ represents —O— or —N(R$_{41}$)—. $R_{41}$ represents a hydrogen atom, a hydroxyl group, an alkyl group or a —OSO$_2$—R$_{42}$. $R_{42}$ represents an alkyl group, a cycloalkyl group or a camphor residue. The alkyl group of $R_{41}$ and $R_{42}$ may be substituted by a halogen atom (preferably a fluorine atom) or the like.

Specific examples of the repeating units represented by the general formula (VIII) are illustrated below which, however, are not to be construed to limit the invention in any way.

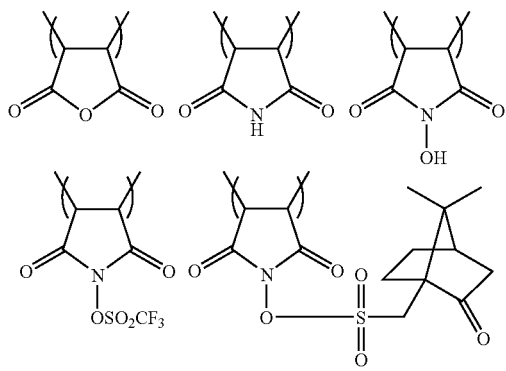

The alicyclic hydrocarbon series acid-decomposable resin of the invention contains preferably a repeating unit having an alkali-soluble group, more preferably a repeating unit having a carboxyl group. Presence of such group serves to increase resolution in the contact hole application. As repeating units having a carboxyl group, both repeating units wherein a carboxyl group is directly connected to the main chain of the resin like the repeating unit of acrylic acid or methacrylic acid and repeating units wherein a carboxylic acid is connected to the main chain of the resin through a linking group are preferred. Such linking group may have a monocyclic or polycyclic hydrocarbon structure. Acrylic acid and methacrylic acid are particularly preferred.

The alicyclic hydrocarbon series acid-decomposable resin of the invention may contain a repeating unit having 1 to 3 groups represented by the following general formula (F1). Presence of such repeating unit serves to improve line edge roughness performance.

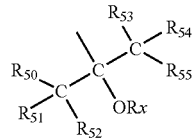

(F1)

In the general formula (F1), $R_{50}$ to $R_{55}$ each independently represents a hydrogen atom, a fluorine atom or an alkyl group, provided that at least one of $R_{50}$ to $R_{55}$ represents a fluorine atom or an alkyl group wherein at least one hydrogen atom is replaced by a fluorine atom.

$R_x$ represents a hydrogen atom or an organic group (preferably an acid-decomposable protective group, an alkyl group, a cycloalkyl group, an acyl group or an alkoxycarbonyl group).

The alkyl group for $R_{50}$ to $R_{55}$ may be substituted by a halogen atom such as a fluorine atom or by a cyano group, and preferred examples of the alkyl group include an alkyl group containing from 1 to 3 carbon atoms, for example, a methyl group or a trifluoromethyl group.

All of $R_{50}$ to $R_{55}$ are preferably a fluorine atom.

As the organic group which $R_x$ represents, an acid-decomposable protective group, an alkyl group, a cycloalkyl group, an acyl group, an alkylcarbonyl group, an alkoxycarbonyl group, an alkoxycarbonylmethyl group, an alkoxymethyl group, and a 1-alkoxyethyl group, which may have a substituent, are preferred.

As repeating units having a group represented by the general formula (F1), there can be illustrated, preferably, repeating units represented by the following general formula (F2).

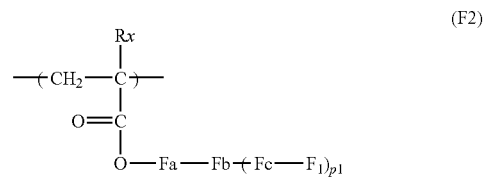

In the general formula (F2), $R_x$ represents a hydrogen atom, a halogen atom or an alkyl group containing from 1 to 4 carbon atoms. Examples of preferred substituent which the alkyl group of $R_x$ may have include a hydroxyl group and a halogen atom.

Fa represents a single bond or a straight or branched alkylene group, preferably a single bond.

Fb represents a monocyclic or polycyclic hydrocarbon group.

Fc represents a single bond or a straight or branched alkylene group, preferably a single bond or a methylene group.

$F_1$ represents the group represented by the general formula (F1).

$p_1$ represents 1 to 3.

As the cyclic hydrocarbon group in Fb, a cyclopentyl group, a cyclohexyl group and a norbornyl group are preferred.

Specific examples of the repeating units having the structure of the general formula (F1) are shown below which, however, are not to be construed to limit the invention in any way.

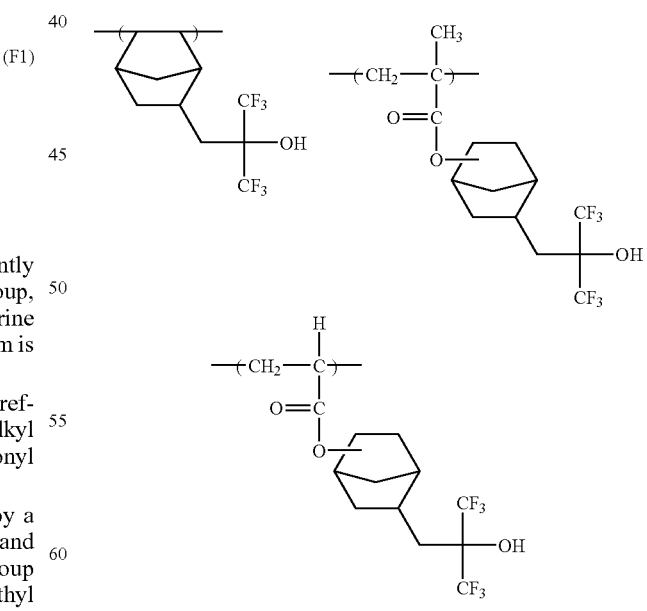

The alicyclic hydrocarbon series acid-decomposable resin of the invention may have various repeating structural units, in addition to the above-described repeating structural units, for the purpose of adjusting dry-etching resistance, adaptability for a standard developer, adhesion properties to a substrate, resist profile and, further, physical properties generally required for resists, such as resolution, heat resistance, and sensitivity.

As such additional repeating structural units, there can be illustrated repeating structural units corresponding to the following monomers which, however, are not to be construed to limit the invention in any way.

Monomers which enable fine adjustment of properties required for the alicyclic hydrocarbon series acid-decomposable resin, such as, particularly, the following.

(1) Solubility for a coating solvent
(2) Film-forming properties (glass transition point)
(3) Alkali developability
(4) Film thickness reduction (hydrophilicity/hydrophobicity, selection of alkali-soluble groups)
(5) Adhesion in unexposed areas to a substrate
(6) Dry-etching resistance Examples of such monomers include compounds having one addition-polymerizable unsaturated bond which are selected from among acrylic esters, methacrylic esters, acrylamides, methacrylamides, allyl compounds, vinyl ethers, and vinyl esters.

In addition to the above-described compounds, unsaturated compounds which are co-polymerizable with the monomers corresponding to the above-described various repeating structural units may be copolymerized.

In the alicyclic hydrocarbon series acid-decomposable resins, molar ratio of each repeating structural unit contained in the resin is properly determined so as to adjust dry-etching resistance, adaptability for a standard developer, adhesion properties to a substrate, resist profile and, further, physical properties generally required for resists, such as resolution, heat resistance, and sensitivity.

As preferred embodiments of the alicyclic hydrocarbon series acid-decomposable resin of the invention, there are illustrated the following.

(1) Resins containing a repeating unit having a partial structure containing an alicyclic hydrocarbon represented by one of the general formulae (pI) to (pV) (side chain type), preferably resins containing a repeating unit derived from (meth)acrylates having the structures of (pI) to (pV).

(2) Resins containing repeating units represented by the general formula (II-AB) (main chain type), provided that, in (2), there are further illustrated, for example, the following.

(3) Resins having the repeating unit represented by the general formula (II-AB), a maleic anhydride derivative structure, and a (meth)acrylate structure (hybrid type).

In the alicyclic hydrocarbon series acid-decomposable resin, the content of the repeating unit having an acid-decomposable group is preferably from 10 to 60 mol %, more preferably from 20 to 50 mol %, still more preferably from 25 to 40 mol %, based on all the repeating structural units.

In the alicyclic hydrocarbon series acid-decomposable resin, the content of the repeating unit having the partial structure containing an alicyclic hydrocarbon represented by one of the general formulae (pI) to (pV) is preferably from 25 to 70 mol %, more preferably from 35 to 65 mol %, still more preferably from 40 to 60 mol %, based on all the repeating structural units.

In the alicyclic hydrocarbon series acid-decomposable resin, the content of the repeating unit represented by the general formula (II-AB) is preferably from 10 to 60 mol %, more preferably from 15 to 55 mol %, still more preferably from 20 to 50 mol %, based on all the repeating structural units.

In addition, the content of the repeating structural unit derived from the monomer of the above-described copolymerizable component can properly be determined depending upon the performances of the desired resist but, generally, the content is preferably 99 mol % or less, more preferably 90 mol % or less, still more preferably 80 mol % or less, based on the total mol number of the repeating structural unit having the partial structure containing an alicyclic hydrocarbon represented by one of the general formulae (pI) to (pV) and the repeating unit represented by the general formula (II-AB).

When the composition of the invention is to be used for ArF exposure, the resin preferably does not contain an aromatic group in view of transparency to ArF light.

The alicyclic hydrocarbon series acid-decomposable resin to be used in the invention is preferably a resin wherein all the repeating units are constituted by (meth)acrylate series repeating units. In this case, any of resin wherein all the repeating units are methacrylate series repeating units, resins wherein all the repeating units are acrylate series repeating units, and resins wherein all the repeating units are a mixture of methacrylate series repeating units/acrylate series repeating units may be used. However, the content of the acrylate series repeating unit is preferably 50 mol % or less based on all the repeating units.

More preferred are terpolymers containing 25 to 50% of the repeating unit having a partial structure containing the alicyclic hydrocarbon represented by the general formula (pI) to (pV), 25 to 50% of the repeating unit having a lactone structure, and 5 to 30% of the repeating unit having an alicyclic hydrocarbon structure substituted by a polar group or quadripolymers further containing 5 to 20% of the repeating unit having the structure represented by the general formula (F1).

In the resist composition of the invention, the amount of the resins of component (A) to be compounded is preferably from 50 to 99.99% by weight, more preferably from 60 to 99.0% by weight, based on the weight of all the solid components.

(B) Compound Capable of Generating an Acid Upon Irradiation with an Actinic Ray or Radiation Compounds capable of generating an acid upon irradiation with an actinic ray or radiation (hereinafter also referred to as "acid-generating agent") will be described below.

As the acid-generating agents which can be used in the invention, appropriate one can be selected from among compounds generally used as acid-generating agents.

That is, appropriate one can be selected from photo initiators for photo cationic polymerization, photo initiators for photo radical polymerization, photo decoloring agents for coloring matters, photo discoloring agents, known compounds capable of generating an acid upon irradiation with an actinic ray or radiation, which are used for microresist or the like, and mixtures thereof.

Examples thereof include diazonium salts, phosphonium salts, sulfonium salts, iodonium salts, imidosulfonates, oximesulfonates, diazodisulfones, disulfones and o-nitrobenzyl sulfonates.

Also, compounds where the above-described group or compound capable of generating an acid upon irradiation with an actinic ray or radiation is introduced into the main chain or side chain of polymer may be used, and examples thereof include the compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Further, compounds capable of generating an acid by light described in U.S. Pat. No. 3,779,778 and European Patent 126,712 may also be used.

As preferred examples of the acid generating agents, there can be illustrated those compounds which are represented by the following general formula (ZI), (ZII) or (ZIII).

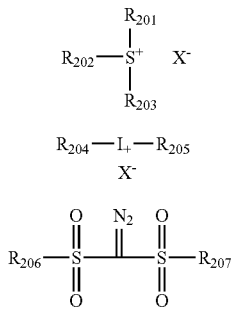

In the general formula (ZI), $R_{201}$, $R_{202}$, and $R_{203}$ each independently represents an organic group.

$X^-$ represents a non-nucleophilic anion.

The organic group for $R_{201}$, $R_{202}$, and $R_{203}$ generally contains from 1 to 30 carbon atoms, preferably from 1 to 20 carbon atoms.

Two of $R_{201}$ to $R_{203}$ may be connected to each other to form a ring structure, and the ring may contain oxygen atom, sulfur atom, ester bond, amido bond or carbonyl group. Examples of the group formed by connecting two of $R_{201}$ to $R_{203}$ include alkylene groups (e.g., a butylenes group and a pentylene group).

Specific examples of the organic group for $R_{201}$, $R_{202}$, and $R_{203}$ include corresponding groups in compounds (ZI-1), (ZI-2) and (ZI-3) to be described hereinafter.

Compounds having plural structures represented by the general formula (ZI) may also be used. For example, compounds having a structure wherein at least one of $R_{201}$ to $R_{203}$ of one compound represented by the general formula (ZI) is connected to at least one of $R_{201}$ to $R_{203}$ of another compound represented by the general formula (ZI) may be used.

As more preferred examples of the (ZI) component, there can be illustrated compounds (ZI-1), (ZI-2) and (ZI-3) to be described hereinafter.

Compounds (ZI-1) are arylsulfonium compounds wherein at least one of $R_{201}$ to $R_{203}$ of the general formula (ZI) is an aryl group.

With the arylsuofonium compounds, all of $R_{201}$ to $R_{203}$ may be an aryl group, or part of $R_{201}$ to $R_{203}$ may be an aryl group, with the rest being an alkyl group or a cycloalkyl group.

Examples of the arylsulfonium compound include triarylsulfonium compounds, diarylalkylsulfonium compounds, aryldialkylsulfonium compounds, diarylcycloalkylsulfonium compounds, and aryldicycloalkylsulfonium compounds.

As the aryl group in the arylsulfonium compounds, a phenyl group and a naphthyl group are preferred, with a phenyl group being more preferred. The aryl group may be an aryl group having a hetero ring structure containing oxygen atom, nitrogen atom or sulfur atom. Examples thereof include a pyrrole residue (a group formed by removing one hydrogen atom from pyrrole), a furan residue (a group formed by removing one hydrogen atom from furan), a thiophene residue (a group formed by removing one hydrogen atom from thiophene), an indole residue (a group formed by removing one hydrogen atom from indole), a benzofuran residue (a group formed by removing one hydrogen atom from benzofuran), and a benzothiophene residue (a group formed by removing one hydrogen atom from benzothiophene). In the case where the arylsuofonium compound contains two or more aryl groups, the two or more aryl groups may be the same or different.

As the alkyl group which the arylsulfonium compound has as needed, straight or branched alkyl groups containing from 1 to 15 carbon atoms are preferred, and examples thereof include a methyl group, an ethyl group, a propyl group, a n-butyl group, a sec-butyl group, and a t-butyl group.

As the cycloalkyl group which the arylsulfonium compound has as needed, cycloalkyl groups containing from 3 to 15 carbon atoms are preferred, and examples thereof include a cyclopropyl group, a cyclobutyl group, and a cyclohexyl group.

The aryl group, alkyl group, and cycloalkyl group of $R_{201}$ to $R_{203}$ may have a substituent such as an alkyl group (containing, for example, from 1 to 15 carbon atoms), a cycloalkyl group (containing, for example, from 3 to 15 carbon atoms), an aryl group (containing, for example, from 6 to 14 carbon atoms), an alkoxy group (containing, for example, from 1 to 15 carbon atoms), a halogen atom, a hydroxyl group, or a phenylthio group. Preferred substituents are a straight or branched alkyl group containing from 1 to 12 carbon atoms, a cycloalkyl group containing from 3 to 12 carbon atoms, and an alkoxy group containing from 1 to 12 carbon atoms, and particularly preferred substituents are an alkyl group containing from 1 to 4 carbon atoms and an alkoxy group containing from 1 to 4 carbon atoms. The substituents may exist in one of the three groups of $R_{201}$ to $R_{203}$ or in all of the three groups. Also, in the case where $R_{201}$ to $R_{203}$ are aryl groups, the substituent preferably exists at the p-position of aryl group.

Examples of the non-nucleophilic anion as $X^-$ include sulfonic acid anion, carboxylic acid anion, sulfonylimide anion, bis(alkylsulfonyl)imide anion, and tris(alkylsulfonyl)methyl anion.

Herein, the non-nucleophilic anion is an anion with considerably low ability to cause a nucleophilic reaction, and is an anion capable of suppressing decomposition with age attributable to an intramolecular nucleophilic reaction. This serves to improve long-term stability of resist.

Examples of the sulfonic acid anion include an aliphatic sulfonic acid anion, an aromatic sulfonic acid anion, and a camphor sulfonic acid anion.

Examples of the carboxylic acid anion include an aliphatic carboxylic acid anion, an aromatic carboxylic acid anion, and an aralkyl carboxylic acid anion.

Examples of the aliphatic group in the aliphatic sulfonic acid anion include an alkyl group containing from 1 to 30 carbon atoms, specifically a methyl group, an ethyl group, a propyl group, an isopropyl group, a n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, and an eicosyl group, and a cycloalkyl group containing from 3 to 30 carbon atoms, specifically a cyclopropyl group, a cyclopentyl group, a cyclohexyl group, an adamantly group, a norbornyl group, and a bornyl group.

Examples of the aromatic groups in the aromatic sulfonic acid anion include aryl groups preferably containing from 6 to 14 carbon atoms, such as a phenyl group, a tolyl group, and a naphthyl group.

The alkyl, cycloalkyl, and aryl groups in the aliphatic sulfonic acid anion and aromatic sulfonic acid anion may have substituents.

Examples of the substituents include a nitro group, a halogen atom (a fluorine atom, a chlorine atom, a bromine atom or an iodine atom), a carboxyl group, a hydroxyl group, an amino group, a cyano group, an alkoxy group (containing preferably from 1 to 5 carbon atoms), a cycloalkyl group (containing preferably from 3 to 15 carbon atoms, an aryl group (containing preferably from 6 to 14 carbon atoms), an alkoxycarbonyl group (containing preferably from 2 to 7 carbon atoms), an acyl group (containing preferably from 2 to 12 carbon atoms), an alkoxycarbonyloxy group (containing preferably from 2 to 7 carbon atoms), and an alkylthio group containing preferably from 1 to 15 carbon atoms). With the aryl groups and the ring structures which individual groups have, alkyl groups (containing preferably from 1 to 15 carbon atoms) can be further illustrated as substituents thereof.

Examples of the aliphatic group in the aliphatic carboxylic acid anion include the same aliphatic groups as in the aliphatic sulfonic acid anions.

Examples of the aromatic group in the aromatic carboxylic acid anion include the same aromatic groups as in the aromatic sulfonic acid anions.

Examples of the aralkyl group in the aralkylcarboxylic acid anion include aralkyl groups preferably containing from 6 to 12 carbon atoms, such as a benzyl group, a phenethyl group, a naphthylmethyl group, a naphthylethyl group, and a naphthylbutyl group.

The aliphatic, aromatic, and aralkyl groups in the aliphatic carboxylic acid anions, aromatic carboxylic acid anions, and aralkyl carboxylic acid anions may have substituents. Examples of the substituents include the same halogen atoms, alkyl groups, cycloalkyl groups, alkoxy groups, and alkylthio groups as in the aliphatic sulfonic acid anions.

Examples of the sulfonylimide anion include a saccharin anion.

The alkyl group in the bis(alkylsulfonyl)imide anion and tris(alkylsulfonyl)methyl anion preferably is an alkyl group containing from 1 to 5 carbon atoms. Examples thereof include a methyl group, an ethyl group, a propyl group, an isopropyl group, a n-butyl group, an isobutyl group, a sec-butyl group, a pentyl group, and a neopentyl group. These alkyl groups may have substituents. Examples of the substituents include a halogen atom, an alkyl group substituted by one or more halogen atoms, an alkoxy group, and an alkylthio group. Preferred are alkyl groups substituted by one or more fluorine atoms.

Other examples of the non-nucleophilic anion include phosphorus fluoride, boron fluoride, and antimony fluoride.

The non-nucleophilic anion represented by X⁻ preferably is an aliphatic sulfonic acid anion substituted by one or more fluorine atoms at the α-position of the sulfonic acid, an aromatic sulfonic acid anion substituted by one or more fluorine atoms or fluorinated groups, a bis(alkylsulfonyl)imide anion in which the alkyl groups are substituted by one or more fluorine atoms, or a tris(alkylsulfonyl)methyl anion in which the alkyl groups are substituted by one or more fluorine atoms. The non-nucleophilic anion more preferably is a perfluo-aliphatic sulfonic acid anion containing from 4 to 8 carbon atoms or a fluorine-containing aromatic sulfonic acid anion, and still more preferably is a nonafluorobutane sulfonic acid anion, a perfluorooctane sulfonic acid anion, a pentafluorobenzenesulfonic acid anion or a 3,5-bis(trifluoromethyl)benzenesulfonic acid anion.

Next, compounds (ZI-2) will be explained.

Compounds (ZI-2) are compounds represented by formula (ZI) wherein $R_{201}$ to $R_{203}$ each independently represents an organic group containing no aromatic ring. The term "aromatic ring" as used herein means any of aromatic rings including ones containing one or more hetero atoms.

The organic groups containing no aromatic ring which are represented by $R_{201}$ to $R_{203}$ each contain generally from 1 to 30 carbon atoms, preferably from 1 to 20 carbon atoms.

Preferably, $R_{201}$ to $R_{203}$ each independently is an alkyl group, a cycloalkyl group, an allyl group or a vinyl group. $R_{201}$ to $R_{203}$ each more preferably is a straight, branched, or cyclic 2-oxoalkyl group or an alkoxycarbonylmethyl group, and particularly preferably is a straight or branched 2-oxoalkyl group.

The alkyl group represented by $R_{201}$ to $R_{203}$ may be either of straight or branched alkyl groups. Preferred examples thereof include straight or branched alkyl groups containing from 1 to 10 carbon atoms (e.g., a methyl group, an ethyl group, a propyl group, a butyl group, and a pentyl group). More preferred alkyl groups are 2-oxoalkyl (straight or branched) groups and alkoxycarbonylmethyl groups.

The cycloalkyl group represented by $R_{201}$ to $R_{203}$ is preferably a cycloalkyl group containing from 3 to 10 carbon atoms, and preferred examples thereof include a cyclopentyl group, a cyclohexyl group, and a norbornyl group. More preferred cycloalkyl groups are 2-oxocycloalkyl groups.

The 2-oxoalkyl groups may be either straight or branched or cyclic. Preferred examples thereof include the alkyl and cycloalkyl groups illustrated above which each has >C=O in the 2-position thereof.

Examples of the alkoxy group in the alkoxycarbonylmethyl group include alkoxy groups preferably containing from 1 to 5 carbon atoms (a methoxy group, an ethoxy group, a propoxy group, a butoxy group, and a pentoxy group).

$R_{201}$ to $R_{203}$ may be further substituted by a halogen atom, an alkoxy group (containing, for example, from 1 to 5 carbon atoms), a hydroxyl group, a cyano group, or a nitro group.

Compounds (ZI-3) are compounds represented by the following general formula (ZI-3), namely, compounds having a phenacylsulfonium salt structure.

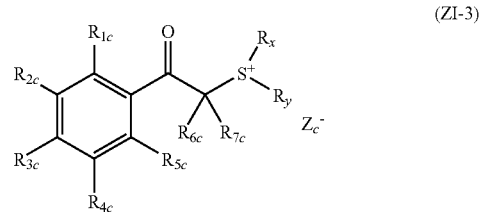

(ZI-3)

In the general formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Two or more of $R_{1c}$ to $R_{7c}$ may be connected to each other to form a ring structure, and $R_x$ and $R_y$ may be connected to each other to form a ring structure. These ring structures may contain an oxygen atom, a sulfur atom, an ester bond or an amide bond. Examples of the group formed by two or more of $R_{1c}$ to $R_{7c}$ connected to each other or by $R_x$ and $R_y$ connected to each other include a butylene group or a pentylene group.

$Z_c^-$ represents a non-nucleophilic anion, which is the same as the non-nucleophilic anion X⁻ in the general formula (ZI).

The alkyl group represented by $R_{1c}$ to $R_{7c}$ is preferably a straight or branched alkyl group containing from 1 to 20 carbon atoms, and examples thereof include a methyl group, an ethyl group, a straight or branched propyl group, a straight or branched butyl group, and a straight or branched pentyl group.

The cycloalkyl group represented by $R_{1c}$ to $R_{7c}$ is preferably a cycloalkyl group containing from 3 to 8 carbon atoms, and examples thereof include a cyclopentyl group and a cyclohexyl group.

The alkoxy groups represented by $R_{1c}$ to $R_{5c}$ may be either straight or branched or cyclic. Examples thereof include alkoxy groups containing from 1 to 10 carbon atoms. Preferred examples thereof include straight or branched alkoxy groups containing from 1 to 5 carbon atoms (e.g., a methoxy group, an ethoxy group, a straight or branched propoxy group, a straight or branched butoxy, and a straight or branched pentoxy group) and cyclic alkoxy groups containing from 3 to 8 carbon atoms (e.g., a cyclopentyloxy group and a cyclohexyloxy group).

It is preferred that any of $R_{1c}$ to $R_{5c}$ be a straight or branched alkyl group, cycloalkyl group, or straight, branched, or cyclic alkoxy group. It is more preferred that the total number of carbon atoms in $R_{1c}$ to $R_{5c}$ be from 2 to 15, which serves to further improve solubility in solvents and inhibit generation of particles during storage.

Examples of the alkyl group and cycloalkyl group represented by $R_x$ and $R_y$ include the same groups as those illustrated above as examples of the alkyl groups and cycloalkyl groups represented by $R_{1c}$ to $R_{7c}$. Preferred are 2-oxoalkyl groups, 2-oxocycloalkyl groups and alkoxycarbonylmethyl groups.

Examples of the 2-oxoalkyl group and the 2-oxocycloalkyl group include those alkyl and cycloalkyl groups represented by $R_{1c}$ to $R_{7c}$ which each has $>C=O$ in the 2-position thereof.

Examples of the alkoxy group in the alkoxycarbonylmethyl group include the same groups as those illustrated above as examples of the alkoxy groups represented by $R_{1c}$ to $R_{5c}$.

$R_x$ and $R_y$ each preferably is an alkyl group containing 4 or more carbon atoms, and more preferably is an alkyl group having 6 or more, still more preferably 8 or more carbon atoms.

In general formulae (ZII) and (ZIII), $R_{204}$ to $R_{207}$ each independently represents an aryl group, an alkyl group or a cycloalkyl group.

The aryl group represented by $R_{204}$ to $R_{207}$ is preferably a phenyl group or a naphthyl group, and more preferably a phenyl group. The aryl group represented by $R_{204}$ to $R_{207}$ may be an aryl group having a hetero ring structure containing oxygen atom, nitrogen atom or sulfur atom. Examples of the aryl group having a hetero ring structure include a pyrrole residue (a group formed by removing one hydrogen atom from pyrrole), a furan residue (a group formed by removing one hydrogen atom from furan), a thiophene residue (a group formed by removing one hydrogen atom from thiophene), an indole residue (a group formed by removing one hydrogen atom from indole), a benzofuran residue (a group formed by removing one hydrogen atom from benzofuran), and a benzothiophene residue (a group formed by removing one hydrogen atom from benzothiophene).

The alkyl group represented by $R_{204}$ to $R_{207}$ is preferably a straight or branched alkyl group containing from 1 to 10 carbon atoms, and examples thereof include a methyl group, an ethyl group, a propyl group, a butyl group, and a pentyl group.

The cycloalkyl group represented by $R_{204}$ to $R_{207}$ is preferably a cycloalkyl group containing from 3 to 10 carbon atoms, and examples thereof include a cyclopentyl group, a cyclohexyl group, and a norbornyl group.

Examples of the substituents which $R_{204}$ to $R_{207}$ may have include an alkyl group (containing, for example, from 1 to 15 carbon atoms), a cycloalkyl group (containing, for example, from 3 to 15 carbon atoms), an aryl group (containing, for example, from 6 to 15 carbon atoms), an alkoxy group (containing, for example, from 1 to 15 carbon atoms), a halogen atom, a hydroxyl group, and a phenylthio group.

$X^-$ represents a non-nucleophilic anion, which is the same as the non-nucleophilic anion $X^-$ in general the general formula (ZI).

As preferred examples of the acid-generating agents, there can further be illustrated compounds represented by the following general formulae (ZIV), (ZV), and (ZVI).

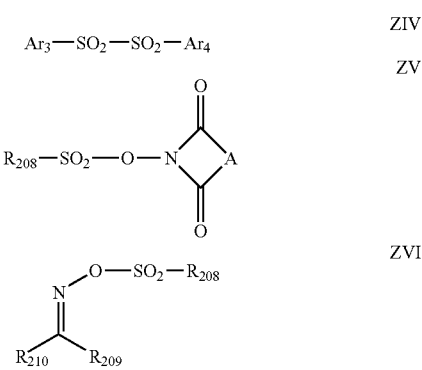

In the general formula (ZIV), $Ar_3$s each independently represents an aryl group.

In the general formulae (ZV) and (ZVI), $R_{208}$ to $R_{210}$ each represents an alkyl group, a cycloalkyl group or an aryl group, and is the same as the alkyl group, cycloalkyl group or aryl group represented by $R_{204}$ to $R_{207}$ in the general formulae (ZI) to (ZIII). Symbol A represents an alkylene group, an alkenylene group or an arylene group.

More preferred of the acid-generating agents are the compounds represented by the general formulae (ZI) to (ZIII).

As the acid-generating agents in the invention, those agents are particularly preferred which have both an anion structure containing fluorine atom-substituted alkyl group containing 4 or less carbon atoms, a fluorine atom-substituted cycloalkyl group or a fluorine atom-substituted aromatic group and a triarylsulfonium cation structure. Preferred examples of such acid-generating agents are those which are represented by the following general formulae (B1) to (B3).

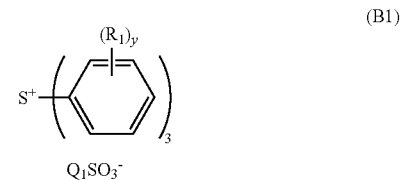

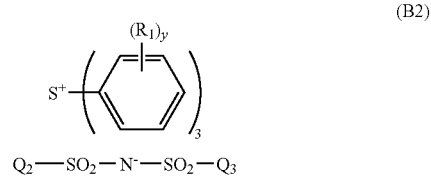

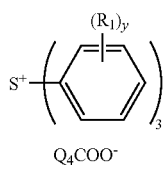

(B3)

In the general formulae (B1) to (B3), $R_1$ represents an alkyl group, an alicyclic hydrocarbon group, a hydroxyl group, a carboxyl group, an alkoxy group or a halogen atom.

y represents an integer of 0 or from 1 to 5. In the case where y represents an integer of 2 or more, two or more $R_1$s may be the same or different.

$Q_1$ to $Q_4$ each independently represents a fluorine atom-substituted alkyl group, a fluorine atom-substituted cycloalkyl group, a fluorine atom-substituted aryl group or a fluorinated alkyl group-substituted aryl group.

In particular, those agents represented by the general formula (B2) wherein $Q_2$ and $Q_3$ are connected to each other to form a ring structure are preferred in view of improving exposure latitude.

As the alkyl group of $R_1$, straight or branched alkyl groups containing from 1 to 15 carbon atoms are preferred, and examples thereof include a methyl group, an ethyl group, a propyl group, a n-butyl group, a sec-butyl group, and a t-butyl group.

As the alicyclic hydrocarbon group of $R_1$, cycloalkyl groups containing from 3 to 15 carbon atoms are preferred, and examples thereof include a cyclopropyl group, a cyclobutyl group, a cyclopentyl group, a cyclohexyl group, a norbornyl group, and an adamantyl group.

Examples of the fluorine atom-substituted alkyl group represented by $Q_1$ to $Q_4$ include —$CF_3$, —$C_2F_5$, -n-$C_3F_7$, —$C_4F_9$, -n-$C_8F_{17}$, —$CF(CF_3)_2$, —$CH(CF_3)_2$, —$(CF_2)_2OCF_2CF_3$, —$(CF_2)_2$—O—$(CH_2)_3CH_3$, —$(CF_2)_2$—O—$(CH_2)_{13}CH_3$, and —$(CF_2)_2O(CF_2)_2(CH_2)_3CH_3$. The fluorine atom-substituted alkyl group represented by $Q_1$ to $Q_4$ may further have a substituent such as an alkoxy group or a fluoroalkoxy group.

Examples of the fluorine atom-substituted aryl group represented by $Q_1$ to $Q_4$ include a 2,3,4,5,6-pentafluorophenyl group, a 2,3,4-trifluorophenyl group, a 2,4-difluorophenyl group, a 4-fluorophenyl group, and a 4-undecanyloxy-2,3,5,6-tetrafluorophenyl group.

Examples of the fluoroinated alkyl group-substituted aryl group represented by $Q_1$ to $Q_4$ include a 3-trifluoromethylphenyl group, a 3,5-bis(trifluoromethyl)phenyl group, a 4-trifluoromethylphenyl group, and a 4-n-nonafluorobutylphenyl group.

Of the acid-generating agents, particularly preferred ones are illustrated below.

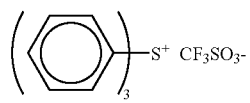

(z1)

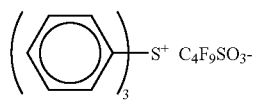

(z2)

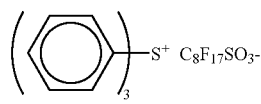

(z3)

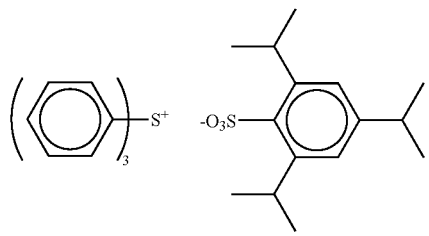

(z4)

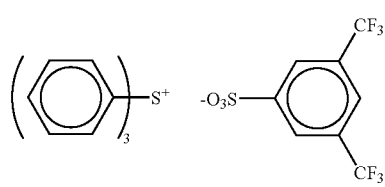

(z5)

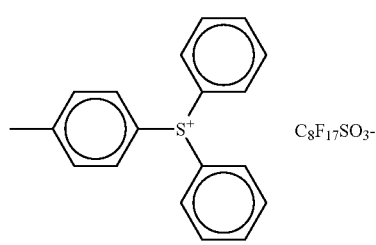

(z6)

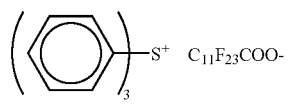

(z7)

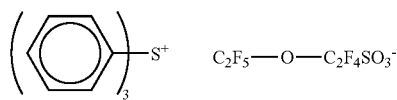

(z8)

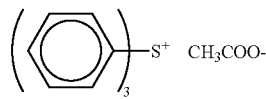

(z9)

-continued
(z10)
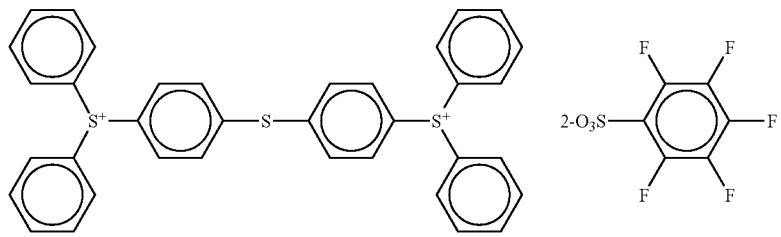
(z11)
(z12)
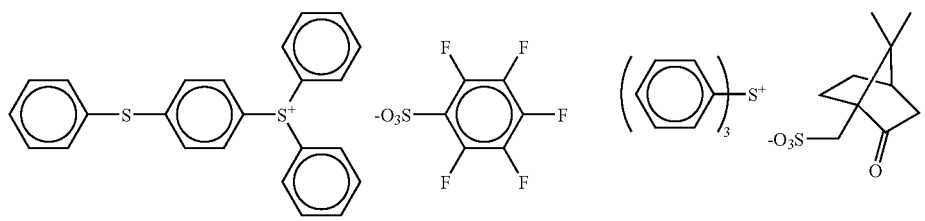
(z13)
(z14)
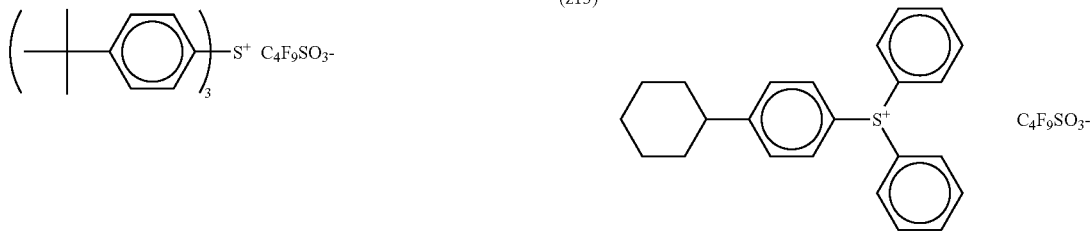
(z15)
(z16)
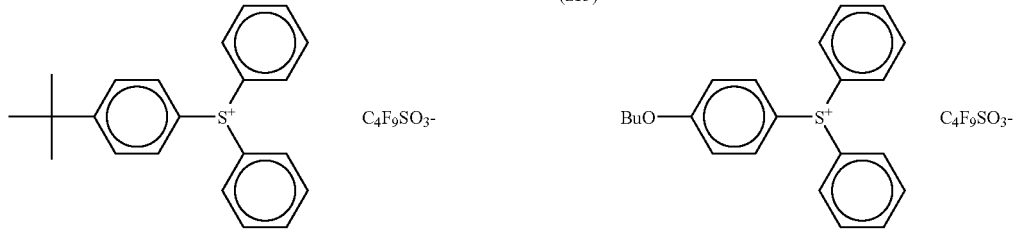
(z17)
(z18)
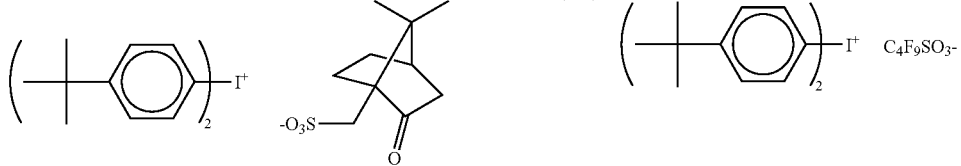
(z19)
(z20)
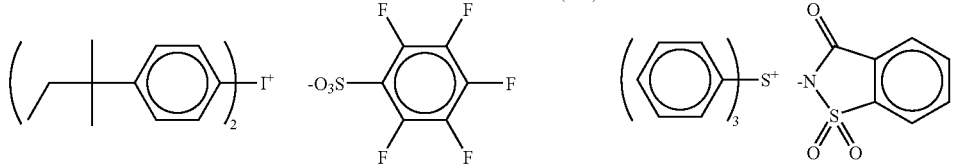
(z21)
(z22)

-continued
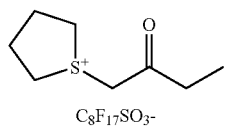
(z23)
(z24)
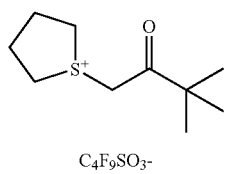
(z25)
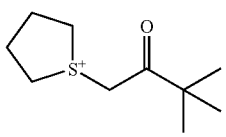
(z26)
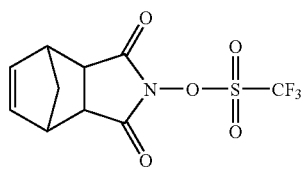
(z27)
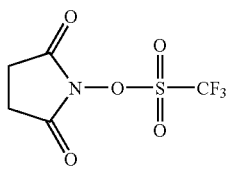
(z28)
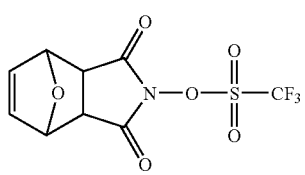
(z29)
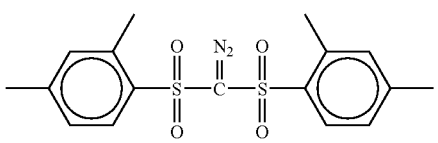
(z30)
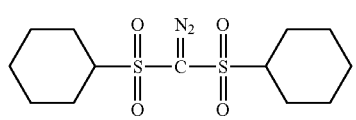
(z31)
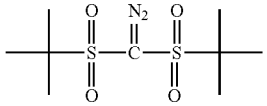
(z32)
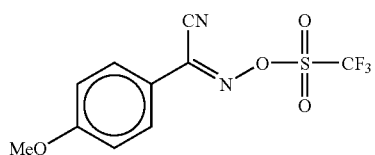
(z33)
(z34)
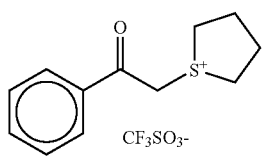
(z35)
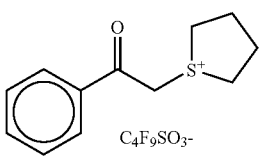
(z36)
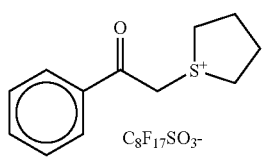
(z37)
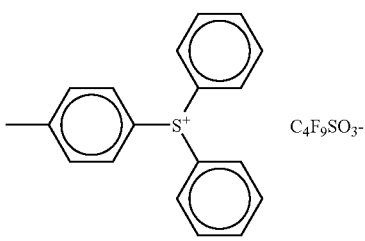
(z38)

-continued
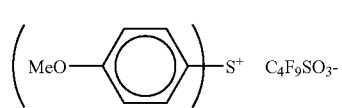
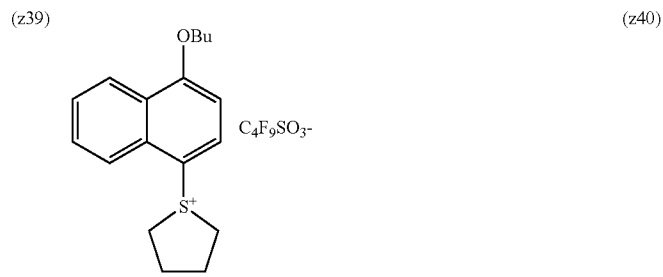
(z39) (z40)
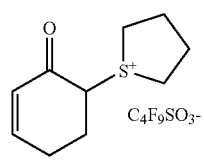
(z41)
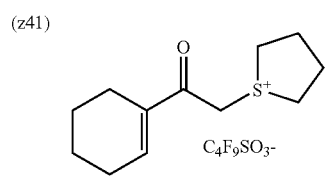
(z42)
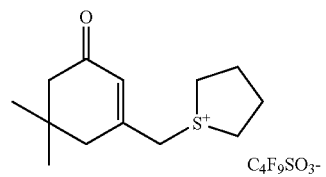
(z43)
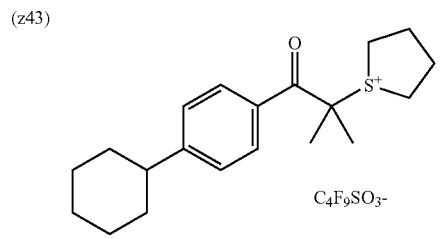
(z44)
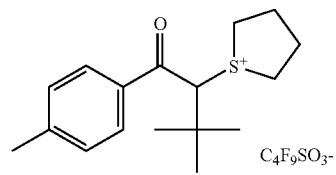
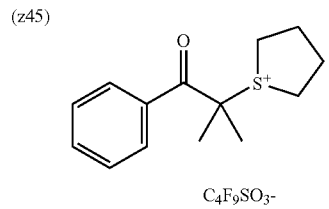
(z45) (z46)
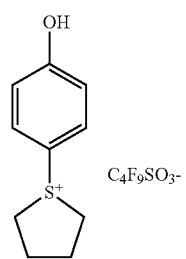
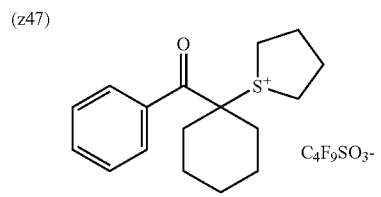
(z47) (z48)
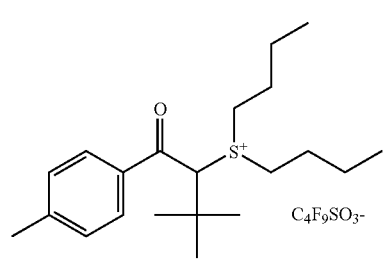
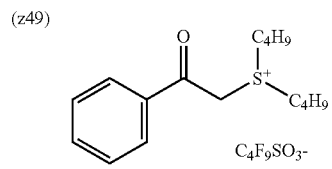
(z49) (z50)
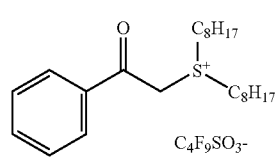
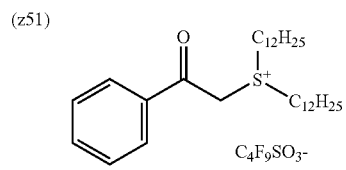
(z51) (z52)

-continued
(z53)
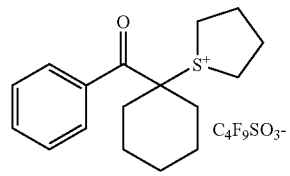
(z54)
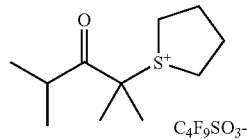
(z55)
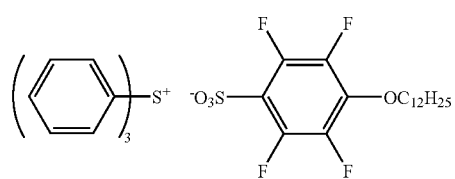
(z56)
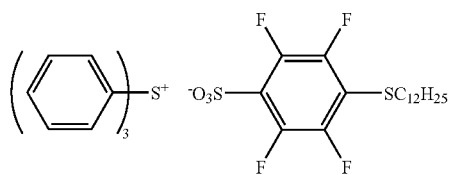
(z57)
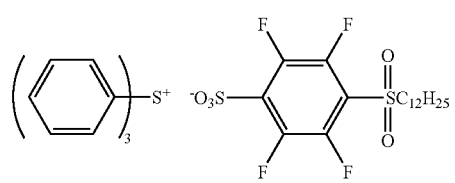
(z58)
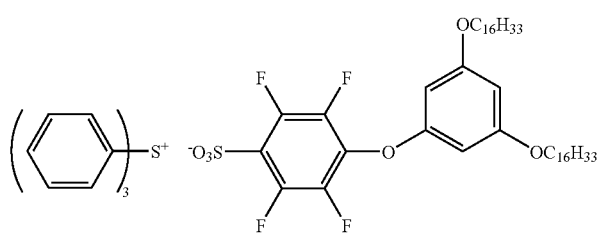
(z59)
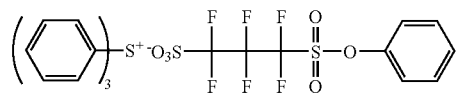
(z60)
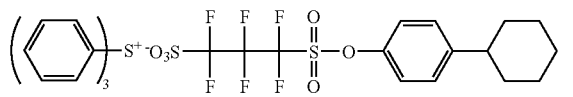
(z61)
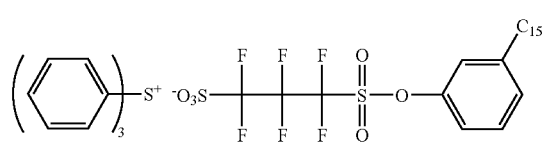
(z62)
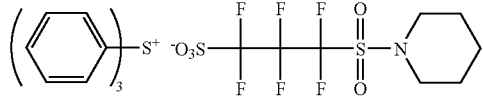
(z63)
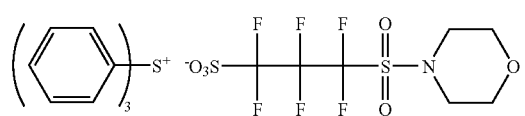
(z64)
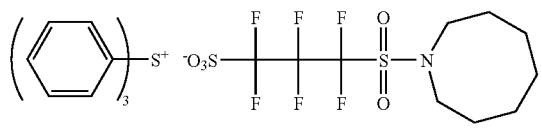
(z65)
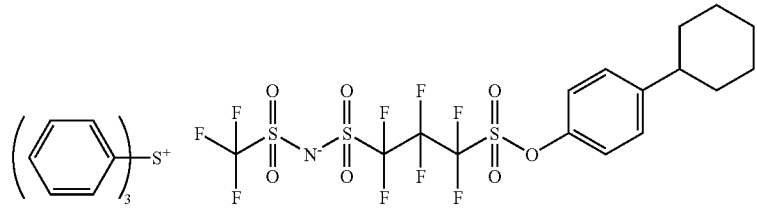
(z66)
(z67)
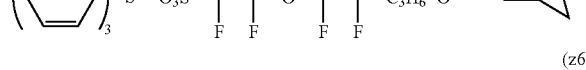
(z68)
(z69)

-continued
(z70) 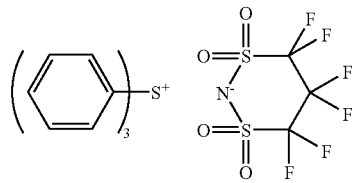
(z71) 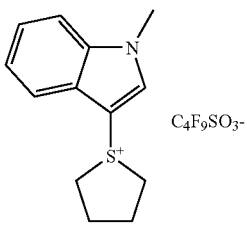
(z72) 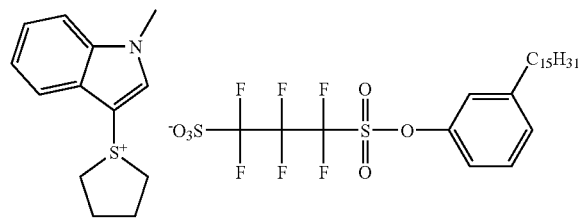
(z73) 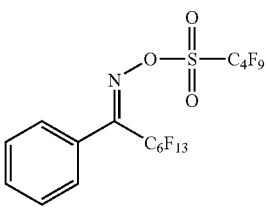
(z74) 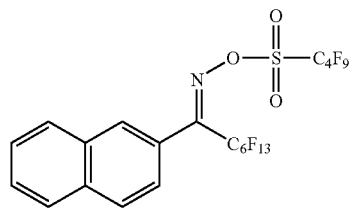
(z75) 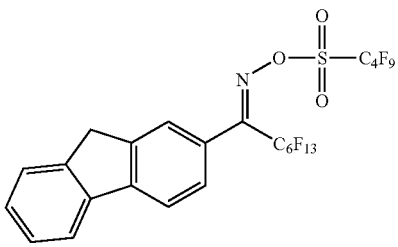
(z76) 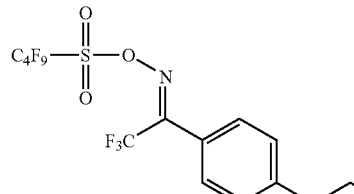
(z77) 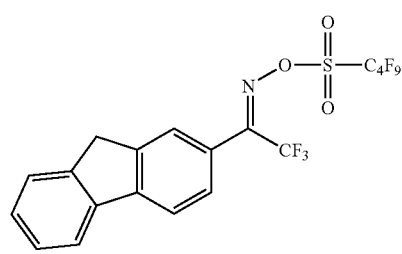
Ba-1 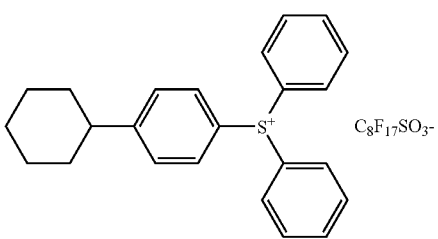
Ba-2 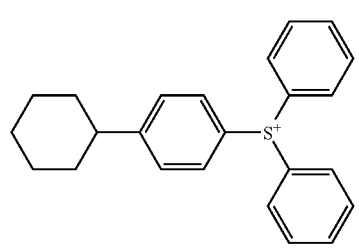
Ba-3 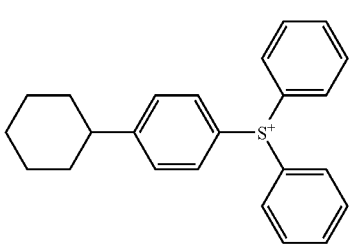
Ba-4 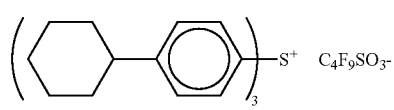
Ba-5

-continued
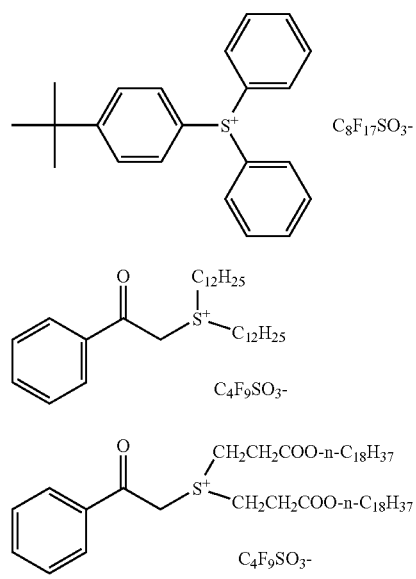
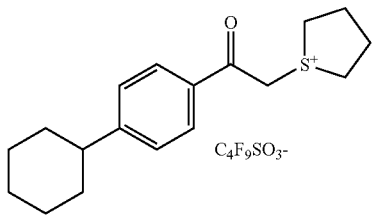
Ba-6
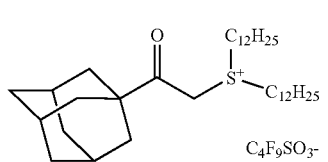
Ba-7
Ba-8 Ba-9
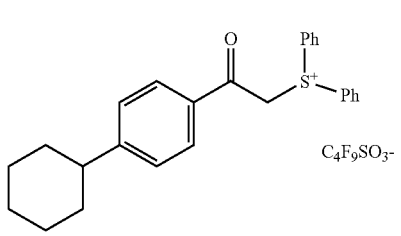
Ba-10 Ba-11
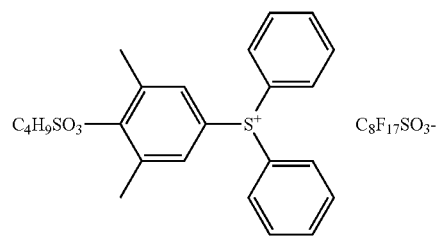
Ba-12
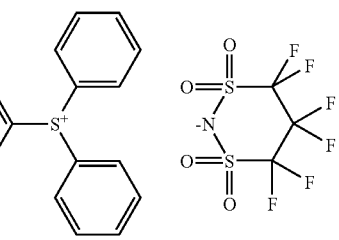
Ba-13
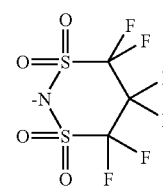
Ba-14
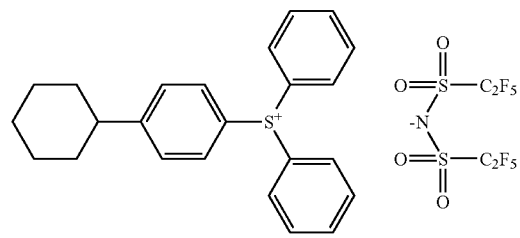
Bb-1
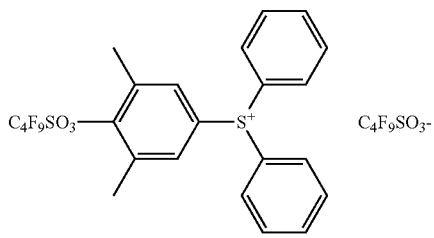
Bb-2 Bb-3
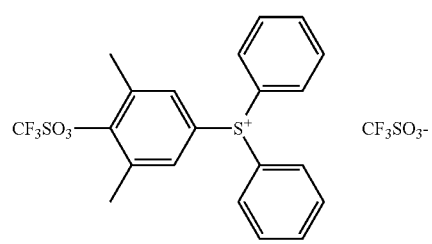
Bb-4 Bb-5
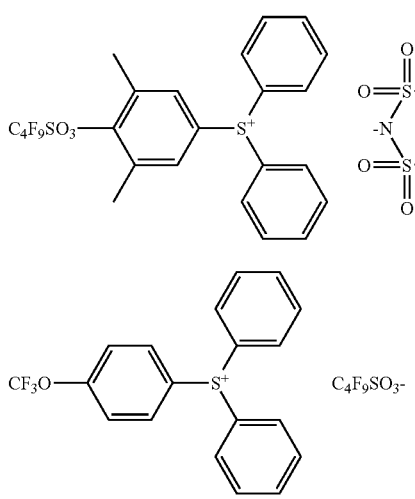

-continued
Bb-6
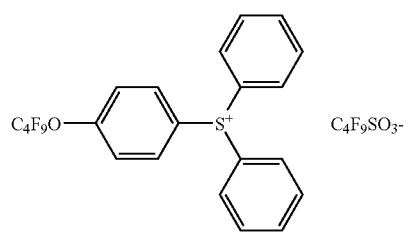
Bb-7
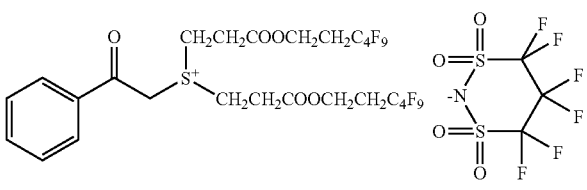
Bb-8
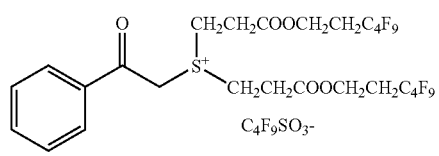
Bc-1
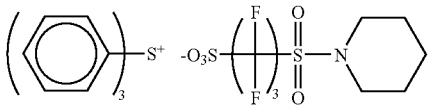
Bc-2
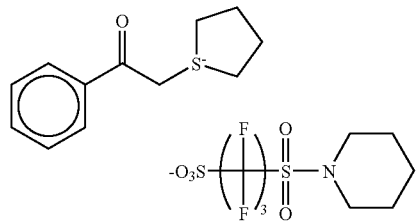
Bc-3
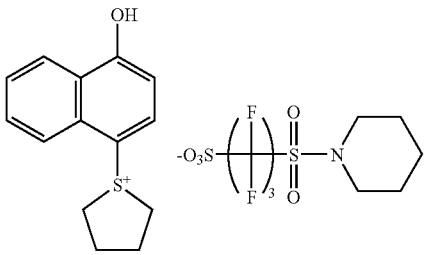
Bc-4
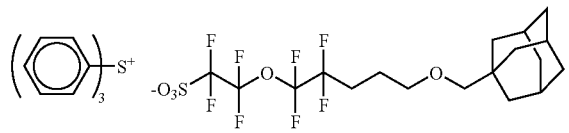
Bc-5
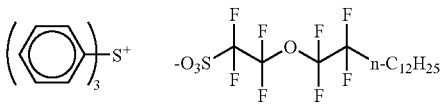
Bc-6
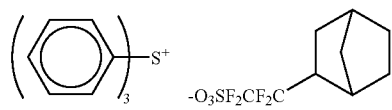
Bc-7
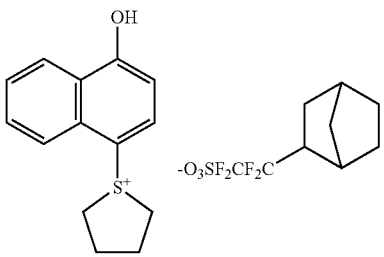
Bc-8
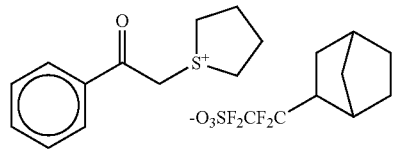
Bc-9
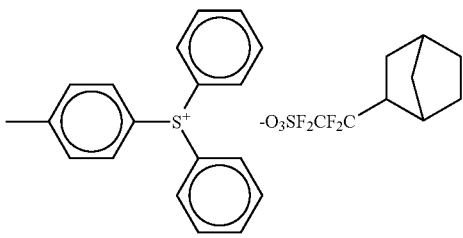
Bc-10
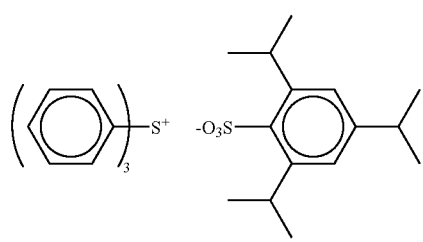
Bc-11
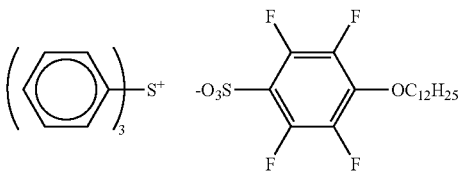

-continued
Bc-12
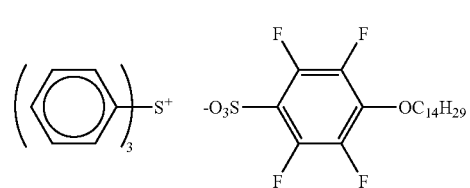
Bc-13
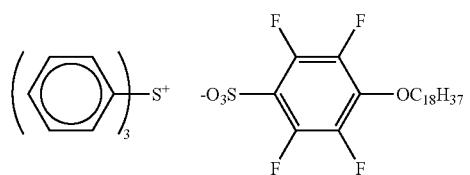
Bc-14
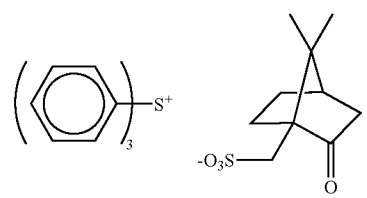
Bc-15
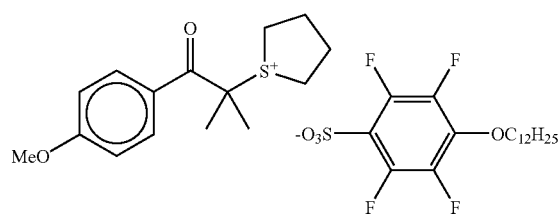
Bc-16
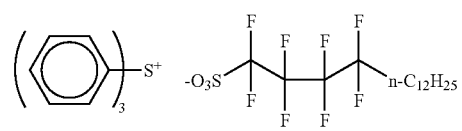
BaBc-1
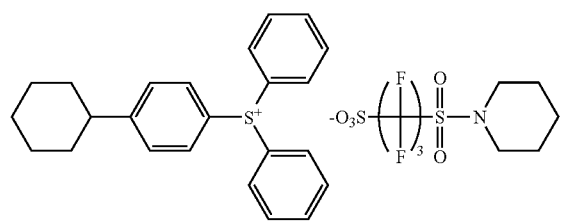
BaBc-2
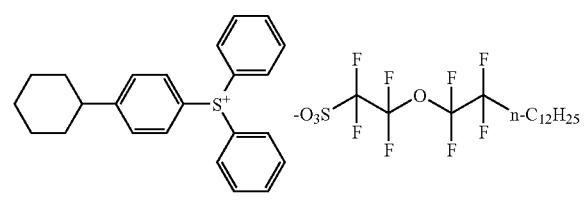
BaBc-3
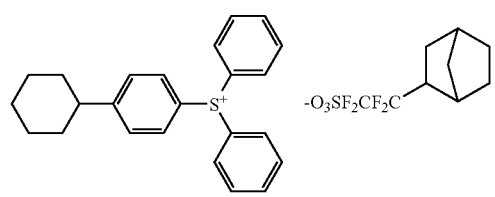
BaBc-4
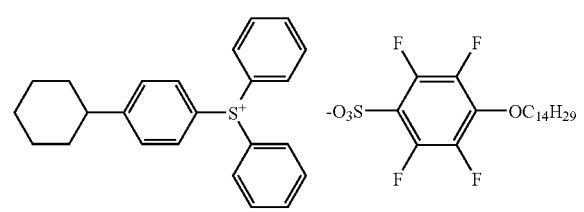
BaBc-5
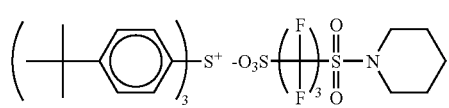
BaBc-6
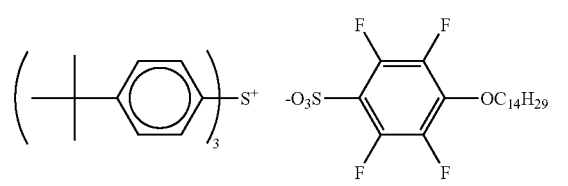
BaBc-7
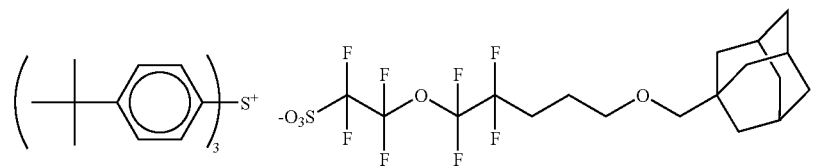

-continued
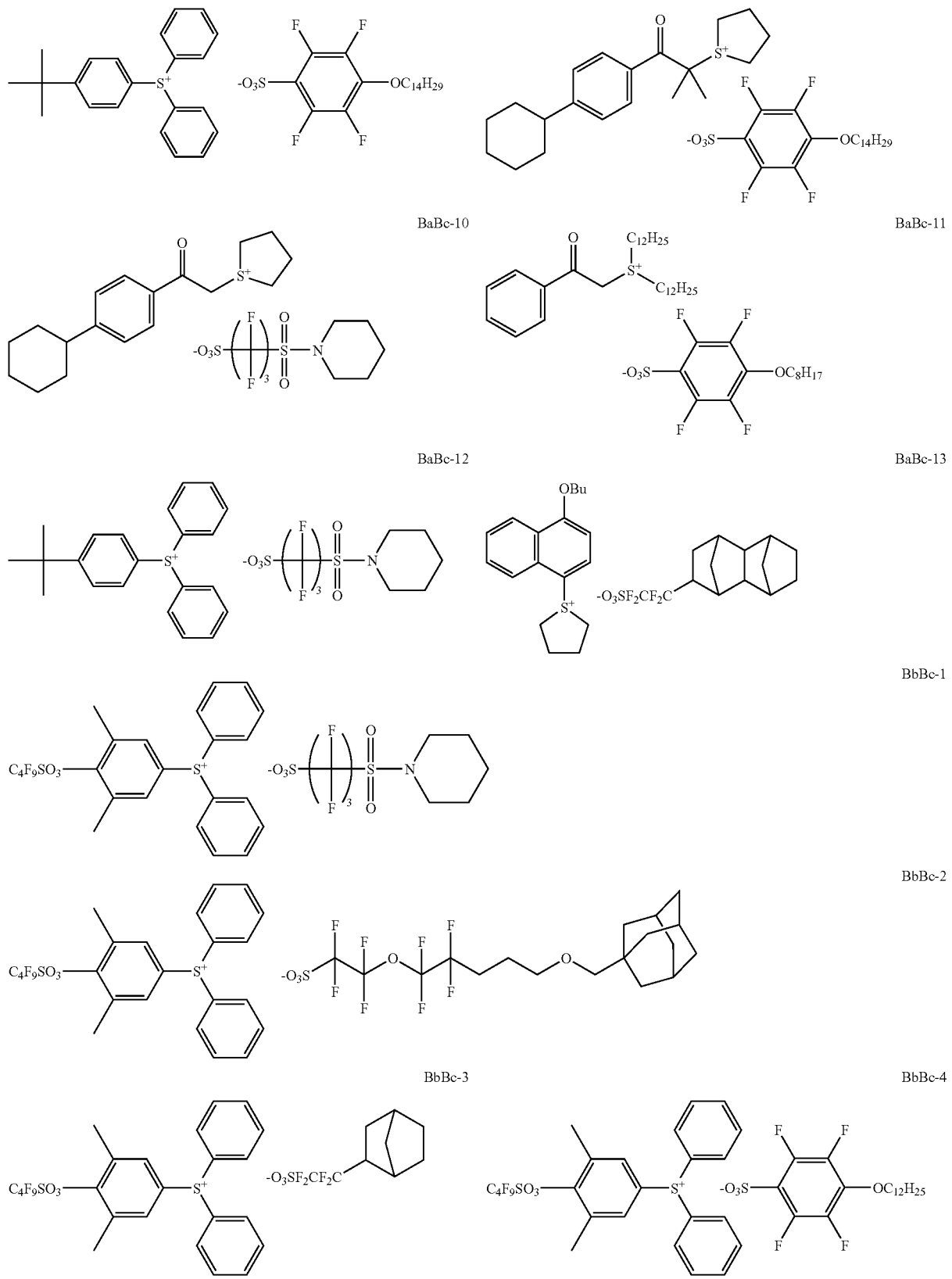

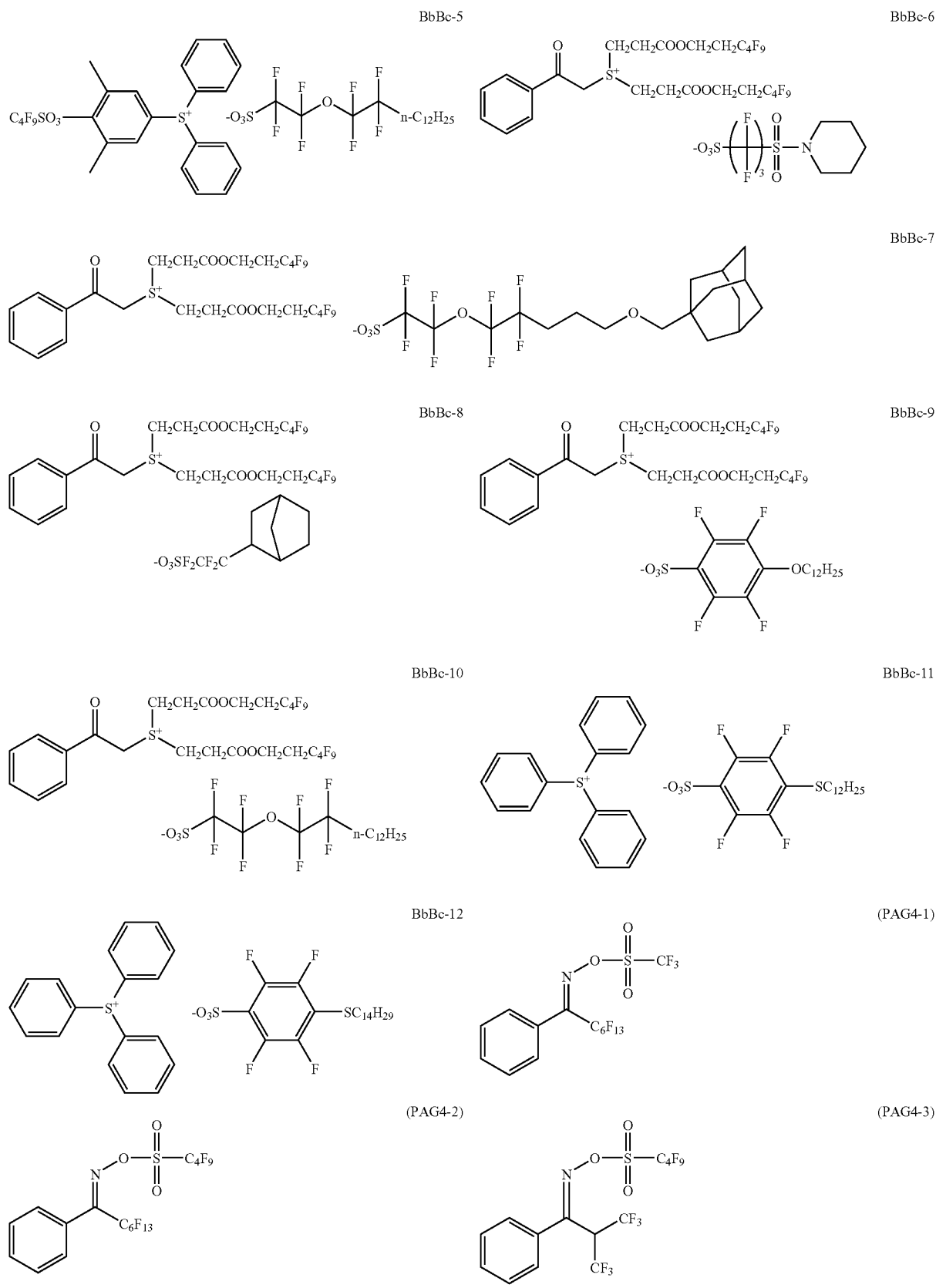

(PAG4-4)
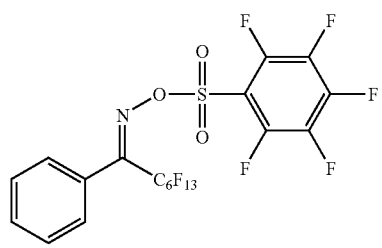
(PAG4-5)
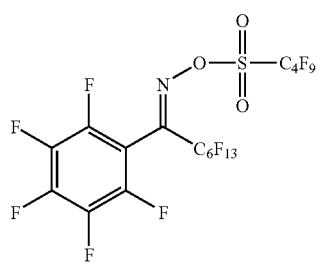
(PAG4-6)
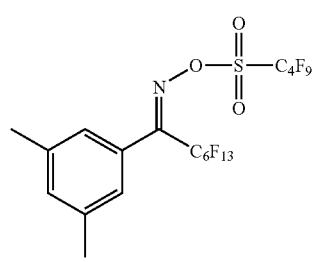
(PAG4-7)
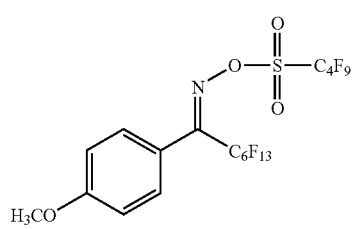
(PAG4-8)
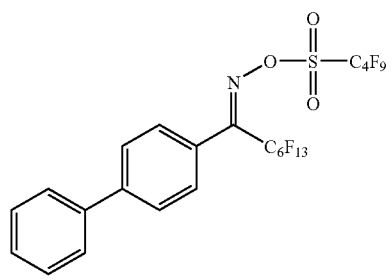
(PAG4-9)
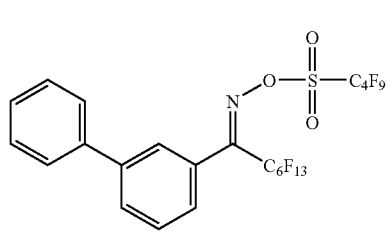
(PAG4-10)
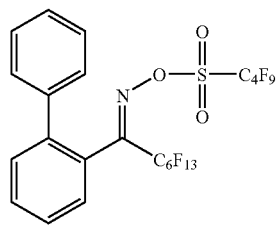
(PAG4-11)
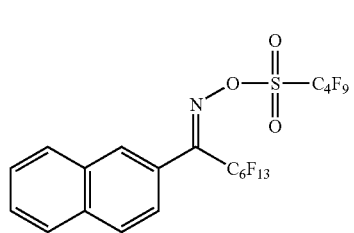
(PAG4-12)
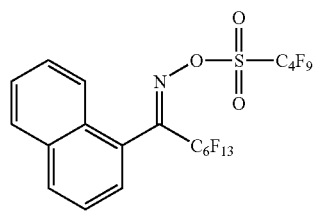
(PAG4-13)
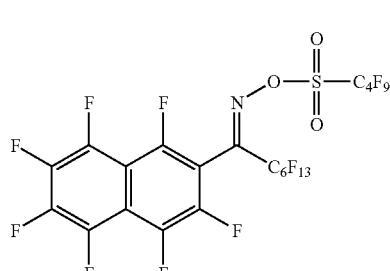
(PAG4-14)
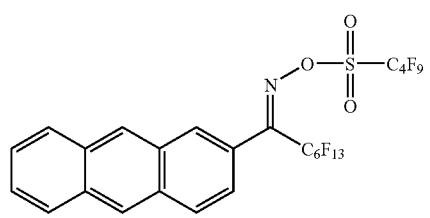
(PAG-15)
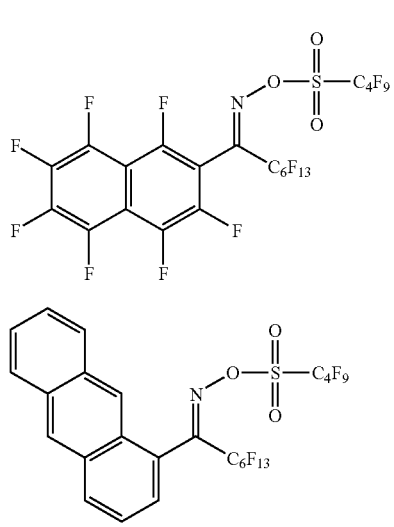

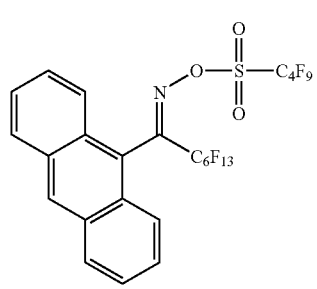 (PAG-16)
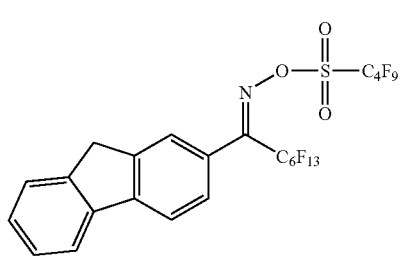 (PAG-17)
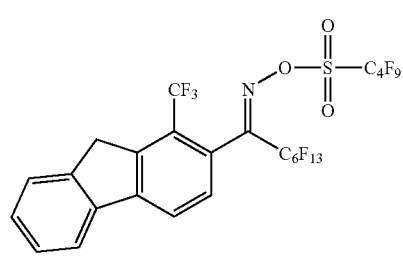 (PAG-18)
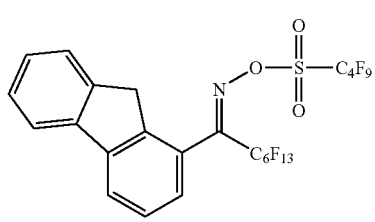 (PAG-19)
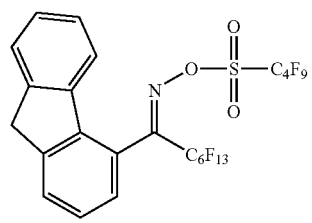 (PAG-20)
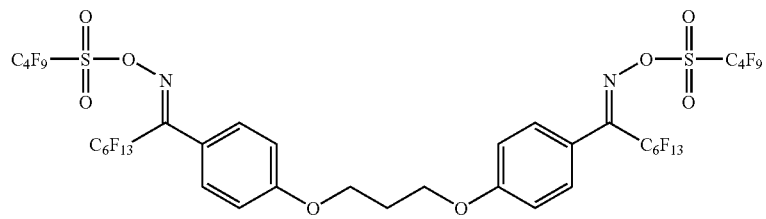 (PAG-21)
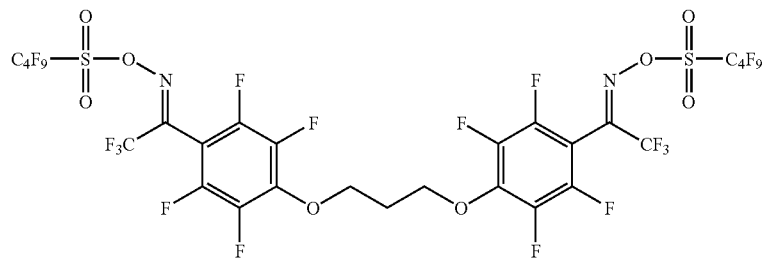 (PAG-22)
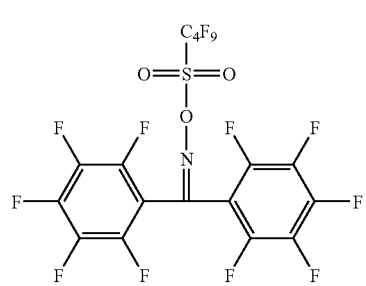 (PAG-23)

The acid-generating agents in the invention may be used alone or in combination of two or more thereof.

The acid-generating agents in the invention preferably comprise from 2 to 5 kinds of acid-generating agents, more preferably 2 kinds of acid-generating agents.

The content of the acid-generating agent in the invention is preferably from 0.1 to 20% by weight, more preferably from 0.5 to 10% by weight, still more preferably from 1 to 7% by weight, based on the weight of all the solid components of the resist composition.

(C) Basic Compound

The resist composition of the invention preferably contains a basic compound. The basic compound is preferably a compound having a stronger basicity than phenol. The molecular weight of the basic compound is usually from 100 to 900, preferably from 150 to 800, more preferably from 200 to 700. Also, a nitrogen-containing basic compound is particularly preferred.

Preferred nitrogen-containing basic compounds are compounds represented by the following formulae (CI) to (CV) as preferred chemical environment. The formulae (CII) to (CV) may be a part of a ring structure.

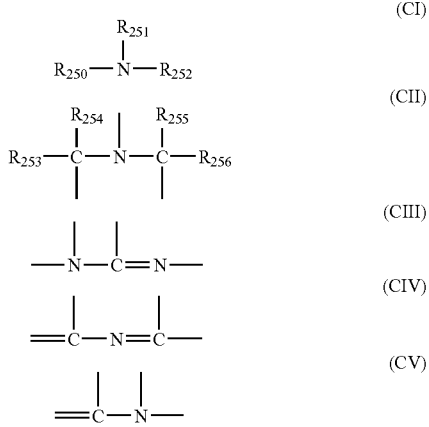

In the above formulae, $R_{250}$, $R_{251}$, and $R_{252}$, which may be the same or different, each represents a hydrogen atom, an alkyl group (containing preferably from 1 to 20 carbon atoms), a cycloalkyl group (containing preferably from 3 to 20 carbon atoms) or an aryl group (containing preferably from 6 to 20 carbon atoms), with $R_{251}$ and $R_{252}$ being optionally connected to each other to form a ring.

The alkyl group may be unsubstituted or substituted and, as an alkyl group having a substituent, an aminoalkyl group containing from 1 to 6 carbon atoms, and a hydroxyalkyl group containing from 1 to 6 carbon atoms are preferred.

$R_{253}$, $R_{254}$, $R_{255}$, and $R_{256}$, which may be the same or different, each represents an alkyl group containing from 1 to 6 carbon atoms.

More preferred compounds are nitrogen-containing basic compounds having within the molecule two or more nitrogen atoms different from each other in chemical environment, and particularly preferred compounds are those compounds which contain both a substituted or unsubstituted amino group and a nitrogen atom-containing ring structure and those compounds which have an alkylamino group.

Further, there can be illustrated at least one kind of nitrogen-containing compound selected from among amine compounds having a phenoxy group, ammonium salt compounds having a phenoxy group, amine compounds having a sulfonic acid ester group, and ammonium salt compounds having a sulfonic acid ester group As the amine compounds, primary, secondary or tertiary amine compounds can be used, with amine compounds wherein at least one alkyl group is connected to the nitrogen atom being preferred. The amine compounds are more preferably tertiary amine compounds. The amine compounds may have, in addition to the alkyl group, a cycloalkyl group (containing preferably from 3 to 20 carbon atoms) or an aryl group (containing preferably from 6 to 12 carbon atoms) connected to the nitrogen atom as long as at least one alkyl group (containing preferably from 1 to 20 carbon atoms) is connected to the nitrogen atom. The amine compounds preferably have an alkyl chain containing an oxygen atom to form an oxyalkylene group. The number of the oxyalkylene group is one or more, preferably from 3 to 9, more preferably from 4 to 6, per molecule. Of the oxyalkylene groups, an oxyethylene group ($-CH_2CH_2O-$) and an oxypropylene group ($-CH(CH_3)CH_2O-$ or $-CH_2CH_2CH_2O-$) are preferred, with an oxyethylene group being more preferred.

As the ammonium salt compounds, primary, secondary, tertiary or quaternary ammonium compounds can be used, with ammonium salt compounds wherein at least one alkyl group is connected to the nitrogen atom being preferred. The ammonium salt compounds may have, in addition to the alkyl group, a cycloalkyl group (containing preferably from 3 to 20 carbon atoms) or an aryl group (containing preferably from 6 to 12 carbon atoms) connected to the nitrogen atom as long as at least one alkyl group (containing preferably from 1 to 20 carbon atoms) is connected to the nitrogen atom. The ammonium salt compounds preferably have an alkyl chain containing an oxygen atom to form an oxyalkylene group. The number of the oxyalkylene group is one or more, preferably from 3 to 9, more preferably from 4 to 6, per molecule. Of the oxyalkylene groups, an oxyethylene group ($-CH_2CH_2O-$) and an oxypropylene group ($-CH(CH_3)CH_2O-$ or $-CH_2CH_2CH_2O-$) are preferred, with an oxyethylene group being more preferred. Examples of anions of the ammonium salt compounds include a halide, a sulfonate, a borate, and a phosphate. Of these, a halide and a sulfonate are preferred. As the halide, chloride, bromide, and iodide are particularly preferred and, as the sulfonate, an organic sulfonate containing from 1 to 20 carbon atoms is particularly preferred. Examples of the organic sulfonate include an alkylsulfonate containing from 1 to 20 carbon atoms and an arylsulfonate. The alkyl group of the alkylsulfonate may have a substituent, and examples of the substituent include a fluorine atom, a chlorine atom, a bromine atom, an alkoxy group, an acyl group, and an aryl group. Specific examples of the alkylsulfonate include methanesulfonate, ethanesulfonate, butanesulfonate, hexanesulfonate, oxtanesulfonate, benzylsulfonate, trifluoromethanesulfonate, pentafluoroethanesulfonate, and nonafluorobutanesulfonate. Examples of the aryl group in the arylsulfonate include a benzene ring, a naphthalene ring, and an anthracene ring. The benzene ring, naphthalene ring, and anthracene ring may have a substituent and, as such substituent, a straight or branched alkyl group containing from 1 to 6 carbon atoms, and a cycloalkyl group containing from 3 to 6 carbon atoms are preferred. Specific examples of the straight or branched alkyl group and the cycloalkyl group include methyl, ethyl, n-propyl, isopropyl, n-butyl, i-butyl, t-butyl, n-hexyl, and cyclohexyl. As other substituents, there can be illustrated an alkoxy group containing from 1 to 6 carbon atoms, a halogen atom, a cyano group, a nitro group, an acyl group, and an acyloxy group.

The amine compounds having a phenoxy group and the ammonium salt compounds having a phenoxy group are those compounds which have a phenoxy group at the opposite end of the alkyl group to the nitrogen atom in the amine compounds or the ammonium compounds. The phenoxy group may have a substituent. Examples of the substituent for the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group, and an aryloxy group. The position of the substituent may be any of 2- to 6-positions. The number of the substituent may be any of from 1 to 5.

It is preferred for at least one oxyalkylene group to exist between the phenoxy group and the nitrogen atom. The number of the oxyalkylene group per molecule is 1 or more, preferably from 3 to 9, more preferably from 4 to 6. Of the oxyalkylene groups, an oxyethylene group (—$CH_2CH_2O$—) and an oxypropylene group (—$CH(CH_3)CH_2O$—) or —$CH_2CH_2CH_2O$—) are preferred, with an oxyethylene group being more preferred.

Additionally, the amine compounds having a phenoxy group can be obtained by heating a primary or secondary amine having a phenoxy group and a haloalkyl ether to react and, after adding thereto an aqueous solution of a strong base such as sodium hydroxide, potassium hydroxide or tetra-alkylammonium, extracting with an organic solvent such as ethyl acetate or chloroform. Alternatively, they can also be obtained by heating a primary or secondary amine and a haloalkyl ether having a phenoxy group at the end to react and, after adding thereto an aqueous solution of a strong base such as sodium hydroxide, potassium hydroxide or tetra-alkylammonium, extracting with an organic solvent such as ethyl acetate or chloroform.

The sulfonic acid ester group in the amine compounds having a sulfonic acid ester and in the ammonium salt compounds having a sulfonic acid ester may be any of an alkylsulfonic acid ester, a cycloalkylsulfonic acid ester, and an arylsulfonic acid ester. With the alkylsuofonic acid ester, the alkyl group contains preferably from 1 to 20 carbon atoms. With the cycloalkyl suofonic acid ester, the cycloalkyl group contains preferably from 3 to 20 carbon atoms and, with the arylsuofonic acid ester, the aryl group contains preferably from 6 to 12 carbon atoms. The alkylsulfonic acid ester, cycloalkylsulfonic acid ester, and arylsulfonic acid ester may have a substituent. As the substituent, a halogen atom, a cyano group, a nitro group, a carboxyl group, a carboxylic acid ester group, and a sulfonic acid ester group are preferred.

It is preferred for at least one oxyalkylene group to exist between the sulfonic acid ester group and the nitrogen atom. The number of the oxyalkylene group per molecule is 1 or more, preferably from 3 to 9, more preferably from 4 to 6. Of the oxyalkylene groups, an oxyethylene group (—$CH_2CH_2O$—) and an oxypropylene group (—$CH(CH_3)CH_2O$—) or —$CH_2CH_2CH_2O$—) are preferred, with an oxyethylene group being more preferred.

Preferred basic compounds include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine, and aminoalkylmorpholine. These may have a substituent, and preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

Particularly preferred basic compounds include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(amiomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine which, however, are not limitative at all.

Also, tetra-alkylammonium salt type, nitrogen-containing basic compounds can be used. Of these compounds, tetra-alkylammonium hydroxides containing from 1 to 8 carbon atoms (e.g., tetramethylammonium hydroxide, tetraethylammonium hydroxide, and tetra-(n-butyl)ammonium hydroxide) are particularly preferred. These nitrogen-containing basic compounds are used alone or in combination of two or more thereof.

The ratio of the acid generating agent to the basic compound to be used in the composition, basic compound/acid generating agent (molar ratio), is preferably from 0.01 to 10. That is, in view of sensitivity and resolution, the molar ratio is preferably 10 or less and, in view of suppressing reduction of resolution due to thickening of resist pattern lines with the lapse of time from exposure to heat treatment, the molar ratio is preferably 0.01 or more. The ratio of the organic basic compound/acid generating agent (molar ratio) is more preferably from 0.05 to 5, still more preferably from 0.1 to 3.

Surfactant

The resist composition of the invention preferably contains a surfactant, more preferably any one of or two or more of fluorine-containing and/or silicone surfactants (fluorine-containing surfactants, silicone surfactants, and surfactants containing both fluorine atoms and silicon atoms).

The resist composition of the invention containing the fluorine-containing and/or silicone surfactant can show good sensitivity and resolution when irradiated with an exposure light having a wavelength of 250 nm or shorter, particularly 220 nm or shorter, and can give a resist pattern having satisfactory adhesion and less development defects.

Examples of these fluorine-containing and/or silicone surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511, and 5,824,451. It is also possible to use the following commercially available surfactants as they are.

Examples of usable commercially available surfactants include fluorine-containing surfactants or silicone surfactants such as F-Top EF301 and EF303 (manufactured by New Akita Chemical Company), Fluorad FC430, 431, and 4430 (manufactured by Sumitomo 3M Ltd.), Megafac F171, F173, F176, F189, F113, F110, F177, F120, and R08 (manufactured by Dainippon Ink & Chemicals, Inc.), Surflon S-382 and SC101, 102, 103, 104, 105, and 106 (manufactured by Asahi Glass Co., Ltd.), Troysol S-366 (manufactured by Troy Chemical Co., Ltd.), GF-300 and GF-150 (manufactured by Toagosei Co., Ltd.), Surflon S-393 (manufactured by Seimi Chemical Co., Ltd.), F-Top EF121, EF122A, EF122B, RF122C, EF125M, EF135M, EF351, 352, EF801, EF802, and EF601 (manufactured by JEMCO), PF636, PF656, PF6320, and PF6520 (manufactured by OMNOVA), and FTX-204D, 208G, 218G, 230G, 204D, 208D, 212D, 218, and 222D (manufactured by Neos Co., Ltd.). Polysiloxane polymer KP-341 (manufactured by Shin-Etsu Chemical Co., Ltd.) can also be used as a silicone surfactant.

Also usable besides the known surfactants shown above is a surfactant comprising a polymer having a fluoroaliphatic group and derived from a fluoroaliphatic compound produced by the telomerization method (also called telomer method) or oligomerization method (also called oligomer method). The fluoroaliphatic compound can be synthesized by the method described in JP-A-2002-90991.

The polymer having a fluoroaliphatic group preferably is a copolymer of a monomer having a fluoroaliphatic group with a poly(oxyalkylene) acrylate and/or a poly(oxyalkylene) methacrylate. This copolymer may be one in which the monomer units are randomly distributed or may be a block copolymer. Examples of the poly(oxyalkylene) group include a poly(oxyethylene) group, a poly(oxypropylene) group, and a poly(oxybutylene) group. The poly(oxyalkylene) group may be a unit having, in the same chain, alkylenes having different chain lengths, such as a poly(blocks of oxyethylene, oxypropylene, and oxyethylene) or a poly(blocks of oxyethylene and oxypropylene) group. Further, the copolymer of a monomer having a fluoroaliphatic group with a poly(oxyalkylene) acrylate (or methacrylate) is not limited to binary copolymers, and may be a copolymer of three or more monomers which is obtained by copolymerization in which two or more different monomers each having a fluoroaliphatic group, two or more different poly(oxyalkylene) acrylates (or methacrylates), etc. are simultaneously copolymerized.

Examples of commercially available surfactants include Megafac F178, F-470, F-473, F-475, F-476, and F-472 (manufactured by Dainippon Ink & Chemicals, Inc.). Further, there can be illustrated a copolymer of an acrylate (or methacrylate) having a $C_6F_{13}$ group with a poly(oxyalkylene) acrylate (or methacrylate), a copolymer of an acrylate (or methacrylate) having a $C_6F_{13}$ group with a poly(oxyethylene) acrylate (or methacrylate) and a poly(oxypropylene) acrylate (or methacrylate), a copolymer of an acrylate (or methacrylate) having a $C_8F_{17}$ group with a poly(oxyalkylene) acrylate (or methacrylate), and a copolymer of an acrylate (or methacrylate) having a $C_8F_{17}$ group with a poly(oxyethylene) acrylate (or methacrylate) and a poly(oxypropylene) acrylate (or methacrylate).

Also, in the invention, other surfactants than the fluorine-containing and/or silicone surfactants can be used. Specific examples thereof include nonionic surfactants such as polyoxyethylene alkyl ethers (e.g., polyoxyethylene lauryl ether, polyoxyethylene stearyl ether, polyoxyethylene cetyl ether, and polyoxyethylene oleyl ether), polyoxyethylene alkylaryl ethers (e.g., polyoxyethylene octylphenyl ether and polyoxyethylene nonylphenyl ether), polyoxyethylene.polyoxypropylene block copolymers, sorbitan fatty acid esters (e.g., sorbitan monolaurate, sorbitan monopalmitate, sorbitan monostearate, sorbitan monooleate, sorbitan trioleate, and sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate).

The surfactants may be used alone or in combination of two or more thereof.

The amount of the surfactant to be used is preferably from 0.0001 to 2% by weight, more preferably from 0.001 to 1% by weight, based on the total amount of the positive resist composition (excluding the solvent).

Dissolution inhibiting compound of 3,000 or less in molecular weight capable of decomposing by action of an acid to undergo an increase in its solubility in an alkali developer As the dissolution inhibiting compound of 3,000 or less in molecular weight capable of decomposing by action of an acid to undergo an increase in its solubility in an alkali developer (hereinafter also referred to as "dissolution inhibiting compound"), an alicyclic or aliphatic compound having an acid-decomposable group, such as a cholic acid derivative described in *Proceeding of SPIE*, 2724, 355 (1996) is preferred in order to prevent reduction in the transmittance at 220 nm or less. Examples of the acid-decomposable group and the alicyclic structure include the same ones as has been described hereinbefore for the alicyclic hydrocarbon series acid-decomposable resin.

In the case where the resist composition of the invention is exposed with a KrF excimer laser or irradiated with electron beams, the dissolution inhibiting compound preferably contains a structure wherein a phenolic hydroxyl group of a phenol compound is displaced with an acid-decomposable group. The phenol compound preferably contains from 1 to 9 phenol skeletons, more preferably from 2 to 6 phenol skeletons.

The molecular weight of the dissolution inhibiting compound for use in the invention is 3,000 or less, preferably from 300 to 3,000, more preferably from 500 to 2,500.

The addition amount of the dissolution inhibiting compound is preferably from 3 to 50% by weight, more preferably from 5 to 40% by weight, based on the entire solid content of the resist composition.

Specific examples of the dissolution inhibiting compound are shown below which, however, are not construed to limit the invention in any way.

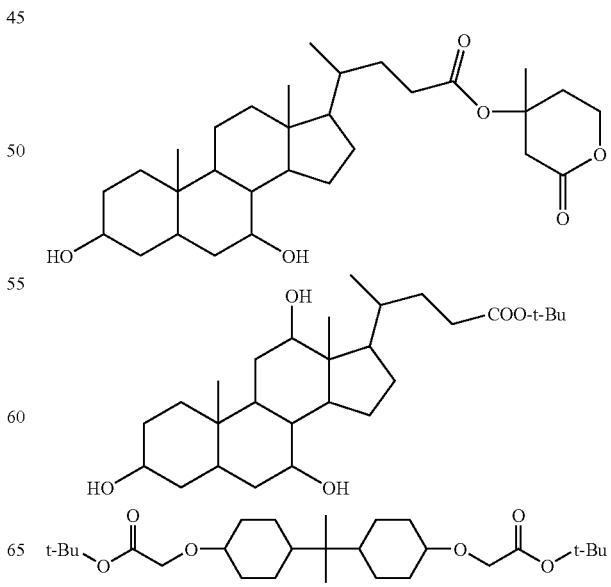

-continued

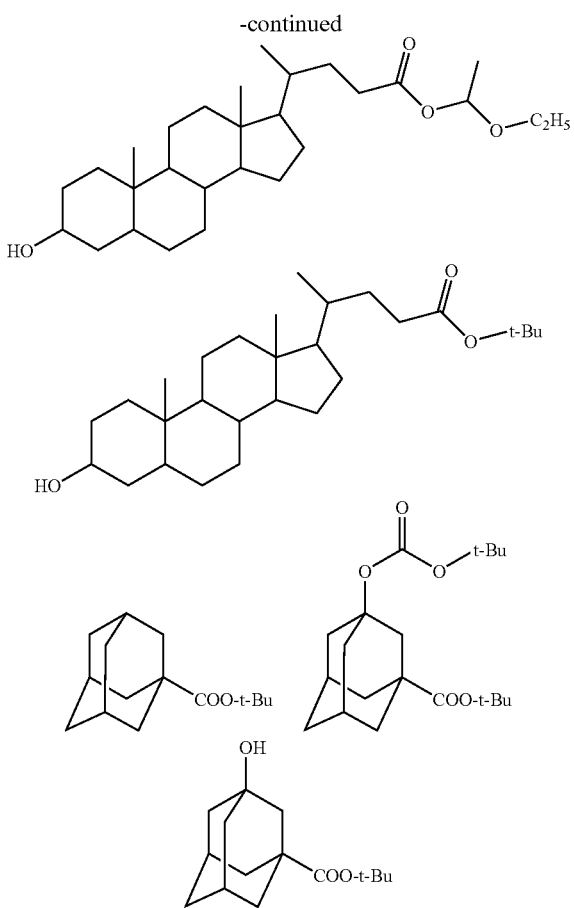

Solvent

The resist composition of the invention is used by dissolving individual components in a predetermined solvent. Examples of the solvent which can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone, and tetrahydrofuran.

In the invention, these solvents may be used alone or as a mixture thereof. However, it is preferred to use a mixed solvent containing two or more solvents different from each other in their functional groups. As a mixed solvent containing two or more solvents different from each other in their functional groups, a mixed solvent comprising a mixture of a solvent having a hydroxyl group in the structure thereof and a solvent not having a hydroxyl group in the structure thereof and a mixed solvent comprising a mixture of a solvent having an ester structure and a solvent having a ketone structure are preferably used. Such solvents can reduce generation of particles during storage of the resist solution.

Examples of the solvent having a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate. Of these, propylene glycol monomethyl ether and ethyl lactate are more preferred.

Examples of the solvent not having a hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethylsulfoxide. Of these, propylene glycol monomethyl ether acetate, ethyl ethoxypropionate, 2-heptanone, γ-butyrolactone, cyclohexanone, and butyl acetate are more preferred, and propylene glycol monomethyl ether acetate, ethyl ethoxypropionate, 2-heptanone, and cyclohexanone are particularly preferred.

The mixing ratio (by weight) of the solvent having a hydroxyl group to the solvent not having a hydroxyl group is usually from 1/99 to 99/1, preferably from 10/90 to 90/10, more preferably from 20/80 to 60/40. Mixed solvents containing the solvent not having a hydroxyl group in a content of 50% by weight or more is preferred in view of coating uniformity.

Regarding the mixed solvent comprising a mixture of the solvent having an ester structure and the solvent having a ketone structure, examples of the solvent having a ketone structure include cyclohexanone and 2-heptanone, with cyclohexanone being preferred. Examples of the solvent having an ester structure include propylene glycol monomethyl ether acetate, ethyl ethoxypropionate, γ-butyrolactone, and butyl acetate, with propylene glycol monomethyl ether acetate being preferred.

The mixing ratio (by weight) of the solvent having an ester structure to the solvent having a ketone structure is usually from 1/99 to 99/1, preferably from 10/90 to 90/10, more preferably from 20/80 to 60/40. Mixed solvents containing the solvent having an ester structure in a content of 50% by weight or more is particularly preferred in view of coating uniformity.

<Other Additives>

In the resist composition of the invention may further be incorporated, as needed, dyes, light-absorbing agents, plasticizers, surfactants other than the aforesaid fluorine-containing and/or silicone surfactants, and photo-sensitizers.

As the plasticizers, any compound of 1,000 or less in molecular weight that is compatible with polymers to be used and able to reduce the softening point of the film may be used with no particular limitations in addition to commercially available plasticizers. In view of compatibility, the molecular weight is preferably 750 or less, more preferably 500 or less. Compounds having a boiling point at ordinary temperature of 300° C. or higher and a melting point of 20° C. or lower are preferred. Specific examples thereof include diisobutyl phthalate, tricresyl phosphate, triethylene glycol diphenyl ether, diethylene glycol dibenzoate, and triethylene glycol diacetate.

As the light-absorbing agents, any compound that has an absorption at exposure wavelength and does not generate an acid upon exposure may be used with no particular limitations. In the case where the wavelength of a light source is 193 nm, compounds containing an aromatic ring are preferred. Specific examples thereof include benzene derivatives, naphthalene derivatives, anthracene derivatives, furan derivatives, thiophene derivatives, and indole derivatives.

In the case of exposing the resist film comprising the resist composition of the invention through an immersion medium, a hydrophobic resin (HR) may further be added to the composition as needed. The hydrophobic resin (HR) added is localized over a resist film surface layer. Thus, when the immersion medium is water, a backward contact angle of the resist film surface is improved so that the followability of immersion water may be improved. Any hydrophobic resin (HR) can be used as long as it can improve a backward contact angle over the film surface. However, the resin preferably contains at least one of a fluorine atom and a silicon atom. The backward contact angle of a resist film is preferably from 60° to 90°, more preferably 70° or more. The amount of the hydrophobic resin to be added can be properly controlled so that the backward contact angle of a resist film may fall within the foregoing range. The amount of the resin is preferably from 0.1 to 10% by weight, more preferably from 0.1 to 5% by weight, based on the weight of the total solid components of the resist composition. The hydrophobic resin (HR) is localized in the interface as described above. However, as is different from a surfactant, it does not necessarily have a hydrophilic group within the molecule and is not required to contribute to uniform mixing of polar/non-polar materials.

A fluorine atom or a silicon atom in the hydrophobic resin (HR) may be present either in the main chain or in the side chain by substitution.

The hydrophobic resin (HR) is preferably a resin wherein its partial structure containing a fluorine atom is an alkyl group having a fluorine atom, a cycloalkyl group having a fluorine atom or an aryl group having a fluorine atom.

The alkyl group having a fluorine atom (containing preferably from 1 to 10 carbon atoms, more preferably from 1 to 4 carbon atoms) is a straight or branched alkyl group wherein at least one hydrogen atom is replaced by a fluorine atom, and may further have other substituents.

The cycloalkyl group having a fluorine atom is a monocyclic or polycyclic alkyl group wherein at least one hydrogen atom is replaced by a fluorine atom, and may further have other substituents.

Examples of the aryl group having a fluorine atom include aryl groups such as a phenyl group and a naphthyl group wherein at least one hydrogen atom is replaced by a fluorine atom. The aryl group may further have other substituents.

As the alkyl group having a fluorine atom, the cycloalkyl group having a fluorine atom, or the aryl group having a fluorine atom, preferred ones are those which are represented by the following general formulae (Fa2) to (Fa4) which, however, are not to be construed to limit the invention in any way.

$R_{61}$, $R_{62}$ to $R_{64}$, or $R_{65}$ to $R_{68}$ represents a fluorine atom or an alkyl group (containing preferably from 1 to 4 carbon atoms) wherein at least one hydrogen atom is replaced by a fluorine atom. It is preferred that all of $R_{57}$ to $R_{61}$ and all of $R_{65}$ to $R_{67}$ are fluorine atoms. $R_{62}$, $R_{63}$, and $R_{68}$ each is preferably an alkyl group (containing preferably from 1 to 4 carbon atoms) wherein at least one hydrogen atom is replaced by a fluorine atom, more preferably a perfluoroalkyl group containing from 1 to 4 carbon atoms. $R_{62}$ and $R_{63}$ may be connected to each other to form a ring.

Specific examples of the group represented by the general formula (Fa2) include a p-fluorophenyl group, a pentafluorophenyl group, and a 3,5-di(trifluoromethyl)phenyl group.

Specific examples of the group represented by the general formula (Fa3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Of these, a hexafluoroisopropyl group, a heptafluoroisopropyl group, a hexafluoro(2-methyl)isopropyl group, an octafluoroisopropyl group, a nonafluoro-t-butyl group, and a perfluoroisopentyl group are preferred, with a hexafluoroisopropyl group and a heptafluoroisopropyl group being more preferred.

Specific examples of the group represented by the general formula (Fa4) include —C(CF$_3$)$_2$OH, —C(C$_2$F$_5$)$_2$OH, —C(CF$_3$)(CH$_3$)OH, and —CH(CF$_3$)OH, with —C(CF$_3$)$_2$OH being preferred.

Specific examples of a repeating unit containing a fluorine atom will be shown hereinafter which, however, are not to be construed to limit the invention in any way.

In the specific examples, $X_1$ represents a hydrogen atom, —CH$_3$, —F or —CF$_3$, and $X_2$ represents —F or CF$_3$.

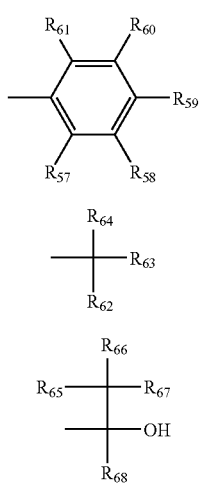

(Fa2)

(Fa3)

(Fa4)

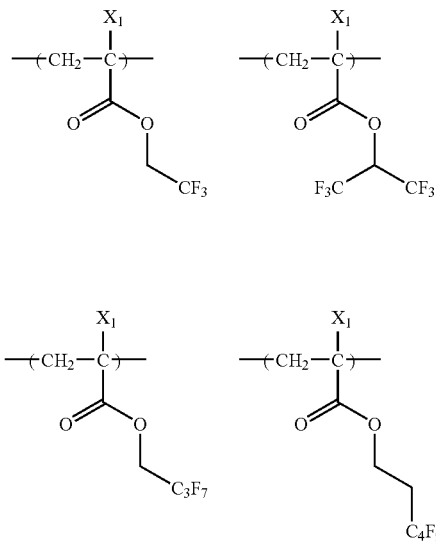

In the following general formulae (Fa2) to (Fa4), $R_{57}$ to $R_{68}$ each independently represents a hydrogen atom, a fluorine atom or an alkyl group, provided that at least one of $R_{57}$ to -continued

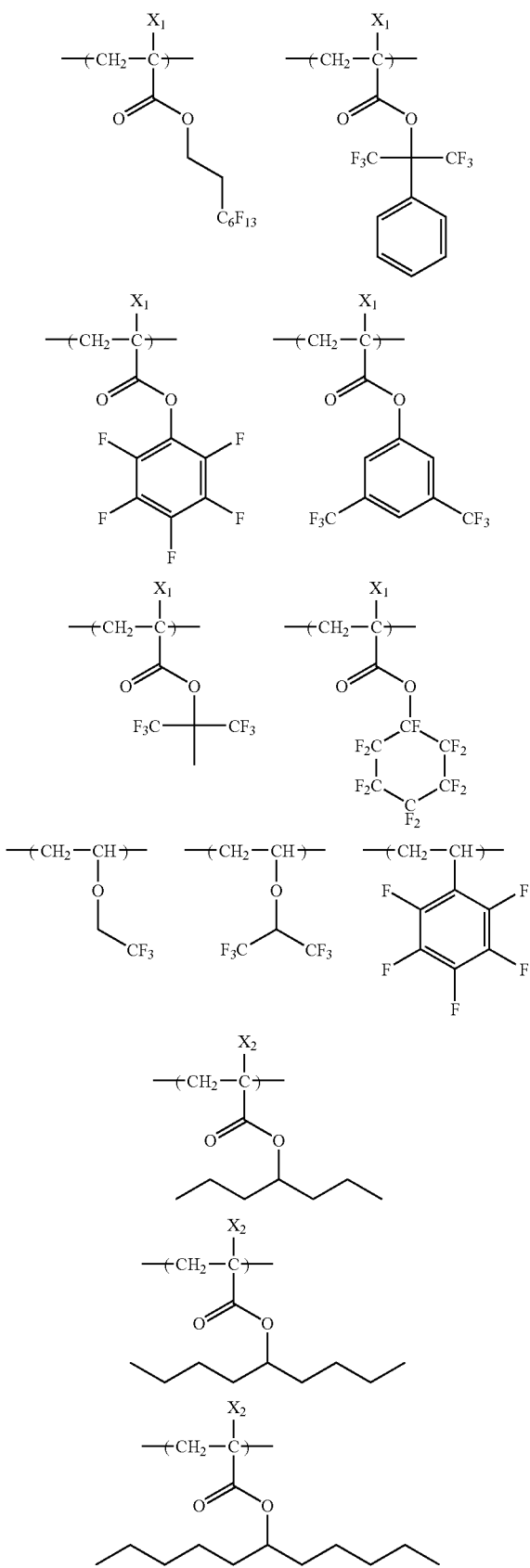

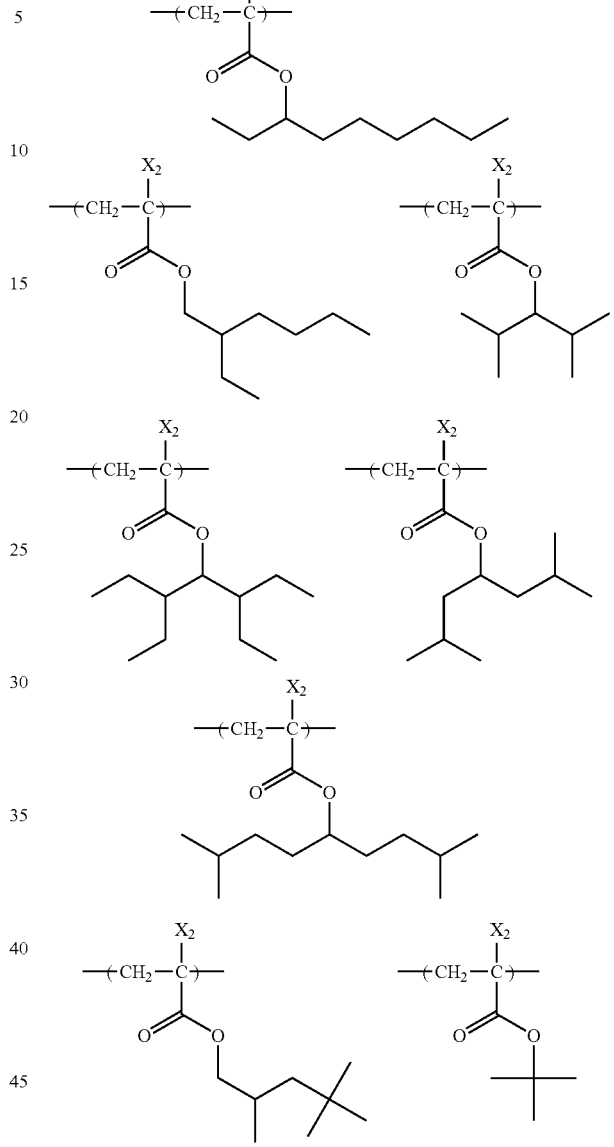

The hydrophobic resin (HR) is preferably a resin having, as a partial structure having at least one silicon atom, an alkylsilyl structure (preferably trialkylsilyl group) or a cyclic siloxane structure.

Specific examples of the alkylsilyl structure or the cyclic siloxane structure include those groups which are represented by the following formulae (CS-1) to (CS-3).

(CS-1)

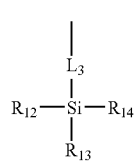

-continued (CS-2)

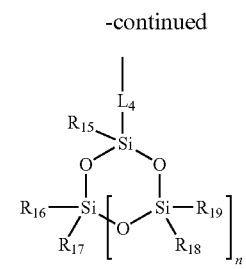

(CS-3)

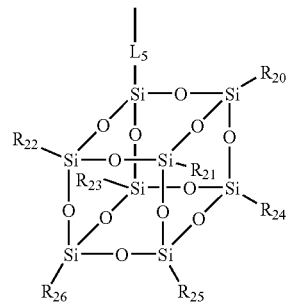

In the formulae (CS-1) to (CS-3), $R_{12}$ to $R_{26}$ each independently represents a straight or branched alkyl group (containing preferably from 1 to 20 carbon atoms) or a cycloalkyl group (containing preferably from 3 to 20 carbon atoms).

$L_3$ to $L_5$ each represents a single bond or a divalent linking group. As the divalent linking group, there are illustrated ones selected from the group consisting of an alkylene group, a phenyl group, an ether group, a thioether group, a carbonyl group, an ester group, an amido group, a urethane group, and a urea group, and combinations of two or more thereof.

n represents an integer of 1 to 5.

Specific examples of the repeating unit having at least one silicon atom are shown below which, however, are not to be construed to limit the invention in any way.

In the specific examples, $X_1$ represents a hydrogen atom, —$CH_3$, —F or —$CF_3$.

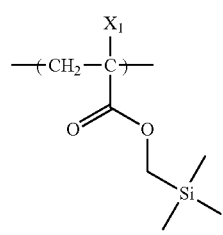 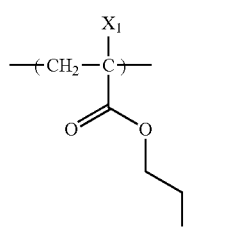

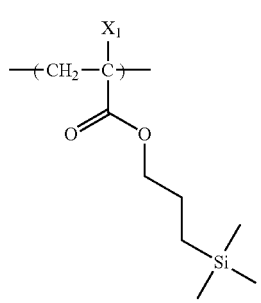 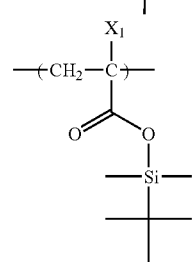

-continued

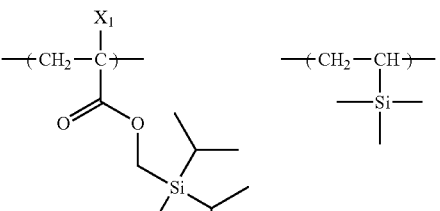

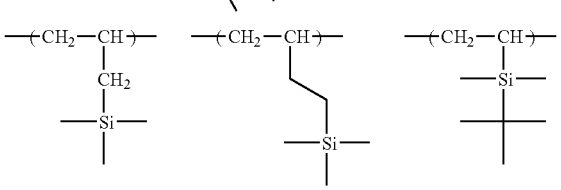

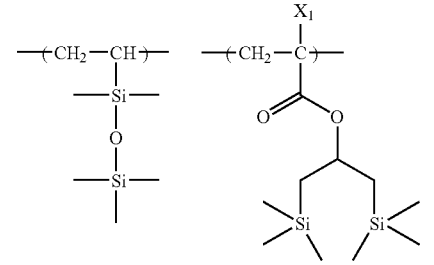

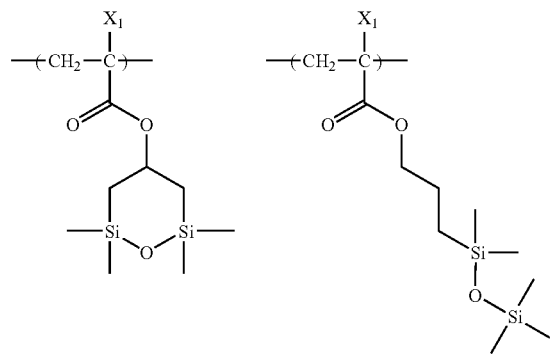

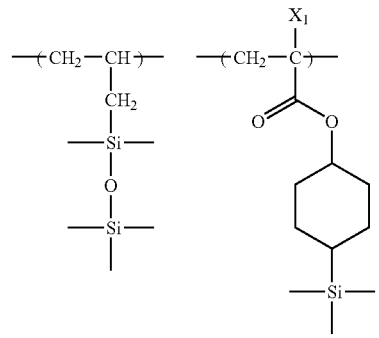

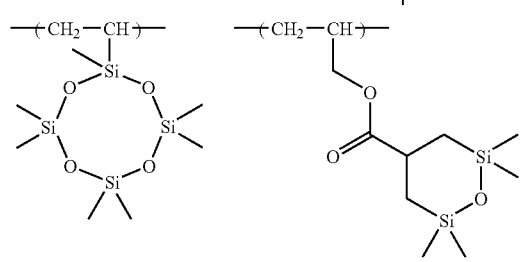

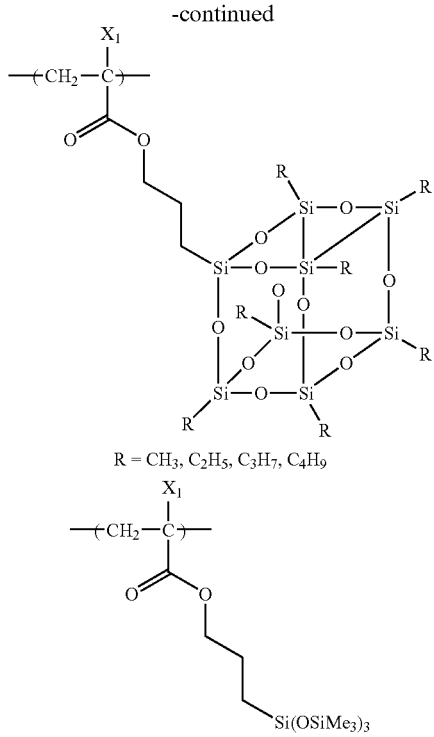

R = CH₃, C₂H₅, C₃H₇, C₄H₉

The hydrophobic resin (HR) may further contain at least one group selected from among the following groups of (x) to (z).

(x) an alkali-soluble group (y) a group that decomposes by action of an alkali developer to undergo an increase in solubility of the resin in the alkali developer (z) a group that decomposes by action of an acid Examples of the alkali-soluble group (x) include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfoyl)methylene group, bis(alkylsulfonyl)imido group, a tris(alkylcarbonyl)methylene group, and a tris(alkylsulfonyl)methylene group.

Preferred alkali-soluble groups are a fluorinated alcohol group (preferably a hexafluoroisopropanol), a sulfonimido group, and a bias(carbonyl)methylene group.

As the repeating unit having the alkali-soluble group (x), any of a repeating unit wherein the alkali-soluble group is directly connected to the main chain of a resin comprising a repeating unit of acrylic acid or methacrylic acid, and a repeating unit wherein the alkali-soluble group is connected to the main chain of the resin via a linking group is preferred. Further, it is also preferred to introduce the alkali-soluble group into the end of the polymer by using a polymerization initiator or chain transfer agent having the alkali-soluble group upon polymerization.

The content of the repeating unit having the alkali-soluble group (x) is preferably from 1 to 50 mol %, more preferably from 3 to 35 mol %, still more preferably from 5 to 20 mol %, based on all the repeating units in the polymer.

Specific examples of the repeating unit having the alkali-soluble group (x) will be shown below which, however, are not construed to limit the invention in any way.

(In the following formulae, $R_x$ represents H, $CH_3$, $CF_3$ or $CH_2OH$.)

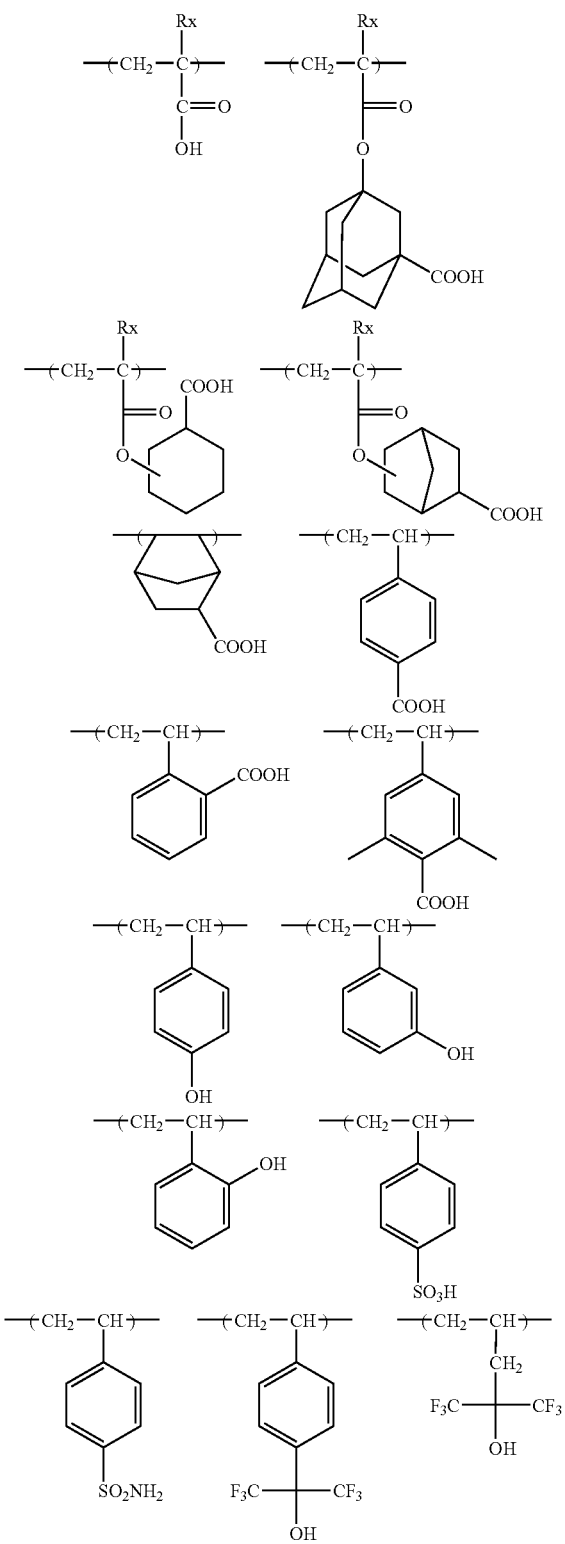

-continued

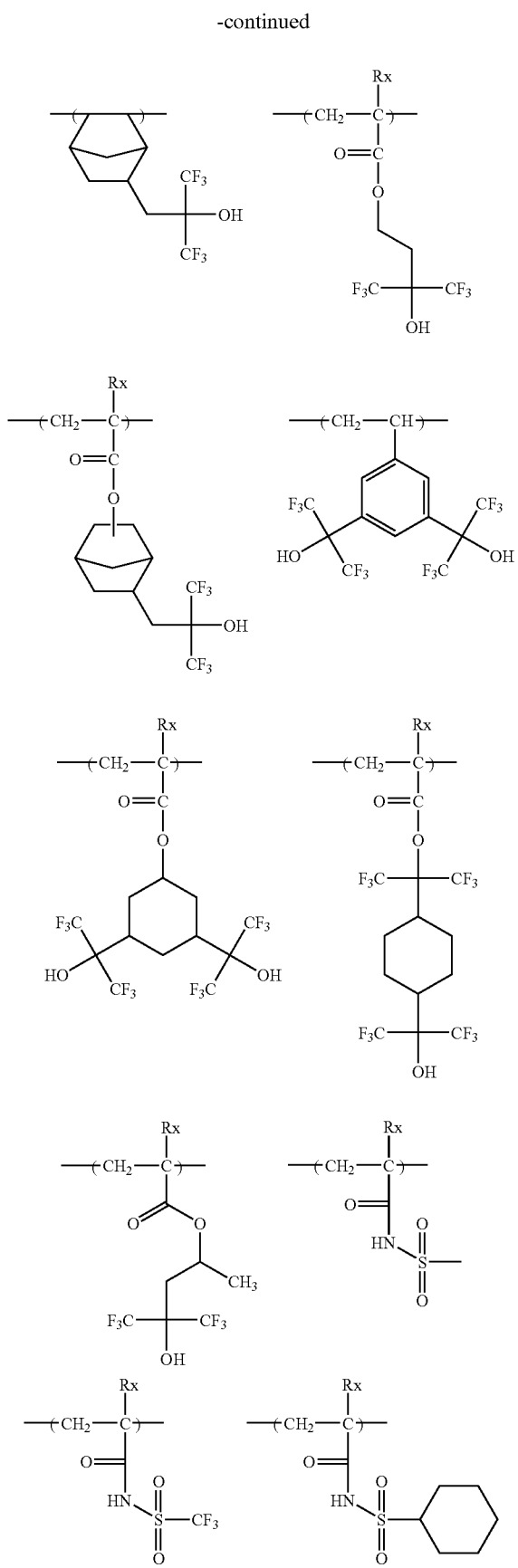

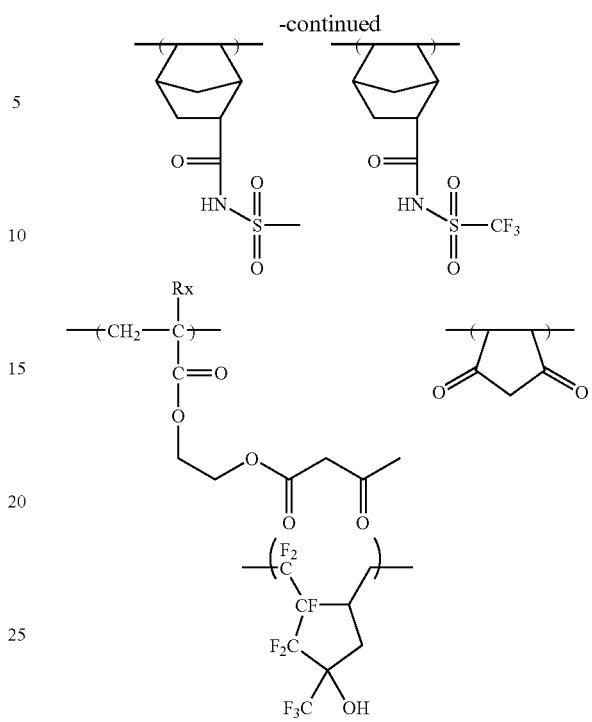

Examples of the group (y) that decomposes by action of an alkali developer to undergo an increase in solubility of the resin in the alkali developer include a group having a lactone structure, an acid anhydride, and an acid imido group, with a lactone group being preferred.

As a repeating unit having the group (y) that decomposes by action of an alkali developer to undergo an increase in solubility of the resin in the alkali developer, a repeating unit wherein the group (y) that decomposes by action of an alkali developer to undergo an increase in solubility of the resin in the alkali developer is connected to the main chain of the resin, such as an acrylic ester or a methacrylic ester is preferred. It is also preferred to introduce the alkali-soluble group into the end of the polymer by using a polymerization initiator or chain transfer agent having the group (y) that decomposes by action of an alkali developer to undergo an increase in solubility of the resin in the alkali developer upon polymerization.

The content of the repeating unit having the group (y) undergoing an increase in solubility in the alkali developer is preferably from 1 to 40 mol %, more preferably from 3 to 30 mol %, still more preferably from 5 to 15 mol %, based on all the repeating units in the polymer.

Specific examples of the repeating unit having the group (y) undergoing an increase in solubility in the alkali developer include the same repeating units having a lactone structure having been illustrated with respect to the resins of component (B).

Examples of the repeating unit (z) that decomposes by action of an acid and constituting the hydrophobic resin (HR) include the same repeating units having an acid-decomposable group having been illustrated with respect to the resins of component (A). The content of the repeating unit (z) decomposable by the action of an acid and constituting the hydrophobic resin (HR) is preferably from 1 to 80 mol %, more preferably from 10 to 80 mol %, still more preferably from 20 to 60 mol %, based on all the repeating units in the polymer.

The hydrophobic resin (HR) may further contain a repeating unit represented by the following general formula (III).

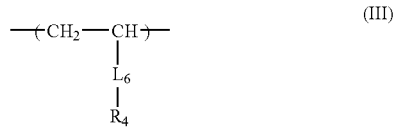

In the general formula (III), $R_4$ represents an alkyl group, a cycloalkyl group, an alkenyl group or a cycloalkenyl group.

$L_6$ represents a single bond or a divalent linking group.

The alkyl group represented by $R_4$ in the general formula (III) is preferably a straight or branched alkyl group containing from 3 to 20 carbon atoms.

The cycloalkyl group is preferably a cycloalkyl group containing from 3 to 20 carbon atoms.

The alkenyl group is preferably an alkenyl group containing from 3 to 20 carbon atoms.

The cycloalkenyl group is preferably a cycloalkenyl group containing from 3 to 20 carbon atoms.

The linking group represented by $L_6$ is preferably an alkylene group (containing preferably from 1 to 5 carbon atoms) or an oxy group.

When the hydrophobic resin (HR) contains a fluorine atom, the content of the fluorine atom is preferably from 5 to 80% by weight, more preferably from 10 to 80% by weight based on the molecular weight of the hydrophobic resin (HR). A repeating unit containing a fluorine atom is contained in the hydrophobic resin (HR) in an amount of preferably from 10 to 100% by weight, more preferably from 30 to 100% by weight.

When the hydrophobic resin (HR) contains a silicon atom, the content of the silicon atom is preferably from 2 to 50% by weight, more preferably from 2 to 30% by weight based on the molecular weight of the hydrophobic resin (HR). A repeating unit containing a silicon atom is contained in the hydrophobic resin (HR) in an amount of preferably from 10 to 100% by weight, more preferably from 20 to 100% by weight.

The weight-average molecular weight of the hydrophobic resin (HR) in terms of a standard polystyrene is preferably from 1,000 to 100,000, more preferably from 1,000 to 50,000, still more preferably from 2,000 to 15,000.

As is the same with the resins of component (A), it is naturally preferred for the hydrophobic resin (HR) to contain impurities such as metals in minimum amounts, and the content of residual monomers and oligomer components be preferably from 0 to 10% by weight, more preferably from 0 to 5% by weight, still more preferably from 0 to 1% by weight. Thus, there can be obtained a resist free of foreign matters in the solution and suffering no change with time of sensitivity. In addition, in view of resolution, resist shape, side wall of resist pattern, and roughness, the molecular weight distribution (Mw/Mn; also referred to as "degree of dispersion" is preferably in the range of from 1 to 5, more preferably from 1 to 3, still more preferably from 1 to 2.

As the hydrophobic resin (HR), various commercially available products can be used or those synthesized in a conventional manner (for example, by radical polymerization) can be used. For example, as a general synthesizing process, there are illustrated a one-shot polymerization process of conducting polymerization by dissolving a monomer species and an initiator in a solvent and heating the resulting solution, and a dropwise polymerization process of dropwise adding a solution of a monomer species and an initiator to a heated solvent over a period of from 1 to 10 hours, with the dropwise polymerization process being preferred. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate, amide solvents such as dimethylformamide and dimethylacetamide; and solvents capable of dissolving the composition of the invention such as propylene glycol monomethyl ether acetate, propylene glycol monomethyl ether, and cyclohexanone, which will be described hereinafter. It is more preferred to conduct polymerization by using the same solvent as that to be used in the positive resist composition of the invention. Thus, generation of particles during storage can be suppressed.

The polymerization reaction is preferably conducted in an atmosphere of an inert gas such as nitrogen or argon. The polymerization is initiated by using a commercially available radical initiator (e.g., an azo series initiator or a peroxide) as a polymerization initiator. As the radical initiator, azo series initiators are preferred, and azo series initiators having an ester group, a cyano group or a carboxyl group are preferred. Preferred examples of the initiator include azobisisobutyronitrile, azobisdimethylvaleronitrile, and dimethyl 2,2'-azobis(2-methylpropionate). The reaction concentration is from 5 to 50% by weight, preferably from 30 to 50% by weight. The reaction temperature is usually from 10° C. to 150° C., preferably from 30° C. to 120° C., more preferably from 60 to 100° C.

After completion of the reaction, the reaction mixture is allowed to cool to room temperature, followed by purification. As the purifying method, there can be employed common methods such as a liquid-liquid extraction method of removing residual monomers and oligomer components by a combination of washing with water and use of an appropriate solvent, a purifying method in a solution state such as ultrafiltration of removing components having a molecular weight equal to or less than a particular molecular weight by extraction, a re-precipitating method of removing residual monomers and the like by dropwise adding the resin solution to a poor solvent to thereby coagulate the resin in the poor solvent, and a purifying method in a solid state by washing a resin slurry obtained by filtration with a poor solvent. For example, the resin is precipitated as solid by bringing the reaction solution into contact with a solvent (poor solvent) in which the resin is scarcely soluble or insoluble, in an amount by volume 10 times as much as the amount by volume of the reaction solution or less than that, preferably in a 10- to 5-fold amount by volume.

As a solvent (solvent for precipitation or re-precipitation) to be used upon precipitation or re-precipitation of the polymer product from the polymer solution, poor solvents for the polymer may be used. An appropriate solvent can be selected from among hydrocarbons, halogenated hydrocarbons, nitro compounds, ethers, ketones, esters, carbonates, alcohols, carboxylic acids, water, and mixed solvents containing these solvents according to the kind of the polymer. Of these, solvents containing at least an alcohol (particularly, methanol) or water are preferred as the solvents for precipitation or re-precipitation.

The amount of the solvents for precipitation or re-precipitation to be used can properly be selected in consideration of efficiency or yield but, in general, is from 100 to 10,000 parts by weight, preferably from 200 to 2,000 parts by weight, more preferably from 300 to 1,000 parts by weight, per 100 parts by weight of the polymer solution.

The temperature to be employed upon precipitation or re-precipitation can properly be selected in consideration of efficiency or operability but, usually, is from about 0 to about 50° C., preferably around room temperature (for example, from about 20 to about 35° C.). The precipitation or re-precipitation procedure can be conducted in a known manner such as a batchwise manner or a continuous manner using a conventional mixing vessel such as a stirring tank.

The precipitated or re-precipitated polymer is usually subjected to conventional solid-liquid separation such as filtration or centrifugation, and then dried to use. Filtration is conducted by using a solvent-resistance filter medium preferably under pressure. Drying is conducted under ordinary pressure or reduced pressure (preferably under reduced pressure) at a temperature of from about 30 to about 100° C., preferably from about 30 to about 50° C.

Additionally, it is also possible to once precipitate and separate the resin, and then again dissolve in a solvent and bring the solution into contact with a solvent in which the resin is scarcely soluble or insoluble. That is, the reaction solution may be subjected, after completion of the radical polymerization reaction, to a method including a step (Step a) of bringing the reaction solution into contact with a solvent in which the resin is scarcely soluble or insoluble to thereby precipitate the resin, a step (Step b) of separating the resin from the solution, a step (Step c) of again dissolving the separated resin to prepare a resin solution A, a step (Step d) of bringing the resin solution A into contact with a solvent in which the resin is scarcely soluble or insoluble to thereby precipitate the resin in an amount by volume less than 10 times the amount by volume of the resin solution A (preferably in an amount by volume less than 5 times) to thereby precipitate the resin solid, and a step (Step e) of separating the precipitated resin.

Specific examples of the hydrophobic resin (HR) will be shown below. Also, mol ratios of repeating units in individual resins (corresponding to individual repeating units in the order of from left to right), weight-average molecular weights, and degrees of dispersion are shown in Table 1 below.

(HR-1)

(HR-2)

(HR-3)

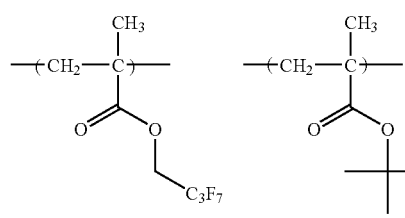
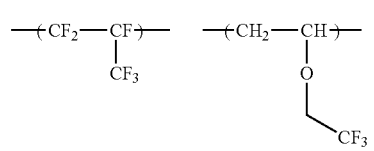
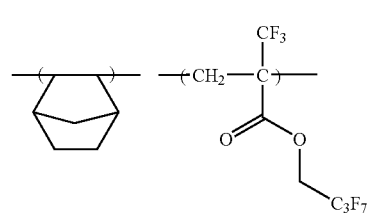

-continued (HR-4)

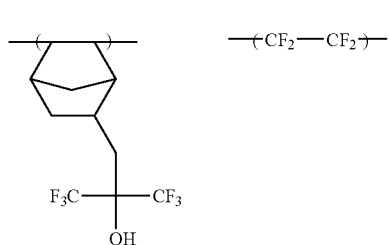

(HR-5)

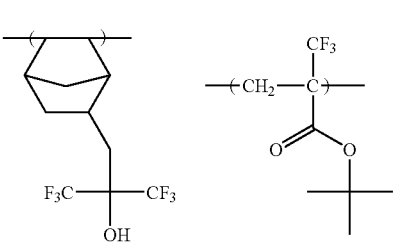

(HR-6)

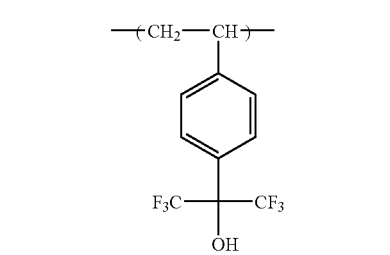

(HR-7)

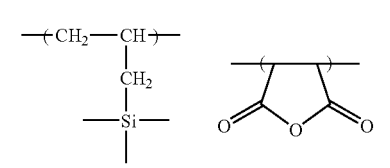

(HR-8)

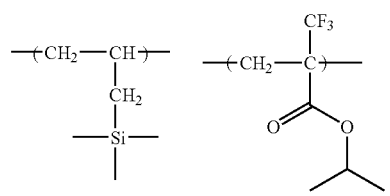

(HR-9)

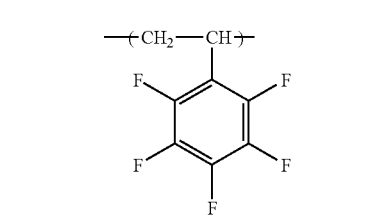

(HR-10)

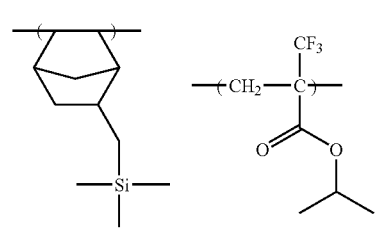

-continued
(HR-11)
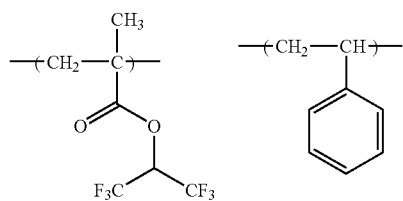
(HR-12)
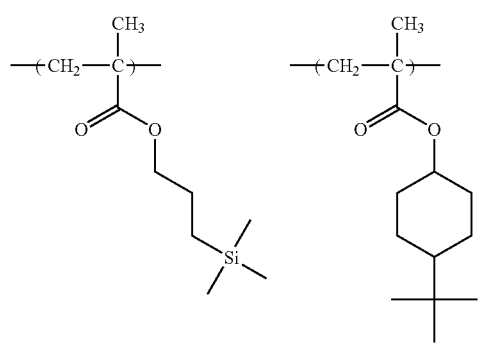
(HR-13)
(HR-14)
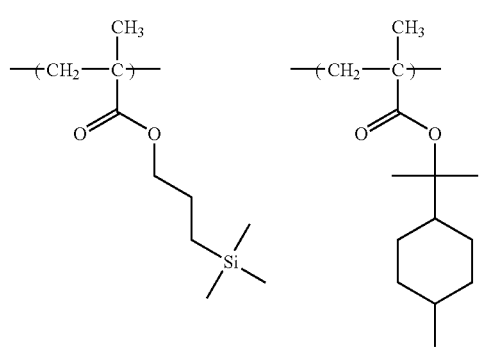
(HR-15)
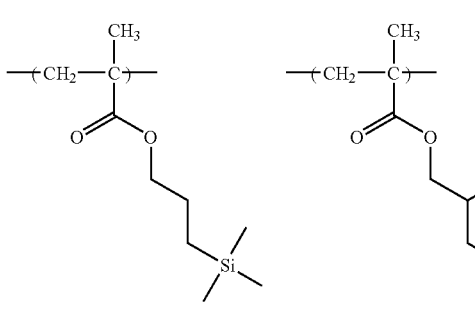
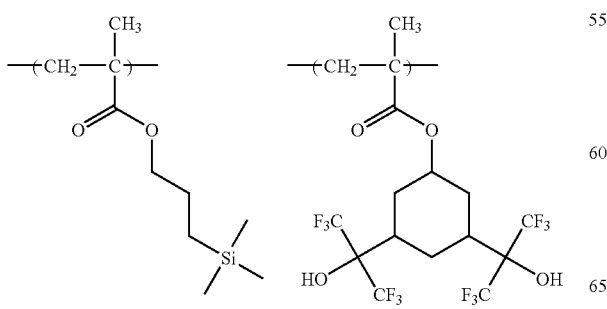
-continued
(HR-16)
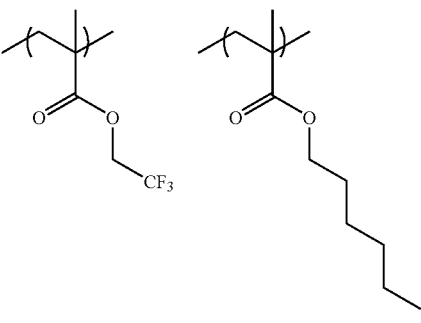
(HR-17)
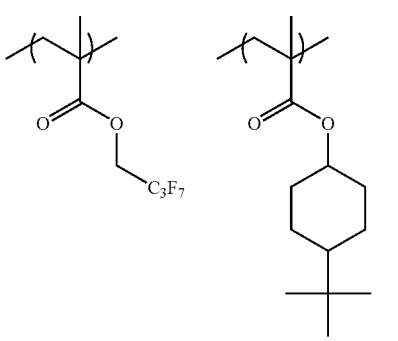
(HR-18)
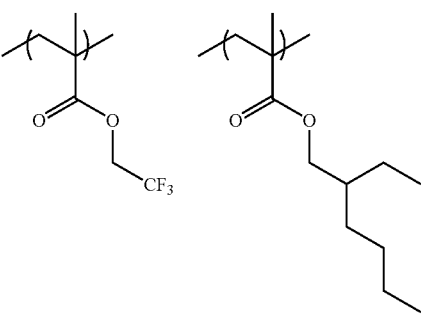
(HR-19)
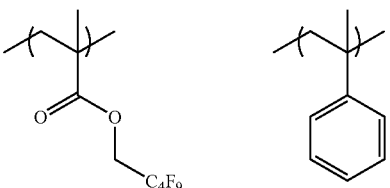
(HR-20)
(HR-21)
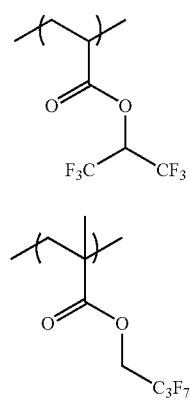

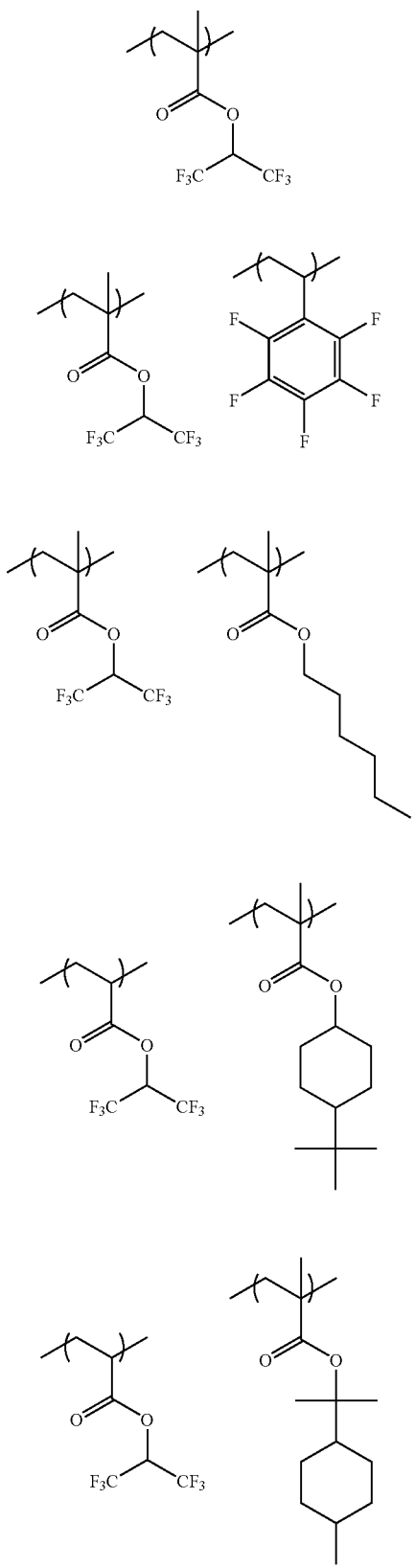
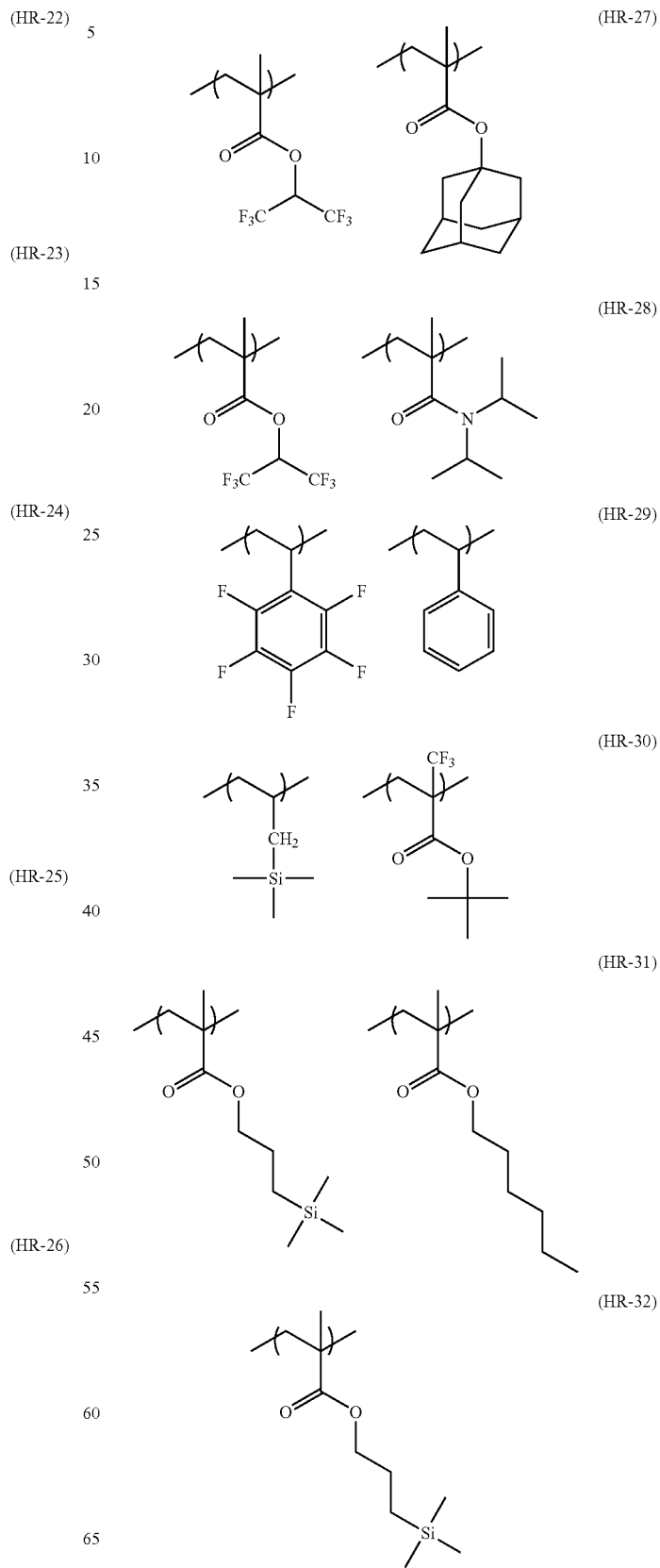

(HR-33)
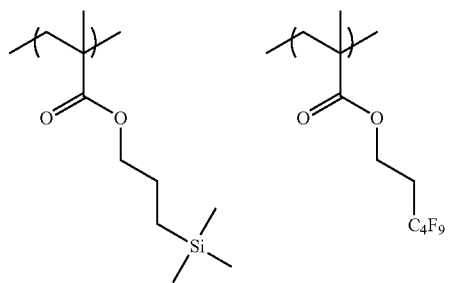
(HR-34)
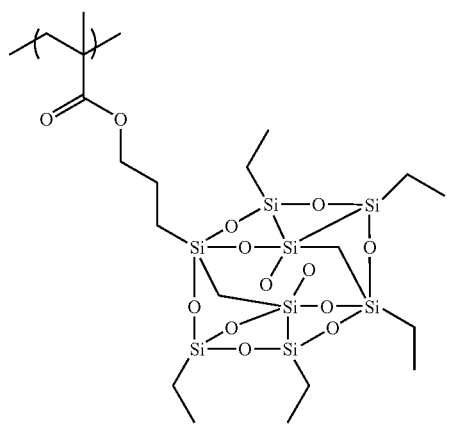
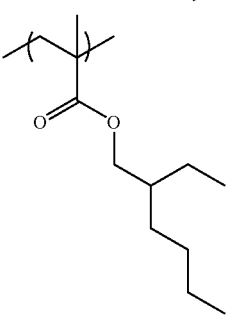
(HR-35)
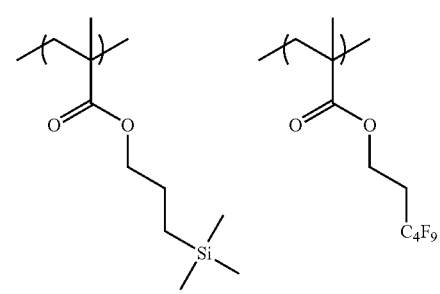
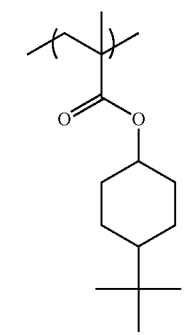
(HR-36)
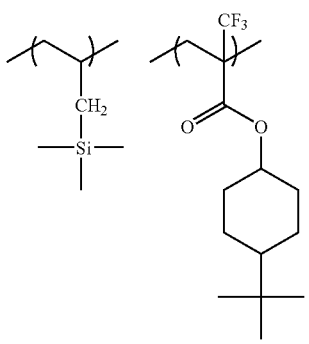
(HR-37)
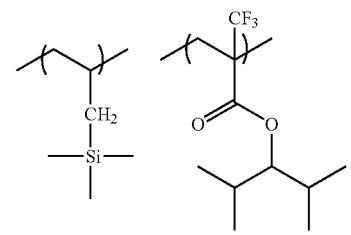
(HR-38)
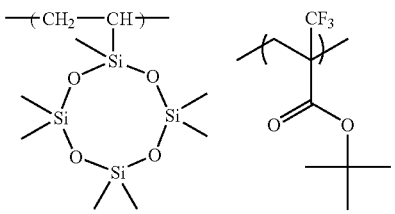
(HR-39)
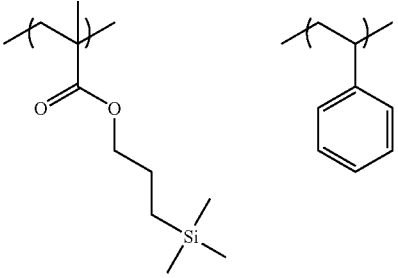
(HR-40)
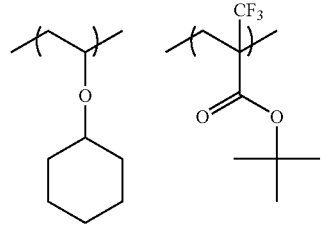
(HR-41)
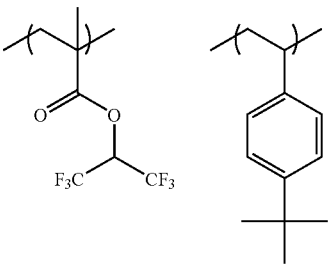

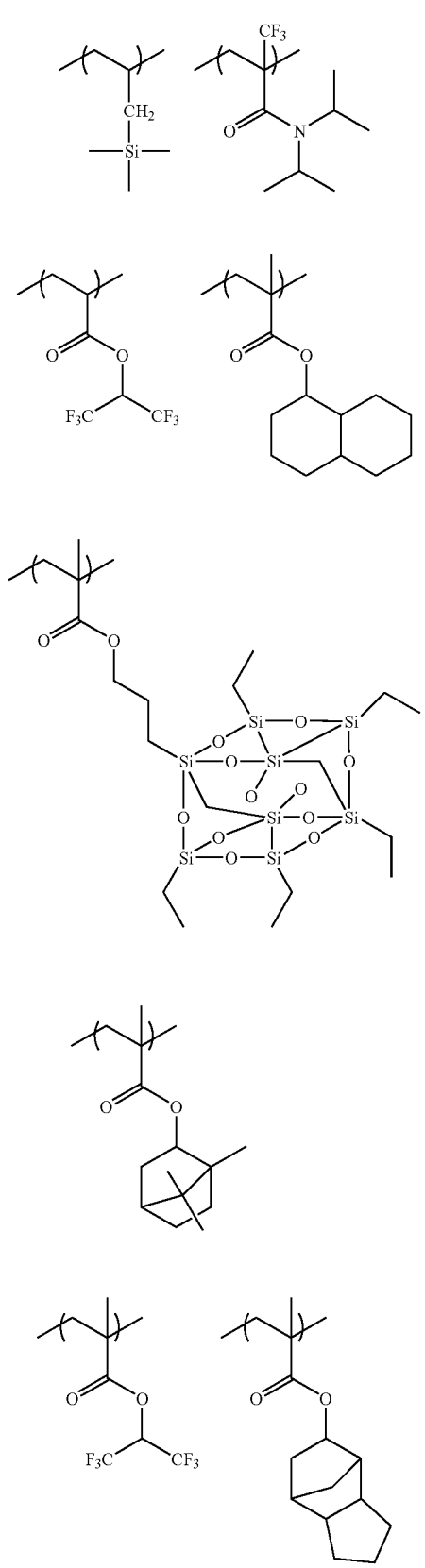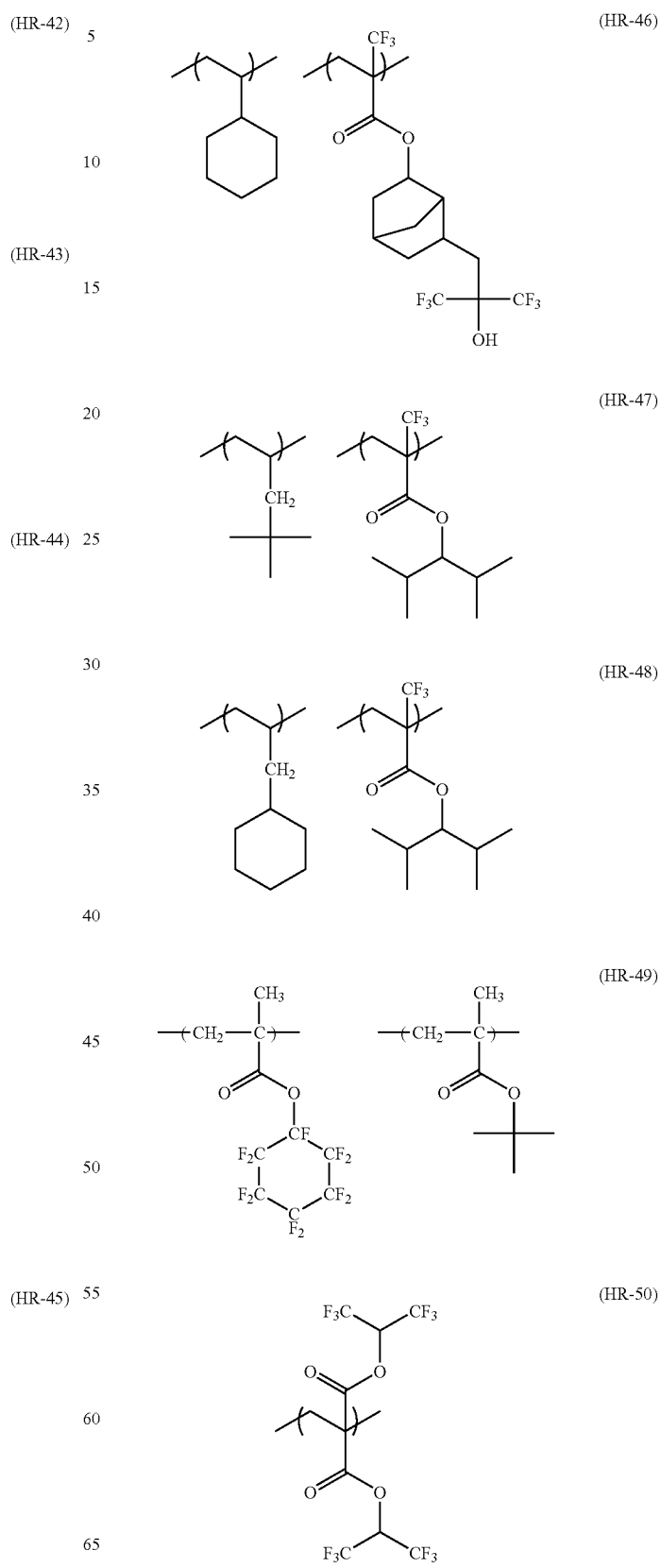

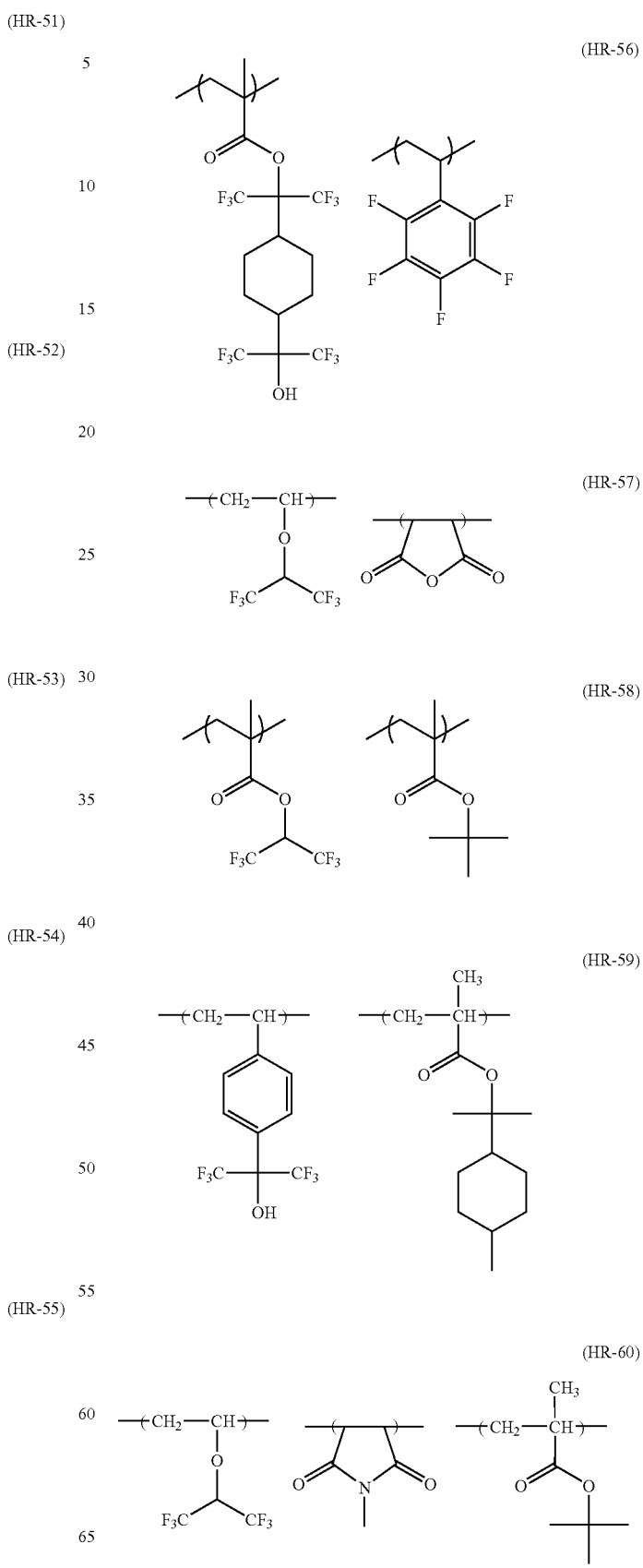

-continued
(HR-61)
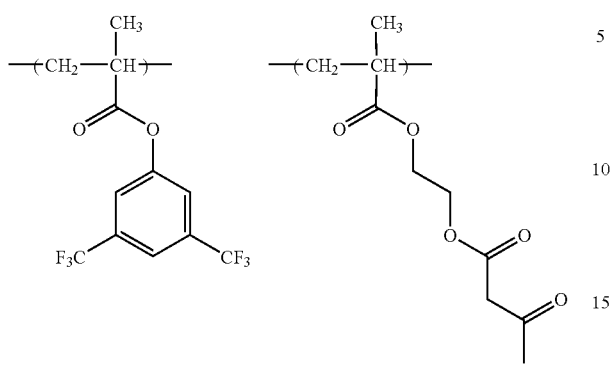
(HR-62)
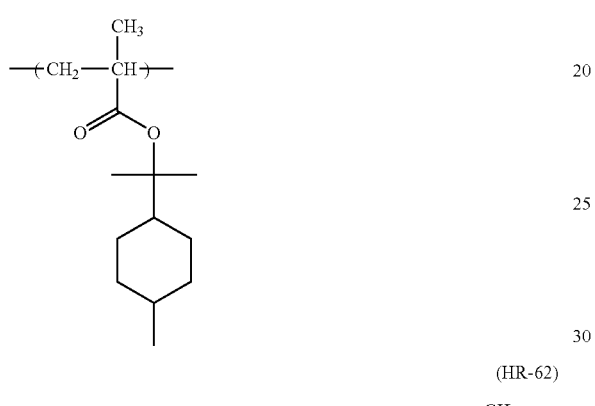
(HR-63)
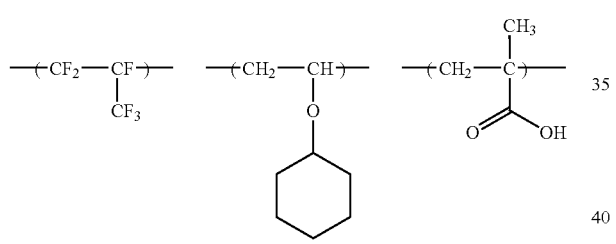
(HR-64)
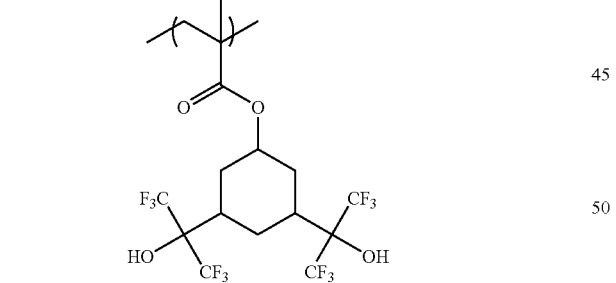
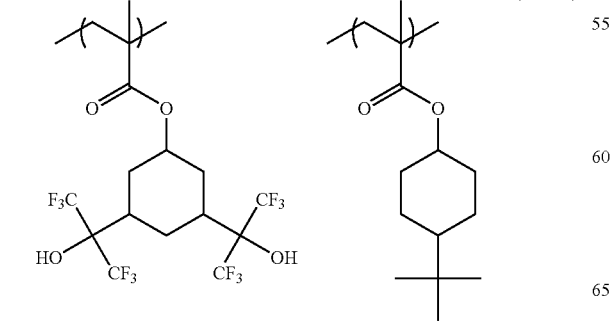
-continued
(HR-65)
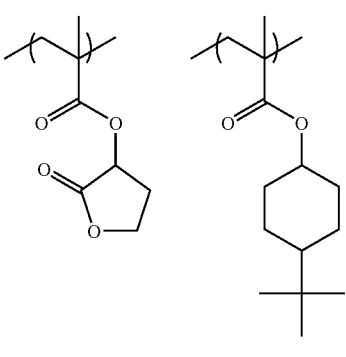
(HR-66)
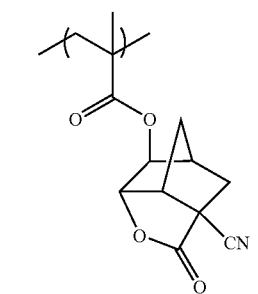
(HR-67)
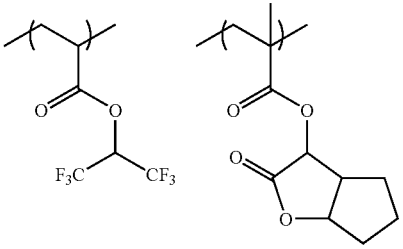
(HR-68)
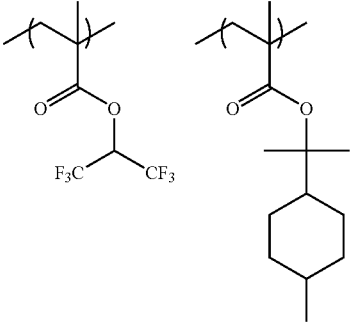
(HR-69)
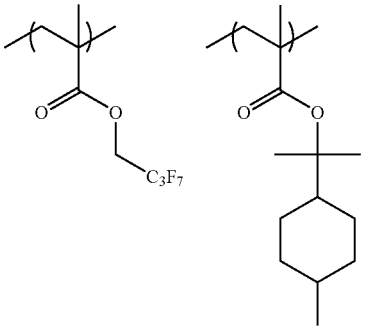

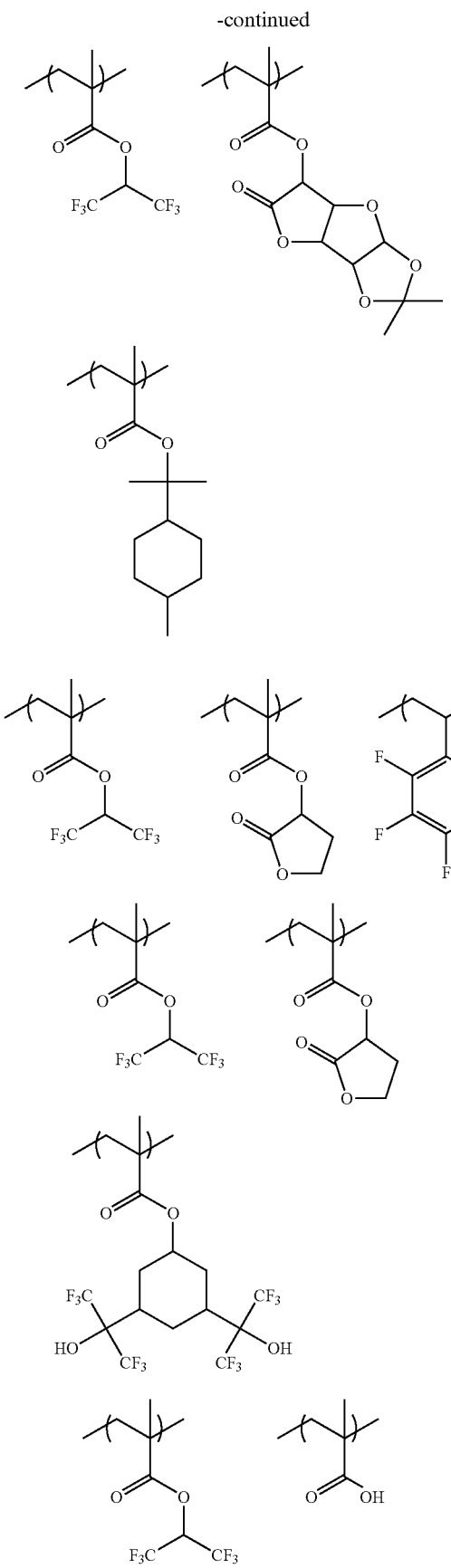
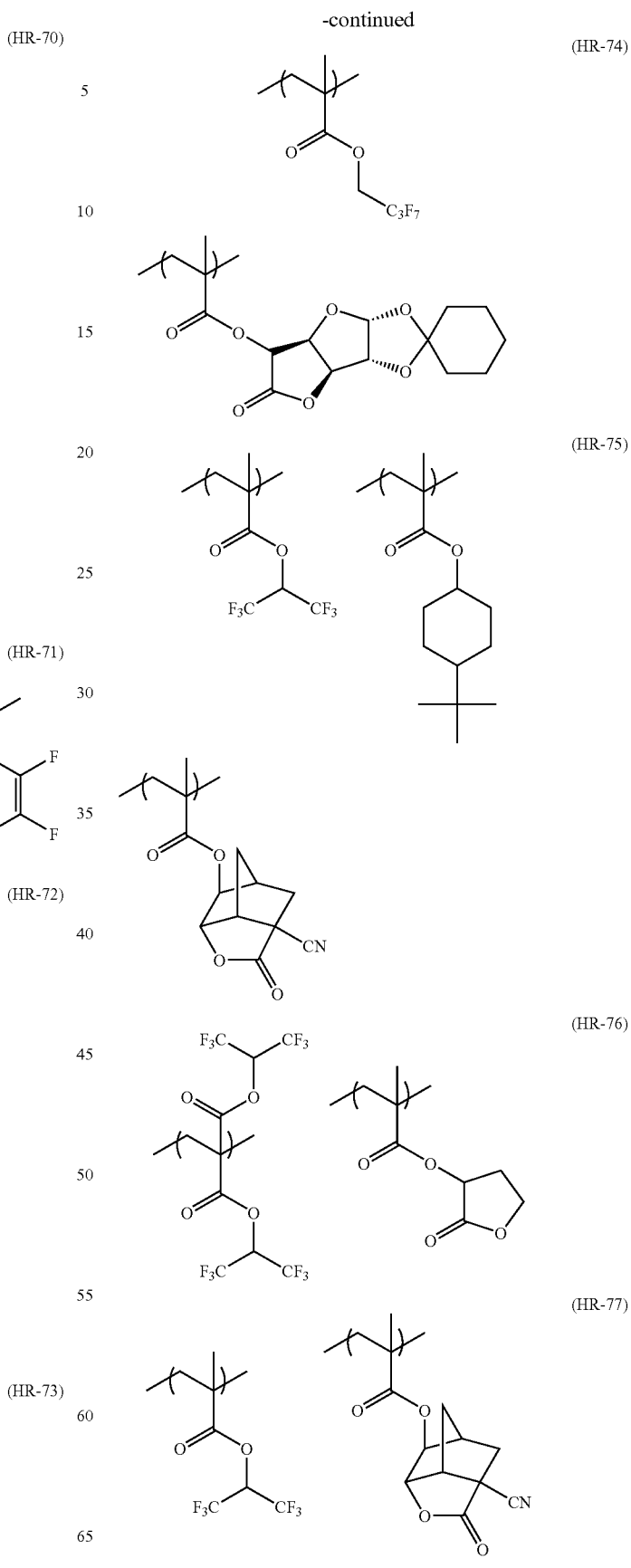

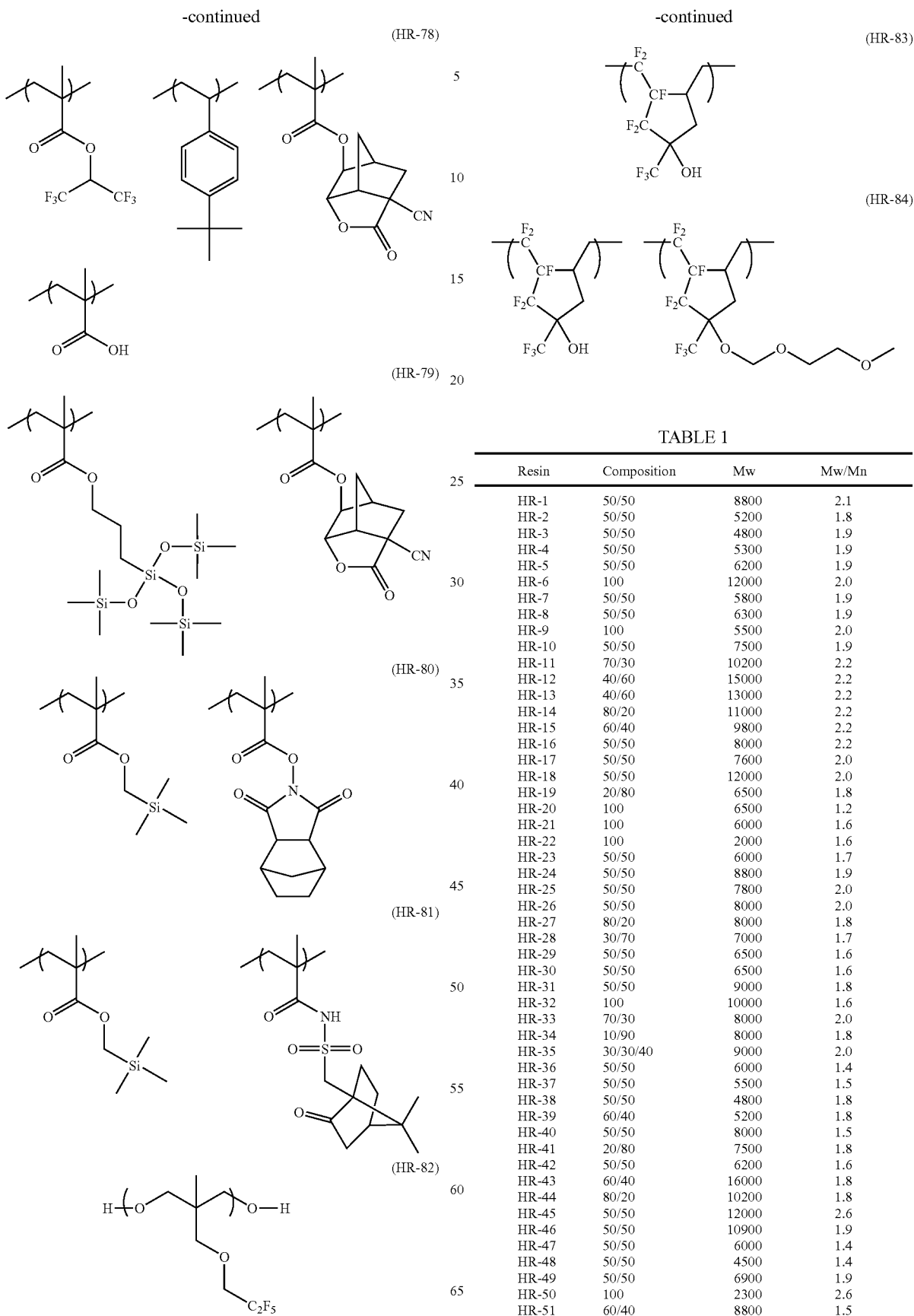
TABLE 1
| Resin | Composition | Mw | Mw/Mn |
|---|---|---|---|
| HR-1 | 50/50 | 8800 | 2.1 |
| HR-2 | 50/50 | 5200 | 1.8 |
| HR-3 | 50/50 | 4800 | 1.9 |
| HR-4 | 50/50 | 5300 | 1.9 |
| HR-5 | 50/50 | 6200 | 1.9 |
| HR-6 | 100 | 12000 | 2.0 |
| HR-7 | 50/50 | 5800 | 1.9 |
| HR-8 | 50/50 | 6300 | 1.9 |
| HR-9 | 100 | 5500 | 2.0 |
| HR-10 | 50/50 | 7500 | 1.9 |
| HR-11 | 70/30 | 10200 | 2.2 |
| HR-12 | 40/60 | 15000 | 2.2 |
| HR-13 | 40/60 | 13000 | 2.2 |
| HR-14 | 80/20 | 11000 | 2.2 |
| HR-15 | 60/40 | 9800 | 2.2 |
| HR-16 | 50/50 | 8000 | 2.2 |
| HR-17 | 50/50 | 7600 | 2.0 |
| HR-18 | 50/50 | 12000 | 2.0 |
| HR-19 | 20/80 | 6500 | 1.8 |
| HR-20 | 100 | 6500 | 1.2 |
| HR-21 | 100 | 6000 | 1.6 |
| HR-22 | 100 | 2000 | 1.6 |
| HR-23 | 50/50 | 6000 | 1.7 |
| HR-24 | 50/50 | 8800 | 1.9 |
| HR-25 | 50/50 | 7800 | 2.0 |
| HR-26 | 50/50 | 8000 | 2.0 |
| HR-27 | 80/20 | 8000 | 1.8 |
| HR-28 | 30/70 | 7000 | 1.7 |
| HR-29 | 50/50 | 6500 | 1.6 |
| HR-30 | 50/50 | 6500 | 1.6 |
| HR-31 | 50/50 | 9000 | 1.8 |
| HR-32 | 100 | 10000 | 1.6 |
| HR-33 | 70/30 | 8000 | 2.0 |
| HR-34 | 10/90 | 8000 | 1.8 |
| HR-35 | 30/30/40 | 9000 | 2.0 |
| HR-36 | 50/50 | 6000 | 1.4 |
| HR-37 | 50/50 | 5500 | 1.5 |
| HR-38 | 50/50 | 4800 | 1.8 |
| HR-39 | 60/40 | 5200 | 1.8 |
| HR-40 | 50/50 | 8000 | 1.5 |
| HR-41 | 20/80 | 7500 | 1.8 |
| HR-42 | 50/50 | 6200 | 1.6 |
| HR-43 | 60/40 | 16000 | 1.8 |
| HR-44 | 80/20 | 10200 | 1.8 |
| HR-45 | 50/50 | 12000 | 2.6 |
| HR-46 | 50/50 | 10900 | 1.9 |
| HR-47 | 50/50 | 6000 | 1.4 |
| HR-48 | 50/50 | 4500 | 1.4 |
| HR-49 | 50/50 | 6900 | 1.9 |
| HR-50 | 100 | 2300 | 2.6 |
| HR-51 | 60/40 | 8800 | 1.5 |

TABLE 1-continued

| Resin | Composition | Mw | Mw/Mn |
|---|---|---|---|
| HR-52 | 68/32 | 11000 | 1.7 |
| HR-53 | 100 | 8000 | 1.4 |
| HR-54 | 100 | 8500 | 1.4 |
| HR-55 | 80/20 | 13000 | 2.1 |
| HR-56 | 70/30 | 18000 | 2.3 |
| HR-57 | 50/50 | 5200 | 1.9 |
| HR-58 | 50/50 | 10200 | 2.2 |
| HR-59 | 60/40 | 7200 | 2.2 |
| HR-60 | 32/32/36 | 5600 | 2.0 |
| HR-61 | 30/30/40 | 9600 | 1.6 |
| HR-62 | 40/40/20 | 12000 | 2.0 |
| HR-63 | 100 | 6800 | 1.6 |
| HR-64 | 50/50 | 7900 | 1.9 |
| HR-65 | 40/30/30 | 5600 | 2.1 |
| HR-66 | 50/50 | 6800 | 1.7 |
| HR-67 | 50/50 | 5900 | 1.6 |
| HR-68 | 49/51 | 6200 | 1.8 |
| HR-69 | 50/50 | 8000 | 1.9 |
| HR-70 | 30/40/30 | 9600 | 2.3 |
| HR-71 | 30/40/30 | 9200 | 2.0 |
| HR-72 | 40/29/31 | 3200 | 2.1 |
| HR-73 | 90/10 | 6500 | 2.2 |
| HR-74 | 50/50 | 7900 | 1.9 |
| HR-75 | 20/30/50 | 10800 | 1.6 |
| HR-76 | 50/50 | 2200 | 1.9 |
| HR-77 | 50/50 | 5900 | 2.1 |
| HR-78 | 40/20/30/10 | 14000 | 2.2 |
| HR-79 | 50/50 | 5500 | 1.8 |
| HR-80 | 50/50 | 10600 | 1.9 |
| HR-81 | 50/50 | 8600 | 2.3 |
| HR-82 | 100 | 15000 | 2.1 |
| HR-83 | 100 | 6900 | 2.5 |
| HR-84 | 50/50 | 9900 | 2.3 |

The resist composition of the invention is prepared by dissolving the above-mentioned components in a predetermined solvent, preferably the aforesaid mixed solvent, followed by filtering the solution through a filter, and is coated on a predetermined substrate in the following manner to use. The filter to be used for filtering the solution is a filter made of polytetrafluoroethylene, polyethylene or nylon of preferably 0.1 micron or less, more preferably 0.05 micron or less, still more preferably 0.03 micron or less.

The resist composition is coated on a substrate (e.g., silicon/silicon dioxide coating) as used for the production of a precise integrated circuit element by appropriate application means, for example, spinner or coater in any thickness (usually from 50 to 500 nm). After coating, the coated composition is dried by spinning or baking to form a resist film. The baking temperature can properly be determined, but is usually from 60 to 150° C., preferably from 90 to 130° C.

Then, the resist film is exposed to light through a mask for pattern formation.

The exposure amount can properly be determined, but is usually from 1 to 100 mJ/cm². After exposure to light, the coated composition is preferably subjected to spinning and/or baking, and then subjected to development and rinsing to obtain a pattern.

Upon irradiation with an actinic ray or radiation, exposure (immersion exposure) may be conducted by filling the space between the light-sensitive film and a lens with a liquid having a higher refractive index than that of the air, whereby resolution can be enhanced. As the immersion medium to be employed, any liquid that has a higher refractive index than that of the air can be used, but pure water is preferred.

It is also possible to provide a film (hereinafter also referred to as "topcoat") scarcely soluble in the immersion liquid so as to prevent the resist film formed from the resist composition of the invention from directly contacting with the immersion liquid. The topcoat is required to have coating adaptability for the upper part of the resist, transparency to radiation of, particularly 193 nm, and scarce solubility for the immersion liquid. The topcoat preferably is not mixible with the resist and, further, is preferably capable of being uniformly coated on the upper layer of the resist.

In view of transparency to 193-nm light, the topcoat preferably comprises a polymer not rich in the content of aromatic components. Specific examples thereof include hydrocarbon polymers, acrylic ester polymers, polymethacrylic acid, polyacrylic acid, polyvinyl ether, silicon-containing polymers, and fluorine-containing polymers. The foregoing hydrophobic resins (HR) are also preferred as resins for the topcoat. From the standpoint that, when impurities are dissolved out of the topcoat into the immersion liquid, the impurities can stain the optical lens, the amount of residual monomers of the polymer contained in the topcoat is preferably minimized.

Upon delamination of the topcoat, a developer may be used or, alternatively, a release agent may be used. As the release agent, a solvent scarcely permeating into the resist film is preferred. In the point that the releasing procedure can be conducted simultaneously with development processing procedure of the resist film, it is preferred to release the topcoat with an alkali developer. In view of releasing with an alkali developer, the topcoat is preferably acidic but, in view of non-intermixing properties with the resist film, the topcoat may be neutral or alkaline.

A smaller difference in refractive index between the topcoat and the immersion liquid serves to more improve resolution. In the case of using an ArF excimer layer (wavelength: 193 nm) and using water as an immersion liquid, the topcoat for ArF immersion exposure preferably has a refractive index approximate to the refractive index of the immersion liquid. In view of allowing the refractive index of the topcoat to approximate to that of the immersion liquid, presence of fluorine atom in the topcoat is preferred. Also, in view of transparency and refractive index, the topcoat preferably has a smaller thickness.

The topcoat is preferably unmixible with the resist film and, further, unmixible with the immersion liquid. From this viewpoint, when the immersion liquid is water, the solvent to be used for the topcoat is preferably a non-watersoluble medium scarcely soluble in the solvent used for the resist composition. Further, when the immersion liquid is an organic solvent, the topcoat may be water-soluble or water-insoluble.

Examples of the actinic ray or radiation include infrared light, visible light, ultraviolet light, deep ultraviolet light, X-ray, and electron beams. Of these, deep ultraviolet light of 250 nm or less is preferred, with deep ultraviolet light of 220 nm or less being more preferred. Specific examples thereof include KrF excimer laser beam (248 nm), ArF excimer laser beam (193 nm), $F_2$ excimer laser beam (157 nm), X-ray and electron beams, with ArF excimer laser beam, $F_2$ excimer laser beam, EUV (13 nm), and electron beams being preferred.

An anti-reflective film may previously be coated on a substrate prior to formation of the resist film.

As the anti-reflective film, any of an inorganic film type comprising, for example, titanium, titanium dioxide, titanium nitride, chromium oxide, carbon or amorphous silicon and an organic film type comprising a light-absorbing agent and a polymer material can be used. Also, commercially available anti-reflective film such as DUV30 Series, DUV40 Series manufactured by Brewer Science, Inc. and AR-2, AR-3 or AR-5 manufactured by Shipley Company can be used as the organic anti-reflective film.

In the developing step, an alkali developer is used in the following manner. As the alkali developer for the resist composition, alkaline aqueous solutions of inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide and tetraethylammonium hydroxide, and cyclic amines such as pyrrole and piperidine can be used.

Further, an alcohol or a surfactant may be added to the alkali developer to use.

The alkali concentration of the alkali developer is usually from 0.1 to 20% by weight.

The pH of the alkali developer is usually from 10.0 to 15.0.

The resist composition of the invention may be applied to a multilayer resist process (particularly a three-layer resist process). The three-layer resist process includes the following processes:

(a) A lower resist layer comprising an organic material is formed on a substrate to be processed;

(b) An intermediate layer and an upper resist layer comprising an organic material crosslinkable or decomposable by radiation exposure are successively formed on the lower resist layer; and (c) After the formation of a predetermined pattern on the upper resist layer, the intermediate layer, the lower layer, and the substrate are successively etched.

As a material for the intermediate layer, an organopolysiloxane (silicone resin) or a $SiO_2$ coating solution (SOG) is used. As the lower layer resist, an appropriate organic high-molecular film is used, but various known photo resists may also be used. For example, FH Series and FHi Series manufactured by Fujifilm Arch Co., Ltd. and PFI Series manufactured by Sumitomo Chemical Co., Ltd. can be illustrated.

The thickness of the lower layer resist is preferably from 0.1 to 4.0 µm, more preferably from 0.2 to 2.0 µm, particularly preferably from 0.25 to 1.5 µm. In view of anti-reflective properties and dry-etching resistance, the thickness is preferably 0.1 µm or more and, in view of aspect ratio or pattern collapse of formed fine pattern, the thickness is preferably 4.0 µm or less.

EXAMPLES

The invention will be specifically described hereinafter by reference to Examples which, however, are not to be construed to limit the invention in any way.

Synthesis Example 1 (Synthesis of Resin (P-1))

5.6 g of cyclohexanone is placed in a three-neck flask in a stream of nitrogen, and is heated to 80° C. To this is dropwise added over 6 hours a solution of 11.11 g (50.0 mmols) of the following monomer (1-1), 11.22 g (50.0 mmols) of the following monomer (1-2), 0.42 g (2.56 mmols) of a polymerization initiator V-60 (azobisisobutyronitrile; manufactured by Wako Pure Chemical Industries, Ltd.), and 0.78 g (2.56 mmols) of a chain transfer agent (I-1) dissolved in 106 g of cyclohexanone. After completion of the dropwise addition, reaction is further conducted at 80° C. To this solution is dropwise added at 80° C. over 4 hours a solution of 3.28 g (20 mmols) of the polymerization initiator V-60 (manufactured by Wako Pure Chemical Industries, Ltd.) dissolved in 20 ml of cyclohexanone, followed by heating for further 2 hours. After allowing the reaction solution to cool, it is dropwise added to a mixture of 900 ml of methanol/100 ml of ethyl acetate over 20 minutes, and the precipitated powder is collected by filtration and dried to obtain 19.3 g of a resin (P-1). The thus-obtained resin has a weight-average molecular weight of 6,000 in terms of standard polystyrene and has a degree of dispersion (Mw/Mn) of 1.19.

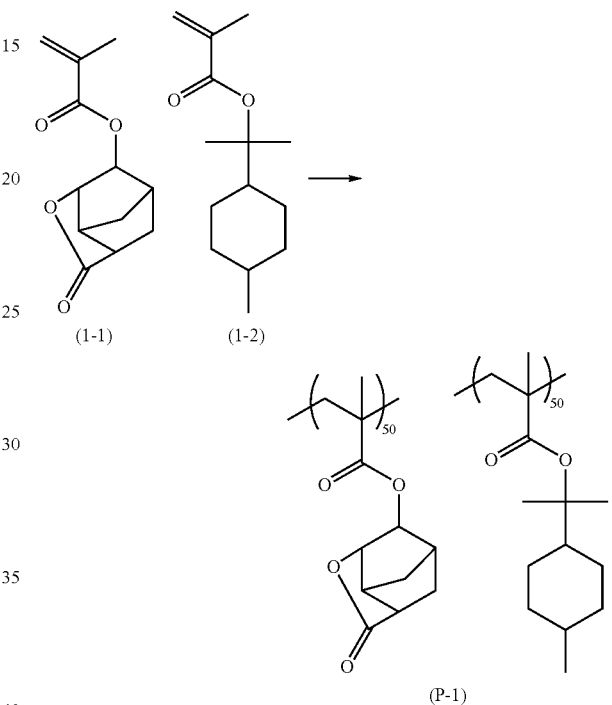

Resins (P-2) to (P-27) are synthesized in the same manner as in Synthesis Example 1 under the conditions shown in the following Table 2. Additionally, the residue of the chain transfer agent which resins (P-2) to (P-27) have is removed by using the initiator used upon polymerization.

Also, in the case of not employing living radical polymerization, corresponding resins are synthesized in the same manner as described above except for not using the chain transfer agent.

TABLE 2

| | Resin No. | Resin Structure | Chain Transfer Agent | Weight-average Molecular Weight | Degree of Dispersion |
|---|---|---|---|---|---|
| Synthesis Example 1 | P-1 | RA-1 | I-1 | 6000 | 1.19 |
| Synthesis Example 2 | P-2 | RA-1 | I-1 | 10000 | 1.19 |
| Synthesis Example 3 | P-3 | RA-1 | I-2 | 10000 | 1.21 |
| Synthesis Example 4 | P-4 | RA-1 | I-100 | 10000 | 1.43 |
| Synthesis Example 5 | P-5 | RA-1 | none | 10000 | 1.89 |
| Synthesis Example 6 | P-6 | RA-2 | I-100 | 6000 | 1.32 |
| Synthesis Example 7 | P-7 | RA-2 | I-1 | 10000 | 1.19 |
| Synthesis Example 8 | P-8 | RA-2 | I-1 | 18000 | 1.19 |
| Synthesis Example 9 | P-9 | RA-2 | I-2 | 6000 | 1.21 |
| Synthesis Example 10 | P-10 | RA-2 | I-100 | 6000 | 1.42 |
| Synthesis Example 11 | P-11 | RA-2 | none | 6000 | 1.75 |

TABLE 2-continued

| | Resin No. | Resin Structure | Chain Transfer Agent | Weight-average Molecular Weight | Degree of Dispersion |
|---|---|---|---|---|---|
| Synthesis Example 12 | P-12 | RA-3 | I-1 | 6000 | 1.22 |
| Synthesis Example 13 | P-13 | RA-3 | I-3 | 15000 | 1.21 |
| Synthesis Example 14 | P-14 | RA-3 | I-101 | 6000 | 1.43 |
| Synthesis Example 15 | P-15 | RA-3 | none | 6000 | 1.84 |
| Synthesis Example 16 | P-16 | RA-4 | I-1 | 6000 | 1.19 |
| Synthesis Example 17 | P-17 | RA-4 | I-1 | 18000 | 1.19 |
| Synthesis Example 18 | P-18 | RA-5 | I-1 | 18000 | 1.19 |
| Synthesis Example 19 | P-19 | RA-6 | I-3 | 8000 | 1.21 |
| Synthesis Example 20 | P-20 | RA-7 | I-10 | 15000 | 1.21 |
| Synthesis Example 21 | P-21 | RA-8 | I-1 | 5000 | 1.19 |
| Synthesis Example 22 | P-22 | RA-8 | I-1 | 15000 | 1.19 |
| Synthesis Example 23 | P-23 | RA-9 | I-1 | 15000 | 1.19 |
| Synthesis Example 24 | P-24 | RA-10 | I-5 | 4000 | 1.22 |
| Synthesis Example 25 | P-25 | RA-10 | I-5 | 15000 | 1.22 |
| Synthesis Example 26 | P-26 | RA-11 | I-13 | 8000 | 1.23 |
| Synthesis Example 27 | P-27 | RA-12 | I-15 | 8000 | 1.23 |

Resin structures (RA-1) to (RA-12) in Table 2 are shown below.

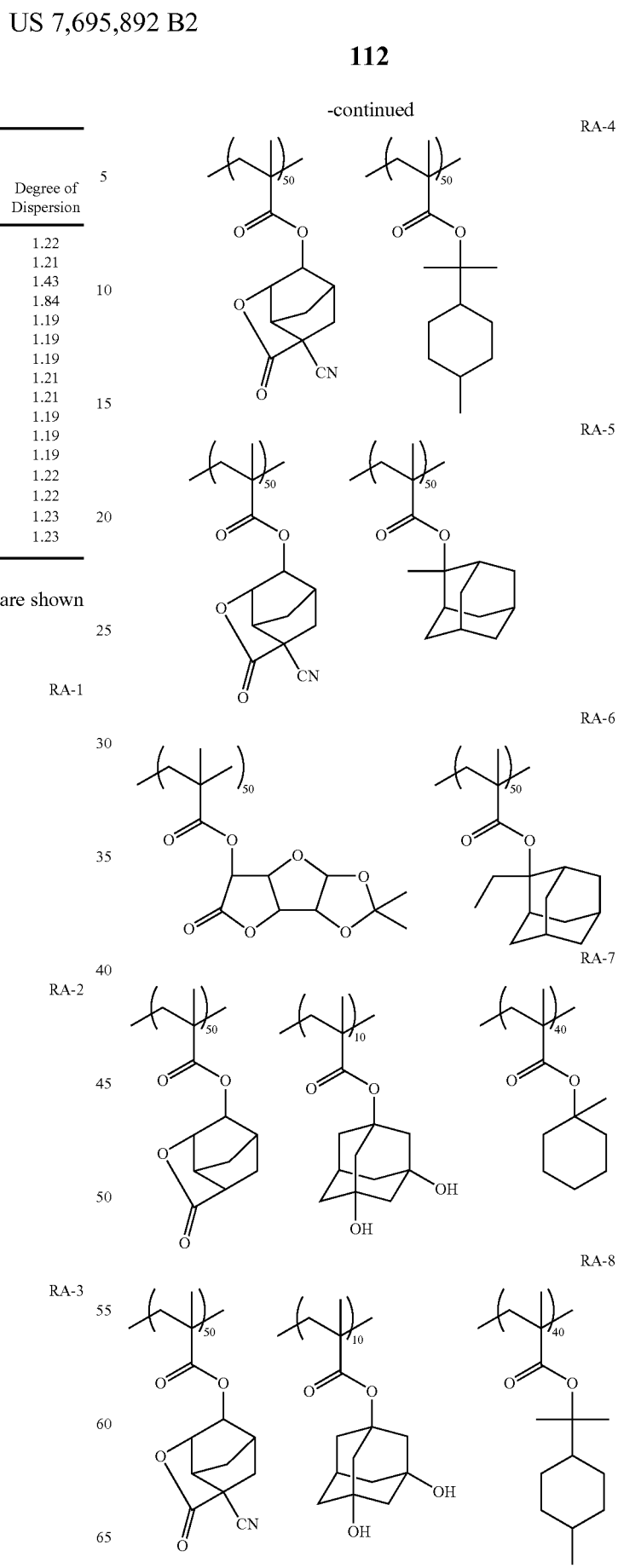

-continued

RA-9

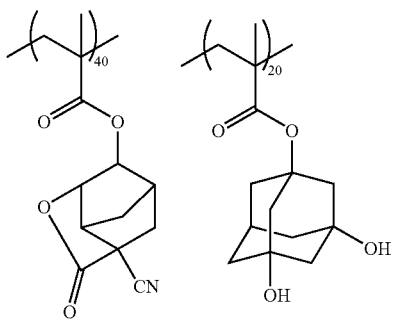

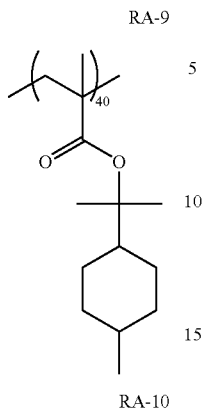

RA-10

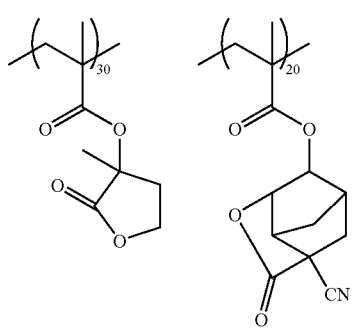

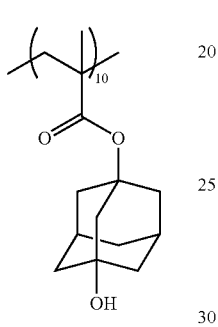

RA-11

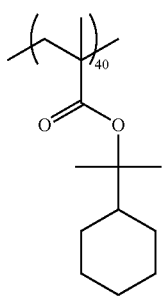

-continued

RA-12

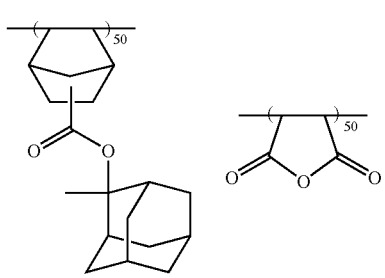

Structures of the chain transfer agents (I-100) and (I-101) shown in Table 2 are shown below.

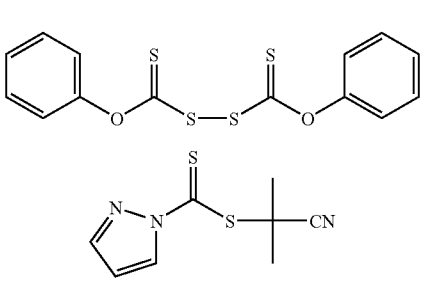

(I-100)

(I-101)

Examples 1 to 25 and Comparative Examples 1 to 2

<Preparation of Resist>

Components shown in Table 3 are dissolved in a solvent to prepare a solution containing 5.5% by weight of solid components, and the resulting solution is filtered through a polyethylene filter having a pore size of 0.1 micron to prepare a positive-working resist solution. The thus-prepared positive-working resist solutions are evaluated in the following manner, and the results thereof are shown in Table 3.

<Evaluation of Resist>

Each of the positive-working resist solutions is coated on a substrate prepared by coating an organic anti-reflective film of ARC-29A (78 nm) manufactured by Brewer Science on a silicon wafer, and then baked at 120° C. for 60 seconds to form a 0.16-μm thick film. Each of the resist films is exposed through a mask using an ArF excimer laser scanner (manufactured by ASML; PAS5500/1100; NA=0.75) and, immediately after exposure, is heated at 120° C. for 60 seconds on a hot plate (PEB). Further, each of the exposed resist film is developed at 23° C. for 60 seconds in a 2.38% by weight aqueous solution of tetramethylammonium hydroxide and, after rinsing for 30 seconds with pure water, dried to obtain a resist pattern.

[Line Edge Roughness]

A 90-nm (line/space=1/1) pattern is observed by using a length-measuring SEM (S-9260 manufactured by Hitachi, Ltd.). With respect to the 5-μm edge range in the longitudinal direction of the line pattern, the distance from a reference line where the edge should be present is measured at 32 points by a length-measuring SEM and, after determining the standard deviation, 3σ is calculated. Similar procedures are conducted at 20 points on a mask pattern, and values obtained by averaging the data are shown in Table 3. A smaller value indicates higher performance.

[Pattern Collapse]

Assuming that an exposure amount necessary for reproducing a 90-nm 1:1 line-and-space mask pattern is the optimal exposure amount, pattern collapse performance is defined in terms of line width which can be resolved with no pattern collapse when the line width of a line pattern formed is reduced by increasing the exposure amount to a level exceeding the optimal exposure amount. A smaller value means that a finer pattern is resolved without pattern collapse, thus showing that pattern collapse is less generated and that a higher resolution is obtained.

[Exposure Latitude (EL)]

Assuming that an exposure amount necessary for reproducing a 90-nm line-and-space mask pattern is the optimal exposure amount, an exposure amount width allowing a pattern size of 90 nm±10% when exposure amount is varied is determined, and this value is divided by the optimal exposure amount to obtain exposure latitude. The exposure latitude is shown in terms of percentage. A larger value shows a smaller change in performance due to change in exposure amount and, therefore, better exposure latitude (EL).

[Defocus Latitude (DOF)]

Assuming that an exposure amount and a focus necessary for reproducing a 90-nm line-and-space mask pattern are the optimal exposure amount and the optimal focus, respectively, width of focus allowing the pattern size of 90 nm±10%, when focus is varied (defocused) while maintaining the exposure amount at a level of the optimal exposure amount, is determined. A larger value shows a smaller change in performance due to change in focus and, therefore, better defocus latitude (DOF).

TABLE 3

| | | Resin-1 | | Resin-2 | | Acid-generating Agent-1 | | Acid-generating Agent-2 | | Basic Compound-1 | |
|---|---|---|---|---|---|---|---|---|---|---|---|
| | | Resin No. | Parts by Weight | Resin No. | Parts by Weight | Compound No. | Parts by Weight | Compound No. | Parts by Weight | Compound No. | Parts by Weight |
| Example | 1 | P-1 | 47.2 | P-2 | 47.2 | z6 | 5 | | | N-8 | 0.4 |
| Example | 2 | P-1 | 47.2 | P-3 | 47.2 | z6 | 5 | | | N-8 | 0.4 |
| Example | 3 | P-1 | 47.2 | P-4 | 47.2 | z6 | 5 | | | N-8 | 0.4 |
| Example | 4 | P-1 | 47.2 | P-5 | 47.2 | z6 | 5 | | | N-8 | 0.4 |
| Example | 5 | P-1 | 47.2 | P-6 | 47.2 | z62 | 5 | | | N-1 | 0.2 |
| Example | 6 | P-1 | 47.2 | P-7 | 47.2 | z62 | 5 | | | N-1 | 0.2 |
| Example | 7 | P-1 | 47.2 | P-6 | 47.2 | z62 | 5 | | | N-1 | 0.2 |
| Example | 8 | P-1 | 47.2 | P-9 | 47.2 | z62 | 5 | | | N-1 | 0.2 |
| Example | 9 | P-1 | 47.2 | P-10 | 47.2 | z62 | 5 | | | N-1 | 0.2 |
| Example | 10 | P-1 | 47.2 | P-11 | 47.2 | z62 | 5 | | | N-1 | 0.2 |
| Example | 11 | P-6 | 47.2 | P-7 | 47.2 | z6 | 5 | | | N-8 | 0.2 |
| Example | 12 | P-6 | 47.2 | P-8 | 47.2 | z6 | 5 | | | N-8 | 0.2 |
| Example | 13 | P-16 | 47.2 | P-12 | 47.2 | z70 | 2.5 | z6 | 2.5 | N-8 | 0.2 |
| Example | 14 | P-16 | 47.2 | P-13 | 47.2 | z70 | 2.5 | z6 | 2.5 | N-8 | 0.2 |
| Example | 15 | P-16 | 47.2 | P-14 | 47.2 | z70 | 2.5 | z6 | 2.5 | N-8 | 0.2 |
| Example | 16 | P-16 | 47.2 | P-15 | 47.2 | z70 | 2.5 | z6 | 2.5 | N-8 | 0.2 |
| Example | 17 | P-16 | 47.2 | P-17 | 47.2 | z6 | 2.5 | z70 | 2.5 | N-8 | 0.2 |
| Example | 18 | P-16 | 47.2 | P-18 | 47.2 | z6 | 2.5 | z70 | 2.5 | N-8 | 0.2 |
| Example | 19 | P-16 | 47.2 | P-19 | 47.2 | z70 | 5 | | | N-8 | 0.2 |
| Example | 20 | P-21 | 47.2 | P-20 | 47.2 | z70 | 5 | | | N-3 | 0.4 |
| Example | 21 | P-21 | 47.2 | P-22 | 47.2 | z70 | 5 | | | N-3 | 0.4 |
| Example | 22 | P-21 | 47.2 | P-23 | 47.2 | z70 | 5 | | | N-3 | 0.4 |
| Example | 23 | P-24 | 27.2 | P-25 | 67.2 | z5 | 5 | | | N-7 | 0.4 |
| Example | 24 | P-24 | 67.2 | P-25 | 27.2 | z5 | 5 | | | N-7 | 0.4 |
| Example | 25 | P-26 | 47.2 | P-27 | 47.2 | z70 | 5 | | | N-4 | 0.4 |
| Com. Example | 1 | P-4 | 47.2 | P-5 | 47.2 | z2 | 5 | | | N-8 | 0.4 |
| Com. Example | 2 | P-4 | 47.2 | P-11 | 47.2 | z2 | 5 | | | N-8 | 0.4 |

| | | Basic Compound-2 | | Surfactant | | Solvent | | Mixing Ratio by Weight | Results of Evaluation on Performance | | | |
|---|---|---|---|---|---|---|---|---|---|---|---|---|
| | | Compound No. | Parts by Weight | Compound No. | Parts by Weight | Solvent-1 | Solvent-2 | | LRW (nm) | Pattern Collapse (nm) | EL (%) | DOF (µm) |
| Example | 1 | | | W-4 | 0.1 | SL-1 | SL-4 | 70/30 | 10.1 | 62 | 11 | 0.6 |
| Example | 2 | | | W-4 | 0.1 | SL-1 | SL-4 | 70/30 | 11.1 | 70 | 11.1 | 0.6 |
| Example | 3 | | | W-4 | 0.1 | SL-1 | SL-4 | 70/30 | 11.9 | 74 | 11.8 | 0.6 |
| Example | 4 | | | W-4 | 0.1 | SL-1 | SL-4 | 70/30 | 12.9 | 70 | 11.8 | 0.6 |
| Example | 5 | N-2 | 0.2 | W-1 | 0.1 | SL-1 | SL-5 | 40/60 | 9.7 | 65 | 11.2 | 0.6 |
| Example | 6 | N-2 | 0.2 | W-1 | 0.1 | SL-1 | SL-5 | 40/60 | 9.5 | 65 | 11.3 | 0.6 |
| Example | 7 | N-2 | 0.2 | W-1 | 0.1 | SL-1 | SL-5 | 40/60 | 9.1 | 62 | 11.9 | 0.6 |
| Example | 8 | N-2 | 0.2 | W-1 | 0.1 | SL-1 | SL-5 | 40/60 | 10 | 65 | 11 | 0.6 |
| Example | 9 | N-2 | 0.2 | W-1 | 0.1 | SL-1 | SL-5 | 40/60 | 11 | 65 | 10.4 | 0.6 |
| Example | 10 | N-2 | 0.2 | W-1 | 0.1 | SL-1 | SL-5 | 40/60 | 12.5 | 72 | 11 | 0.6 |
| Example | 11 | N-6 | 0.2 | W-4 | 0.1 | SL-1 | SL-5 | 40/60 | 9.8 | 65 | 11 | 0.6 |
| Example | 12 | N-6 | 0.2 | W-4 | 0.1 | SL-1 | SL-5 | 40/60 | 9.4 | 62 | 12.1 | 0.6 |
| Example | 13 | N-6 | 0.2 | W-4 | 0.1 | SL-1 | SL-5 | 40/60 | 10 | 65 | 11 | 0.8 |

TABLE 3-continued

| | | | | | | | | | | | | |
|---|---|---|---|---|---|---|---|---|---|---|---|---|
| Example | 14 | N-6 | 0.2 | W-4 | 0.1 | SL-1 | SL-5 | 40/60 | 10 | 65 | 11 | 0.8 |
| Example | 15 | N-6 | 0.2 | W-4 | 0.1 | SL-1 | SL-5 | 40/60 | 11 | 65 | 10.5 | 0.8 |
| Example | 16 | N-6 | 0.2 | W-4 | 0.1 | SL-1 | SL-5 | 40/60 | 12.5 | 71 | 11 | 0.8 |
| Example | 17 | N-6 | 0.2 | W-4 | 0.1 | SL-1 | SL-5 | 40/60 | 9.1 | 62 | 12.4 | 0.8 |
| Example | 18 | N-6 | 0.2 | W-4 | 0.1 | SL-1 | SL-5 | 40/60 | 9.1 | 62 | 12.5 | 0.8 |
| Example | 19 | N-6 | 0.2 | W-4 | 0.1 | SL-1 | SL-5 | 40/60 | 10 | 65 | 11 | 0.6 |
| Example | 20 | N-5 | 0.2 | W-2 | 0.1 | SL-1 | SL-3 | 50/50 | 9.7 | 64 | 12.1 | 0.6 |
| Example | 21 | N-5 | 0.2 | W-2 | 0.1 | SL-1 | SL-3 | 50/50 | 9.2 | 61 | 12.5 | 0.6 |
| Example | 22 | N-5 | 0.2 | W-2 | 0.1 | SL-1 | SL-3 | 50/50 | 9.3 | 64 | 12.3 | 0.6 |
| Example | 23 | | | W-4 | 0.1 | SL-1 | SL-5 | 40/60 | 9.3 | 69 | 13.1 | 0.6 |
| Example | 24 | | | W-4 | 0.1 | SL-1 | SL-5 | 40/60 | 9.1 | 62 | 12.4 | 0.6 |
| Example | 25 | | | W-3 | 0.1 | SL-2 | SL-6 | 50/50 | 11 | 70 | 10 | 0.6 |
| Com. Example | 1 | | | W-1 | 0.1 | SL-1 | SL-4 | 70/30 | 13.3 | 75 | 7 | 0.4 |
| Com. Example | 2 | | | W-1 | 0.1 | SL-1 | SL-4 | 70/30 | 13.5 | 75 | 7 | 0.4 |

Compounds represented by symbols in Table 3 are shown below.
N-1: N,N-dibutylanilane
N-2: 2,6-diisopropylaniline
N-3: diazabicyclo[4.3.0]nonene
N-4: 2,4,5-triphenylimidazole
N-5: 4-dimethylaminopyridine
N-6: trioctylamine
N-7: dicyclohexylmethylamine
N-8: N-phenyldiethanolamine
Surfactants
W-1: Megafac F176 (manufactured by Dainippon Ink & Chemicals, Inc.)(fluorine-containing)
W-2: Megafac R08 (manufactured by Dainippon Ink & Chemicals, Inc.) (fluorine-containing and silicone series)
W-3: polisiloxane polymer KP-341 (manufactured by Shin-Etsu Chemical Co., Ltd.)
W-4: Troysol S-366 (manufactured by Troychemical Co., Ltd.)
Solvents
SL-1: propylene glycol monomethyl ether acetate
SL-2: 2-heptanone
SL-3: ethyl lactate
SL-4: propylene glycol monomethyl ether
SL-5: cyclohexanone
SL-6: γ-butyrolactone It is apparent from the results in Table 3 that, in ArF exposure, the resist compositions of the invention are excellent in all performances with respect to line edge roughness, pattern collapse, EL, and DOF in comparison with the resist compositions shown in Comparative Examples.

Detailed results on evaluations by ArF immersion exposure are shown below.

<Preparation of Resist>

Components in each of Examples 1 to 25 are dissolved in a solvent to prepare a solution containing 7% by weight of solid components, and the resulting solution is filtered through a polyethylene filter having a pore size of 0.1 micron to prepare a positive-working resist solution. The thus-prepared positive-working resist solutions are evaluated in the following manner.

<Evaluation on Resolution>

An organic anti-reflective film ARC29A (produced by Nissan Chemical Industries, Ltd.) is coated on a silicon wafer and baked at 205° C. for 60 seconds to form a 78-nm anti-reflective film. On this film, the positive-working resist solution prepared is coated and baked at 115° C. for 60 seconds to form a 130-nm resist film. The thus-obtained wafer is subjected to two-beam interference exposure (wet exposure) by using pure water as the immersion solution. In the two-beam interference exposure (wet exposure), the wafer 10 having the anti-reflective film and the resist film is exposed through a prism 8 and an immersion solution 9 (pure water) by using a laser 1, a diaphragm 2, a shutter 3, three reflecting mirrors 4, 5, and 6, and a condenser lens 7. The wavelength of the laser 1 is 193 nm, and prism 8 used is a prism of forming a 65-nm line-and-space pattern. Immediately after the exposure, the resist film is heated at 115° C. for 90 seconds, then developed with an aqueous tetramethylammonium hydroxide solution (2.38% by weight) for 60 seconds and, after rinsing with pure water, spin-dried. The obtained resist pattern is observed by a scanning electron microscope (S-9260, manufactured by Hitachi Ltd.) and, as a result, a 65-nm line-and-space pattern is found to be resolved.

It is apparent that the resist compositions of the invention show good image-forming ability in an exposure method of exposing through an immersion liquid.

Examples 26 to 35

Components shown in the following Table 4 are dissolved in a solvent to prepare solutions having a solid component concentration of 5.5% by weight, and the solutions are filtered through a polyethylene filter having a pore size of 0.1 micron to prepare positive-working resist solutions.

An organic anti-reflection film of ARC29A (manufactured by Nissan Chemical Industries, Ltd.) is applied to a silicon wafer, baked at 205° C. for 60 seconds to form a 78-nm anti-reflection film. Each of the prepared positive-working resist solutions is coated thereon and baked at 120° C. for 90 seconds to form a 250-nm resist film.

Each of the thus-obtained wafers is pattern-wise exposed by means of an ArF excimer laser immersion scanner (NA: 0.75). As the immersion solution, ultra-pure water containing 5 ppb or less impurities is used. Thereafter, each of the resist films is baked at 120° C. for 60 seconds, development processed for 30 seconds in an aqueous solution of tetramethylammonium hydroxide (2.38% by weight), rinsed with pure water, and spin-dried. Thus, formation of a resist pattern is confirmed.

TABLE 4

| | | Resin-1 | | Resin-2 | | Acid-generating Agent-1 | | Acid-generating Agent-2 | | Basic Compound-1 | |
|---|---|---|---|---|---|---|---|---|---|---|---|
| | | Resin No. | Parts by Weight | Resin No. | Parts by Weight | Compound No. | Parts by Weight | Compound No. | Parts by Weight | Compound No. | Parts by Weight |
| Example | 26 | P-1 | 47.2 | P-2 | 47.2 | z6 | 5 | | | N-8 | 0.4 |
| Example | 27 | P-1 | 47.2 | P-3 | 47.2 | z6 | 5 | | | N-8 | 0.4 |
| Example | 28 | P-1 | 47.2 | P-4 | 47.2 | z6 | 5 | | | N-8 | 0.4 |
| Example | 29 | P-1 | 47.2 | P-5 | 47.2 | z6 | 5 | | | N-8 | 0.4 |
| Example | 30 | P-1 | 47.2 | P-6 | 47.2 | z62 | 5 | | | N-1 | 0.2 |
| Example | 31 | P-1 | 47.2 | P-7 | 47.2 | z62 | 5 | | | N-1 | 0.2 |
| Example | 32 | P-1 | 47.2 | P-8 | 47.2 | z62 | 5 | | | N-1 | 0.2 |
| Example | 33 | P-1 | 47.2 | P-9 | 47.2 | z62 | 5 | z6 | 2.5 | N-1 | 0.2 |
| Example | 34 | P-1 | 47.2 | P-10 | 47.2 | z62 | 5 | z70 | 2.5 | N-1 | 0.2 |
| Example | 35 | P-1 | 47.2 | P-11 | 47.2 | z62 | 5 | z70 | 2.5 | N-1 | 0.2 |

| | | Basic Compound-2 | | Surfactant | | Immersion Solution Additive | | Solvent | | |
|---|---|---|---|---|---|---|---|---|---|---|
| | | Compound No. | Parts by Weight | Compound No. | Parts by Weight | Compound No. | Parts by Weight | Solvent-1 | Solvent-2 | Mixing Ratio by Weight |
| Example | 26 | | | W-4 | 0.1 | HR-1 | 0.1 | SL-1 | SL-4 | 70/30 |
| Example | 27 | | | W-4 | 0.1 | HR-2 | 0.1 | SL-1 | SL-4 | 70/30 |
| Example | 28 | | | W-4 | 0.1 | HR-3 | 0.1 | SL-1 | SL-4 | 70/30 |
| Example | 29 | | | W-4 | 0.1 | HR-4 | 0.1 | SL-1 | SL-4 | 70/30 |
| Example | 30 | N-2 | 0.2 | W-1 | 0.1 | HR-5 | 0.1 | SL-1 | SL-5 | 40/60 |
| Example | 31 | N-2 | 0.2 | W-1 | 0.1 | HR-6 | 0.1 | SL-1 | SL-5 | 40/60 |
| Example | 32 | N-2 | 0.2 | W-1 | 0.1 | HR-7 | 0.1 | SL-1 | SL-5 | 40/60 |
| Example | 33 | N-2 | 0.2 | W-1 | 0.1 | HR-8 | 0.1 | SL-1 | SL-5 | 40/60 |
| Example | 34 | N-2 | 0.2 | W-1 | 0.1 | HR-9 | 0.1 | SL-1 | SL-5 | 40/60 |
| Example | 35 | N-2 | 0.2 | W-1 | 0.1 | HR-10 | 0.1 | SL-1 | SL-5 | 40/60 |

It is confirmed from the above results that the positive-working light-sensitive compositions of the invention can also be suitably used for forming a pattern by ArF liquid immersion exposure.

According to the invention, there can be provided a resist composition which has good line edge roughness, pattern collapse, exposure latitude, and defocus latitude and shows similarly good performances in immersion exposure, and a pattern-forming method using the composition.

The entire disclosure of each and every foreign patent application from which the benefit of foreign priority has been claimed in the present application is incorporated herein by reference, as if fully set forth.

What is claimed is:

1. A resist composition comprising
   (A) at least two kinds of resins each of which decomposes by action of an acid to undergo an increase in its solubility for an alkali developer; and
   a hydrophobic resin (HR) containing at least one of a fluorine atom and a silicon atom,
   wherein at least one kind of the resins (A) is a resin synthesized by living radical polymerization using a chain transfer agent represented by formula (I):

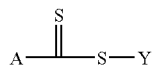

(I)

wherein:
A represents an organic group not containing hetero atoms;
Y represents an organic group capable of releasing a radical; and wherein when the hydrophobic resin (HR) contains a fluorine atom, a content of the fluorine atom is from 5 to 80% by weight based on the molecular weight of the hydrophobic resin (HR), and when the hydrophobic resin (HR) contains a silicon atom, a content of the silicon atom is from 2 to 50% by weight based on the molecular weight of the hydrophobic resin (HR).

2. The resist composition as described in claim 1, further comprising (B) a compound capable of generating an acid upon irradiation with an actinic ray or radiation.

3. The resist composition as described in claim 1, further comprising (C) a basic compound.

4. A pattern-forming method comprising:
   forming a film by using the resist composition described in claim 1; and
   exposing and developing the film.

5. The resist composition as described in claim 1, wherein the hydrophobic resin (HR) contains a group represented by any one of formulae (Fa2) to (Fa4):

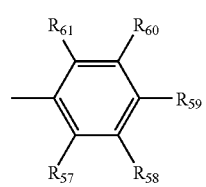

(Fa2)

(Fa3)

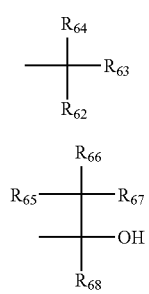

(Fa4)

wherein $R_{57}$ to $R_{68}$ each independently represents a hydrogen atom, a fluorine atom or an alkyl group, provided that at least one of $R_{57}$ to $R_{61}$, $R_{62}$ to $R_{64}$, or $R_{65}$ to $R_{68}$ represents a fluorine atom or an alkyl group in which at least one hydrogen atom is replaced by a fluorine atom, and $R_{62}$ and $R_{63}$ may be connected to each other to form a ring.

6. The resist composition as described in claim 1, wherein the hydrophobic resin (HR) contains a group represented by any one of formulae (CS-1) to (CS-3):

(CS-1)

$$R_{12}-\underset{\underset{R_{13}}{|}}{\overset{\overset{L_3}{|}}{Si}}-R_{14}$$

(CS-2)

(CS-3)

wherein $R_{12}$ to $R_{26}$ each independently represents a straight or branched alkyl group or a cycloalkyl group;
$L_3$ to $L_5$ each independently represents a single bond or a divalent linking group; and
n represents an integer of 1 to 5.

7. The resist composition as described in claim 1, wherein the resin synthesized by living radical polymerization using the chain transfer agent represented by formula (I) contains a repeating unit represented by formula (AI):

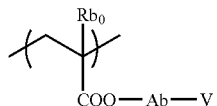

(AI)

wherein $Rb_o$ represents a hydrogen atom, a halogen atom or an alkyl group containing from 1 to 4 carbon atoms;
Ab represents an alkylene group, a divalent linking group having a monocyclic or polycyclic alicyclic hydrocarbon structure, an ether group, an ester group, a carbonyl group or a divalent group of a combination thereof and
V represents a group represented by any one of formulae (LC1-1) to (LC-1-16):

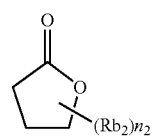

LC1-1

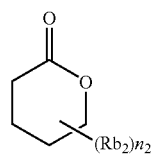

LC1-2

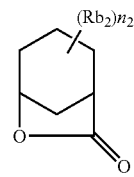

LC1-3

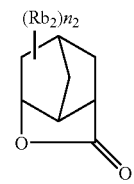

LC1-4

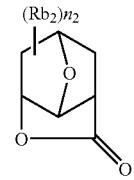

LC1-5

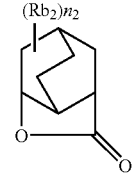

LC1-6

-continued

LC1-7 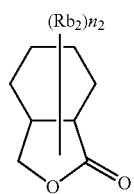

LC1-8 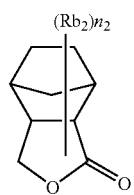

LC1-9 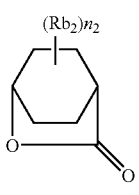

LC1-10 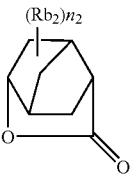

LC1-11 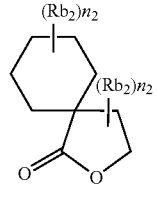

LC1-12 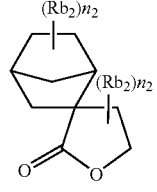

LC1-13 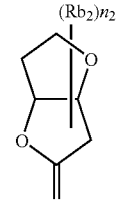

LC1-14 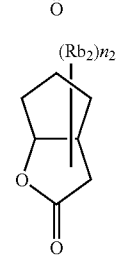

-continued

LC1-15 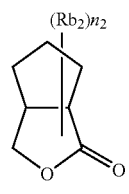

LC1-16 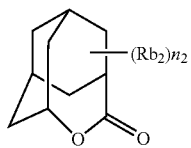

wherein $Rb_2$ represents a substituent; and $n_2$ represents an integer of from 0 to 4.

8. The resist composition as described in claim 1, wherein the resin synthesized by living radical polymerization using the chain transfer agent represented by formula (I) has a degree of dispersion of from 1.19 to 1.23.

9. The resist composition as described in claim 1, wherein the chain transfer agent represented by formula (I) is a chain transfer agent represented by formula (I'):

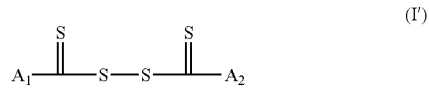
(I')

wherein $A_1$ and $A_2$ each independently represents an organic group not containing a hetero atom.

10. The pattern-forming method according to claim 4, wherein the film is exposed through an immersion medium.

11. A resist composition comprising
(A) at least two kinds of resins each of which decomposes by action of an acid to undergo an increase in its solubility for an alkali developer,
wherein at least one kind of the resins (A) is a resin synthesized by living radical polymerization using a chain transfer agent represented by formula (I):

(I)

wherein:
A represents an organic group not containing hetero atoms; and
Y represents a tertiary alkyl group not containing an aromatic ring in which the atom connecting to the sulfur atom in formula (I) is a tertiary carbon atom, an alkyl group in which the atom connecting to the sulfur atom in formula (I) is a carbon atom substituted by a cyano group, an alkylcarbonyl group or an alkoxycarbonyl group, a cycloalkyl group in which the atom connecting to the sulfur atom in formula (I) is a carbon atom substituted by a cyano group, an alkylcarbonyl group or an alkoxycarbonyl group or —S—C(=S)-$A_3$ in which $A_3$ represents an alkyl group, a cycloalkyl group, an aryl group or an alkylthio group.

12. The resist composition as described in claim 11, further comprising (B) a compound capable of generating an acid upon irradiation with an actinic ray or radiation.

13. The resist composition as described in claim 11, further comprising (C) a basic compound.

14. A pattern-forming method comprising:

forming a film by using a resist composition; and exposing and developing the film, wherein the resist composition comprises (A) at least two kinds of resins each of which decomposes by action of an acid to undergo an increase in its solubility for an alkali developer, wherein at least one kind of the resins (A) is a resin synthesized by living radical polymerization using a chain transfer agent represented by formula (I):

(I)

wherein:

A represents an organic group not containing hetero atoms; and

Y represents a tertiary alkyl group not containing an aromatic ring in which the atom connecting to the sulfur atom in formula (I) is a tertiary carbon atom, an alkyl group in which the atom connecting to the sulfur atom in formula (I) is a carbon atom substituted by a cyano group, an alkylcarbonyl group or an alkoxycarbonyl group, a cycloalkyl group in which the atom connecting to the sulfur atom in formula (I) is a carbon atom substituted by a cyano group, an alkylcarbonyl group or an alkoxycarbonyl group or —S—C(=S)-$A_3$ in which $A_3$ represents an alkyl group, a cycloalkyl group, an aryl group or an alkylthio group.

15. The resist composition as described in claim 11, wherein the resin synthesized by living radical polymerization using the chain transfer agent represented by formula (I) contains a repeating unit represented by formula (AI):

(AI)

wherein $Rb_o$ represents a hydrogen atom, a halogen atom or an alkyl group containing from 1 to 4 carbon atoms;

Ab represents an alkylene group, a divalent linking group having a monocyclic or polycyclic alicyclic hydrocarbon structure, an ether group, an ester group, a carbonyl group or a divalent group of a combination thereof and V represents a group represented by any one of formulae (LC1-1) to (LC-1-16):

-continued

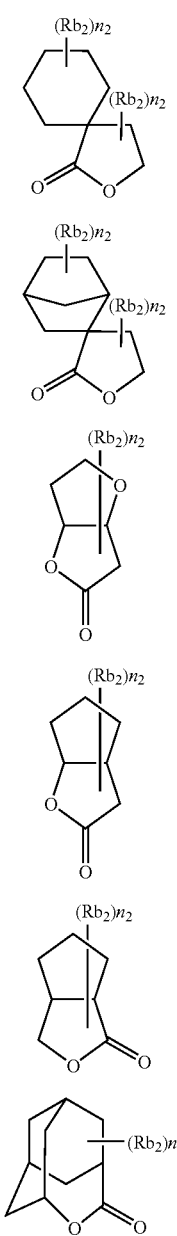

wherein Rb₂ represents a substituent; and
n₂ represents an integer of from 0 to 4.

16. A resist composition comprising
(A) at least two kinds of resins each of which decomposes by action of an acid to undergo an increase in its solubility for an alkali developer,
wherein at least one kind of the resins (A) is a resin synthesized by living radical polymerization using a chain transfer agent represented by formula (I):

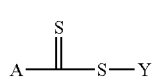 (I)

wherein:
A represents an organic group not containing hetero atoms; and
Y represents a tertiary alkyl group not containing an aromatic ring in which the atom connecting to the sulfur atom in formula (I) is a tertiary carbon atom, an alkyl group in which the atom connecting to the sulfur atom in formula (I) is a carbon atom substituted by a cyano group, an alkylcarbonyl group or an alkoxycarbonyl group, a cycloalkyl group in which the atom connecting to the sulfur atom in formula (I) is a carbon atom substituted by a cyano group, an alkylcarbonyl group or an alkoxycarbonyl group or —S—C(=S)-A₃ in which A₃ represents an alkyl group, a cycloalkyl group, an aryl group or an alkylthio group,
wherein the resin synthesized by living radical polymerization using the chain transfer agent represented by formula (I) has a degree of dispersion of from 1.19 to 1.23.

17. A resist composition comprising
(A) at least two kinds of resins each of which decomposes by action of an acid to undergo an increase in its solubility for an alkali developer,
wherein at least one kind of the resins (A) is a resin synthesized by living radical polymerization using a chain transfer agent represented by formula (I):

 (I)

wherein:
A represents an organic group not containing hetero atoms; and
Y represents a tertiary alkyl group not containing an aromatic ring in which the atom connecting to the sulfur atom in formula (I) is a tertiary carbon atom, an alkyl group in which the atom connecting to the sulfur atom in formula (I) is a carbon atom substituted by a cyano group, an alkylcarbonyl group or an alkoxycarbonyl group, a cycloalkyl group in which the atom connecting to the sulfur atom in formula (I) is a carbon atom substituted by a cyano group, an alkylcarbonyl group or an alkoxycarbonyl group or S—C(=S)-A₃ in which A₃ represents an alkyl group, a cycloalkyl group, an aryl group or an alkylthio group,
wherein the chain transfer agent represented by formula (I) is a chain transfer agent represented by formula (I'):

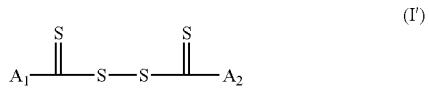 (I')

wherein A₁ and A₂ each independently represents an organic group not containing a hetero atom.

18. The pattern-forming method according to claim 14, wherein the film is exposed through an immersion medium.

* * * * *